(12) United States Patent
Yamazaki

(10) Patent No.: US 7,439,543 B2
(45) Date of Patent: Oct. 21, 2008

(54) SEMICONDUCTOR DEVICE COMPRISING THIN FILM TRANSISTOR COMPRISING CONDUCTIVE FILM HAVING TAPERED EDGE

(75) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/013,475

(22) Filed: Dec. 17, 2004

(65) Prior Publication Data

US 2005/0104068 A1    May 19, 2005

Related U.S. Application Data

(62) Division of application No. 09/433,705, filed on Nov. 4, 1999, now Pat. No. 6,909,114.

(30) Foreign Application Priority Data

Nov. 17, 1998 (JP) ............... 10-327180
Dec. 28, 1998 (JP) ............... 10-373222
Jul. 22, 1999 (JP) ............... 11-206958

(51) Int. Cl.
 *H01L 29/76* (2006.01)
(52) U.S. Cl. ............... 257/66; 257/72; 257/347; 257/350
(58) Field of Classification Search ............... 257/66, 257/72, 347, 350
See application file for complete search history.

(56) References Cited

U.S. PATENT DOCUMENTS

| 3,933,529 A | 1/1976 | Goser |
| 4,394,182 A | 7/1983 | Maddox, III |
| 4,851,363 A | 7/1989 | Troxell et al. |
| 4,942,441 A | 7/1990 | Konishi et al. |

(Continued)

FOREIGN PATENT DOCUMENTS

EP    0 588 370    3/1994

(Continued)

OTHER PUBLICATIONS

Hatano et al., "A Novel Self-Aligned Gate-Overlapped LDD Poly-Si TFT With High Reliability and Performance," IEDM Technical Digest 97, pp. 523-526.

(Continued)

*Primary Examiner*—Ori Nadav
(74) *Attorney, Agent, or Firm*—Eric J. Robinson; Robinson Intellectual Property Law Office, P.C.

(57) ABSTRACT

There is provided a thin film transistor having improved reliability. A gate electrode includes a first gate electrode having a taper portion and a second gate electrode with a width narrower than the first gate electrode. A semiconductor layer is doped with phosphorus of a low concentration through the first gate electrode. In the semiconductor layer, two kinds of $n^-$-type impurity regions are formed between a channel formation region and $n^+$-type impurity regions. Some of the $n^-$-type impurity regions overlap with a gate electrode, and the other $n^-$-type impurity regions do not overlap with the gate electrode. Since the two kinds of $n^-$-type impurity regions are formed, an off current can be reduced, and deterioration of characteristics can be suppressed.

36 Claims, 37 Drawing Sheets

U.S. PATENT DOCUMENTS

| | | | |
|---|---|---|---|
| 4,963,504 A | 10/1990 | Huang | |
| 5,015,599 A | 5/1991 | Verhaar | |
| 5,177,571 A | 1/1993 | Satoh et al. | |
| 5,182,619 A | 1/1993 | Pfiester | |
| 5,187,602 A | 2/1993 | Ikeda et al. | |
| 5,217,910 A | 6/1993 | Shimizu et al. | |
| 5,247,190 A | 9/1993 | Friend et al. | |
| 5,254,490 A | 10/1993 | Kondo | |
| 5,276,347 A | 1/1994 | Wei et al. | |
| 5,281,840 A | 1/1994 | Sarma | |
| 5,323,042 A | 6/1994 | Matsumoto | |
| 5,358,879 A | 10/1994 | Brady et al. | |
| 5,399,502 A | 3/1995 | Friend et al. | |
| 5,401,982 A | 3/1995 | King et al. | |
| 5,412,240 A | 5/1995 | Inoue et al. | |
| 5,413,945 A | 5/1995 | Chien et al. | |
| 5,482,871 A | 1/1996 | Pollack | |
| 5,508,209 A | 4/1996 | Zhang et al. | |
| 5,528,397 A | 6/1996 | Zavracky et al. | |
| 5,532,175 A | 7/1996 | Racanelli et al. | |
| 5,532,176 A | 7/1996 | Katada et al. | |
| 5,543,340 A | 8/1996 | Lee | |
| 5,543,947 A | 8/1996 | Mase et al. | |
| 5,567,966 A | 10/1996 | Hwang | |
| 5,581,092 A | 12/1996 | Takemura | |
| 5,583,369 A | 12/1996 | Yamazaki et al. | |
| 5,594,569 A | 1/1997 | Konuma et al. | |
| 5,616,506 A | 4/1997 | Takemura | |
| 5,623,157 A | 4/1997 | Miyazaki et al. | |
| 5,643,826 A | 7/1997 | Ohtani et al. | |
| 5,686,328 A | 11/1997 | Zhang et al. | |
| 5,693,959 A | 12/1997 | Inoue et al. | |
| 5,705,424 A | 1/1998 | Zavracky et al. | |
| 5,719,588 A | 2/1998 | Johnson | |
| 5,736,750 A | 4/1998 | Yamazaki et al. | |
| 5,742,363 A | 4/1998 | Bae | |
| 5,764,206 A | 6/1998 | Koyama et al. | |
| 5,767,930 A | 6/1998 | Kobayashi et al. | |
| 5,773,330 A | 6/1998 | Park | |
| 5,830,787 A | 11/1998 | Kim | |
| 5,841,170 A | 11/1998 | Adan et al. | |
| 5,852,481 A | 12/1998 | Hwang | |
| 5,858,820 A | 1/1999 | Jung et al. | |
| 5,903,249 A | 5/1999 | Koyama et al. | |
| 5,912,492 A | 6/1999 | Chang et al. | |
| 5,923,961 A | 7/1999 | Shibuya et al. | |
| 5,923,962 A | 7/1999 | Ohtani et al. | |
| 5,949,107 A | 9/1999 | Zhang | |
| 5,962,872 A | 10/1999 | Zhang et al. | |
| 5,965,919 A | 10/1999 | Yoo | |
| 5,981,367 A | 11/1999 | Gonzalez | |
| 6,001,714 A | 12/1999 | Nakajima et al. | |
| 6,008,100 A | 12/1999 | Yeh et al. | |
| 6,008,869 A | 12/1999 | Oana | |
| 6,030,667 A | 2/2000 | Nakagawa et al. | |
| 6,049,092 A | 4/2000 | Konuma et al. | |
| 6,081,308 A | 6/2000 | Jeong et al. | |
| 6,087,679 A | 7/2000 | Yamazaki et al. | |
| 6,114,715 A | 9/2000 | Hamada | |
| 6,133,074 A | 10/2000 | Ishida et al. | |
| 6,140,667 A | 10/2000 | Yamazaki | |
| 6,160,279 A | 12/2000 | Zhang et al. | |
| 6,165,824 A | 12/2000 | Takano et al. | |
| 6,166,396 A | 12/2000 | Yamazaki | |
| 6,166,414 A | 12/2000 | Miyazaki et al. | |
| 6,180,957 B1 | 1/2001 | Miyasaka et al. | |
| 6,198,133 B1 | 3/2001 | Yamazaki et al. | |
| 6,222,238 B1 | 4/2001 | Chang et al. | |
| 6,259,120 B1 | 7/2001 | Zhang et al. | |
| 6,259,138 B1 | 7/2001 | Ohtani et al. | |
| 6,259,144 B1 | 7/2001 | Gonzalez | |
| 6,274,887 B1 | 8/2001 | Yamazaki et al. | |
| 6,281,552 B1 | 8/2001 | Kawasaki et al. | |
| 6,285,042 B1 | 9/2001 | Ohtani et al. | |
| 6,307,214 B1 | 10/2001 | Ohtani et al. | |
| 6,335,290 B1 | 1/2002 | Ishida | |
| 6,335,541 B1 | 1/2002 | Ohtani et al. | |
| 6,348,368 B1 | 2/2002 | Yamazaki et al. | |
| 6,365,933 B1 | 4/2002 | Yamazaki | |
| 6,469,317 B1 | 10/2002 | Yamazaki et al. | |
| 6,479,333 B1 | 11/2002 | Takano et al. | |
| 6,501,098 B2 | 12/2002 | Yamazaki | |
| 6,507,069 B1 | 1/2003 | Zhang et al. | |
| 6,515,338 B1 | 2/2003 | Inumiya et al. | |
| 6,534,789 B2 | 3/2003 | Ishida | |
| 6,541,294 B1 | 4/2003 | Yamazaki | |
| 6,590,230 B1 | 7/2003 | Yamazaki et al. | |
| 6,617,644 B1 | 9/2003 | Yamazaki et al. | |
| 6,646,287 B1 | 11/2003 | Ono et al. | |
| 6,664,145 B1 | 12/2003 | Yamazaki et al. | |
| 6,773,971 B1 | 8/2004 | Zhang et al. | |
| 6,867,431 B2 | 3/2005 | Konuma et al. | |
| 6,891,195 B2 | 5/2005 | Yamazaki et al. | |
| 2002/0134983 A1 | 9/2002 | Yamazaki | |
| 2002/0163049 A1 | 11/2002 | Yamazaki et al. | |
| 2003/0054653 A1 | 3/2003 | Yamazaki et al. | |
| 2003/0122132 A1 | 7/2003 | Yamazaki | |
| 2003/0138985 A1 | 7/2003 | Rhodes | |
| 2004/0051142 A1 | 3/2004 | Yamazaki et al. | |
| 2006/0051906 A1 | 3/2006 | Yamazaki | |

FOREIGN PATENT DOCUMENTS

| | | |
|---|---|---|
| EP | 0 589 478 | 3/1994 |
| EP | 0 738 012 | 10/1996 |
| JP | 60-127761 | 7/1985 |
| JP | 03-250632 | 11/1991 |
| JP | 04-258160 | 9/1992 |
| JP | 04-369271 | 12/1992 |
| JP | 05-055477 | 3/1993 |
| JP | 05-102483 | 4/1993 |
| JP | 05-188401 | 7/1993 |
| JP | 06-148685 | 5/1994 |
| JP | 07-130652 | 5/1995 |
| JP | 07-202210 | 8/1995 |
| JP | 07-235680 | 9/1995 |
| JP | 08-078329 | 3/1996 |
| JP | 08-264784 | 10/1996 |
| JP | 08-274336 | 10/1996 |
| JP | 09-116167 | 5/1997 |
| JP | 09-191111 | 7/1997 |
| JP | 09-293600 | 11/1997 |
| JP | 10-065181 | 3/1998 |
| JP | 10-092576 | 4/1998 |
| JP | 10-104659 | 4/1998 |
| JP | 10-294280 | 4/1998 |
| JP | 10-135468 | 5/1998 |
| JP | 10-135469 | 5/1998 |
| JP | 10-233511 | 9/1998 |
| JP | 10-247735 | 9/1998 |
| JP | 10-294280 | 11/1998 |
| JP | 11-191628 | 7/1999 |
| JP | 11-345767 | 12/1999 |
| JP | 11-354442 | 12/1999 |
| JP | 2000-047263 | 2/2000 |
| WO | WO 90/13148 | 11/1990 |

OTHER PUBLICATIONS

T. Yoshihara, Ekisho, "Time Division Full Color LCD by Ferroelectric Liquid Crystal," vol. 3, No. 3, pp. 190-194, 1999.

Inui et al., "Thresholdless Antiferroelectricity in Liquid Crystals and its Application to Displays," J. Mater. Chem., vol. 6, No. 4, pp. 671-673, 1996.

Terada et al., "Half-V Switching Mode FLCD," Proceedings of the 46th Applied Physics Association Lectures, 28p-V-8, p. 1316, Mar. 1999.

Yoshida et al., "A Full-Color Thresholdless Antiferroelectric LCD Exhibiting Wide Viewing Angle with Fast Response Time," SID 97 Digest, pp. 841-844, 1997.

Furue et al., "P-78 Characteristics and Driving Scheme of Polymer-Stabilized Monostable FLCD Exhibiting Fast Response Time and High Contrast Ratio with Gray-Scale Capability," SID 98 Digest, pp. 782-785, 1998.

Specification and Drawings for U.S. Appl. No. 09/526,486, filed Mar. 15, 2000, "Semiconductor Device and Method of Manufacturing Thereof," Hongyong Zhang et al.

Shimokawa et al., "Characterization of High-Efficiency Cast-Si Solar Cell Wafers by MBIC Measurement," Japanese Journal of Applied Physics, vol. 27, No. 5, May 1998, pp. 751-758.

Hermann Schenk et al., "Polymers for Light Emitting Diodes," EuroDisplay '99 Proceedings, pp. 33-37.

European Search Report, dated Nov. 21, 2000, for Application No. 99122785.1.

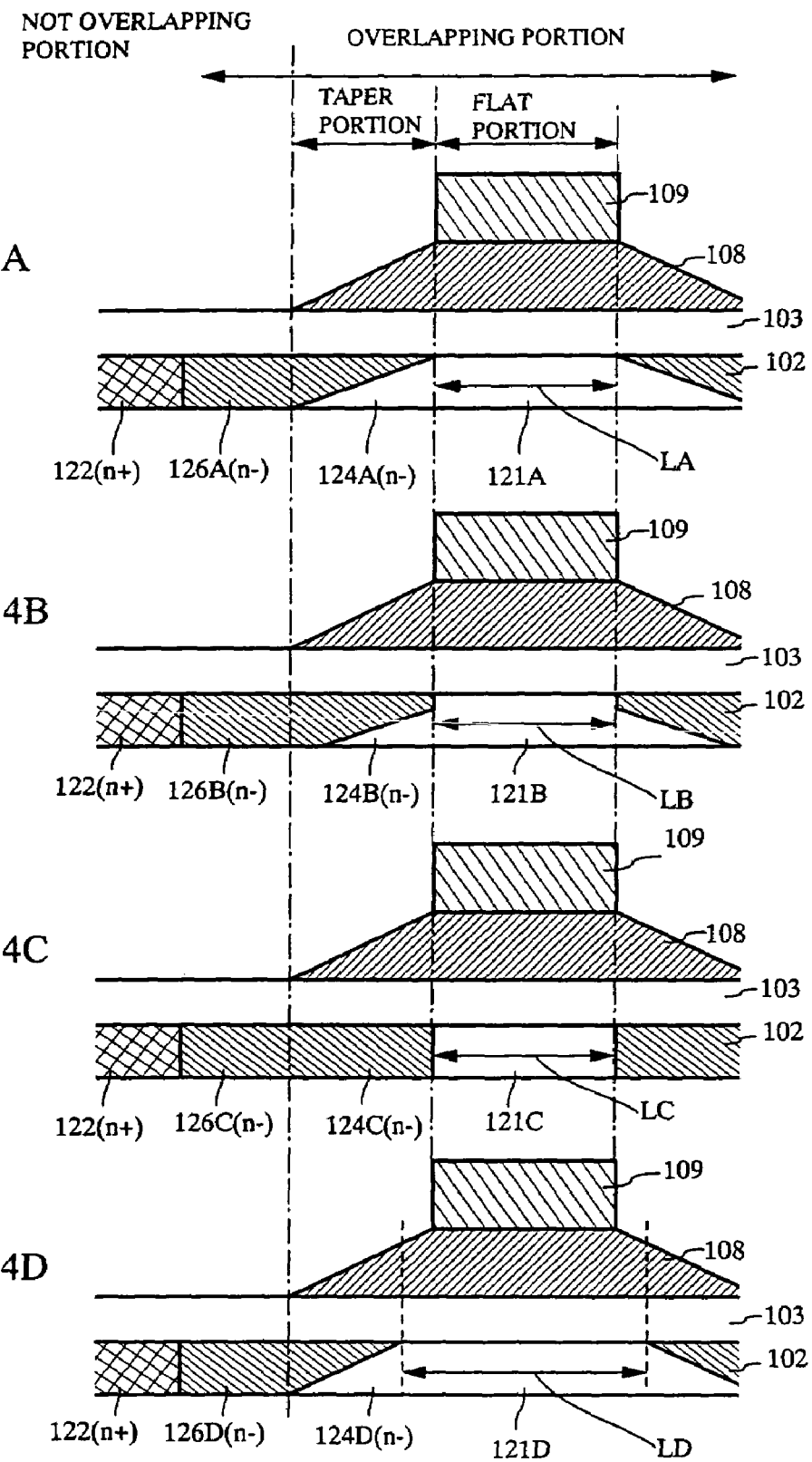

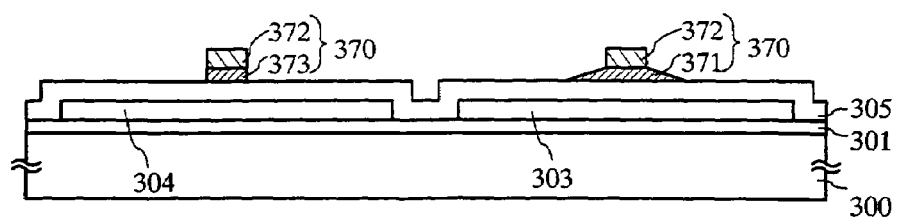
FIG. 21A
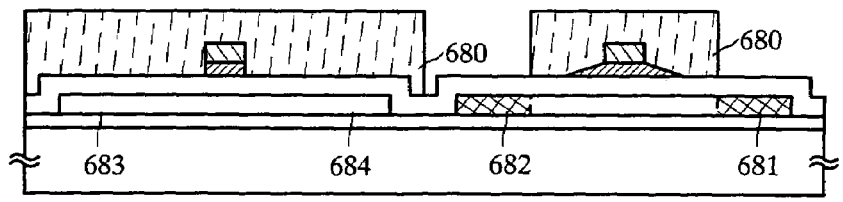
FIG. 21B
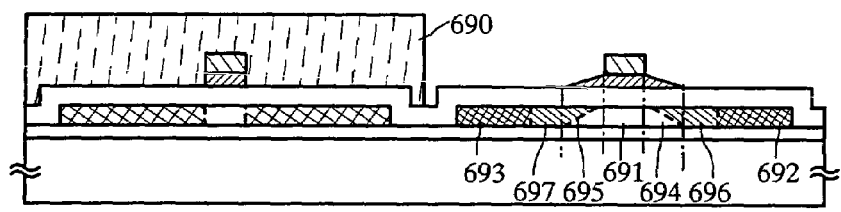
FIG. 21C
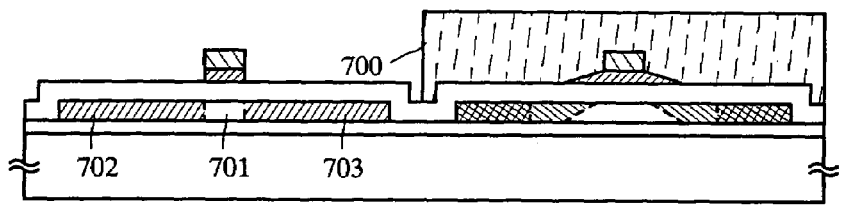
FIG. 21D
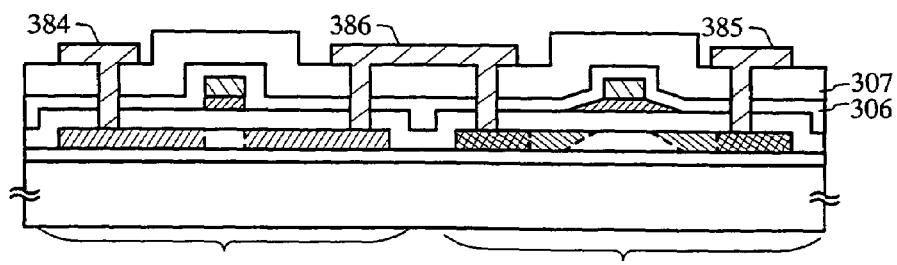
FIG. 21E  P-CHANNEL TFT  N-CHANNEL TFT FIG. 24    DEPENDENCY OF TAPER ANGLE $\theta$ UPON BIAS POWER

DEPENDENCY OF TAPER ANGLE θ UPON $CF_4$ FLOW RATIO

SEMICONDUCTOR DEVICE COMPRISING THIN FILM TRANSISTOR COMPRISING CONDUCTIVE FILM HAVING TAPERED EDGE

BACKGROUND OF THE INVENTION

1. Field of the Invention

The present invention relates to a thin film transistor (hereinafter referred to as a "TFT") and a semiconductor device including a circuit constituted by thin film transistors. The present invention also relates to, as the semiconductor device, an electro-optical device typified by, for example, a liquid crystal panel, and an electronic equipment including such an electro-optical device as a part. Incidentally, the term "semiconductor device" in this specification indicates any devices functioning by using semiconductor characteristics, and an electro-optical device, a semiconductor circuit, and an electronic equipment are also semiconductor devices.

2. Description of the Related Art

In recent years, attention has been paid to an active matrix type liquid crystal display device in which its circuit is constituted by TFTs using polysilicon films. This device controls an electric field applied to a liquid crystal in a matrix state by a plurality of pixels arranged in a matrix form, and realizes an image display with high fineness.

In such an active matrix type liquid crystal display device, as the resolution becomes high fineness like XGA or SXGA, the number of pixels alone comes to exceed one million. A driver circuit for driving all the pixels is formed of very complicated and numerous TFTs.

The specification required for an actual liquid crystal display device (also called a liquid crystal panel) is severe, and in order that all pixels normally operate, high reliability must be secured for both the pixels and the driver. Particularly, if an abnormality occurs in the driver circuit, there occurs a bad state called a linear defect in which all pixels of one column (or one row) are destroyed.

However, a TFT using a polysilicon film is generally considered to be inferior in reliability to a MOSFET (transistor formed on a single crystal semiconductor substrate) used for an LSI or the like. Such a view becomes strong that it is difficult to form an LSI circuit by TFTs unless this weak point is overcome.

As a structure for improving the reliability of a TFT, GOLD (Gate Overlapped Light-doped Drain), LATID (Large-Tilt-Angle Implanted Drain), and the like are known. The feature of these structures is that an LDD region and a gate electrode overlap with each other, and by doing so, it becomes possible to reduce an impurity concentration of the LDD region, an effect of relieving an electric field becomes large, and hot carrier resistance becomes high.

For example, in "M. Hatano, H. Akimoto, and T. Sakai, IEDM97 TECHNICAL DIGEST, p 523-526, 1997", a TFT with the GOLD structure is realized by using a side wall formed of silicon.

However, the GOLD structure disclosed in the paper has a problem that an off current (current flowing when a TFT is in an off state) becomes large as compared with a normal LDD structure, and a countermeasure for that has been required.

SUMMARY OF THE INVENTION

An object of the present invention is to provide a TFT in which the defect of a GOLD structure TFT is removed, an off current is reduced, and hot carrier resistance is high. Another object of the invention is to realize a highly reliable semiconductor device including a semiconductor circuit which is formed of such TFTs.

In order to achieve the foregoing objects, a thin film transistor of the present invention includes an n-type or p-type first impurity region functioning as a source region or drain region in a semiconductor layer in which a channel is formed, and two kinds of impurity regions (second and third impurity regions) disposed between the channel and the first impurity region and having the same conductivity as the first impurity region. These second and third impurity regions have a concentration of an impurity, which determines the conductivity, lower than that of the first impurity region and function as high resistance regions.

The second impurity region is a low concentration impurity region which overlaps with a gate electrode through a gate insulating film, and has a function to increase hot carrier resistance. On the other hand, the third impurity region is a low concentration impurity region which does not overlap with the gate electrode, and has a function to prevent an off current from increasing.

Incidentally, the gate electrode is an electrode intersecting with the semiconductor layer through the gate insulating film, and is an electrode to form a depletion layer by applying an electric field to the semiconductor layer. In gate wiring lines, its portion intersecting with the semiconductor layer through the gate insulating film is the gate electrode.

Further, in the gate electrode of the present invention, the thickness of the periphery of the gate electrode is linearly decreased from its center flat portion toward the outside. Since the impurity to give the conductivity is added into the second impurity region through a taper portion of the gate electrode, the gradient of the concentration reflects the slant (change in the thickness) of the side of the gate electrode. That is, the concentration of the impurity added into the second impurity region increases from the channel formation region toward the first region.

In the present invention, in another structure of the gate electrode, a first gate electrode being in contact with a gate insulating film and a second gate electrode formed on the first gate electrode are laminated to each other. In this structure, an angle formed between the side of the first gate electrode and the gate insulating film is from 3 degrees to 60 degrees, and a taper shape is formed. On the other hand, the width of the second gate electrode in the channel length direction is shorter than the first gate electrode.

Also in a thin film transistor including the above laminate type gate electrode, the concentration distribution of the impurity in the second impurity region reflects the change in the film thickness of the first gate electrode, and its impurity concentration increases from the channel formation region toward the first region.

Since the thin film transistor of the present invention includes the two kinds of low concentration impurity regions in the semiconductor layer, it has reliability comparable to or superior to a MOSFET.

BRIEF DESCRIPTION OF THE DRAWINGS

FIGS. 4A to 4D are partial sectional views of semiconductor layers (embodiment mode 1);

FIGS. 21A to 21E are sectional views showing fabricating steps of a CMOS circuit of the present invention (example 6);

FIGS. 34A to 34H are characteristic views of gate voltage—drain current of a

DETAILED DESCRIPTION OF THE INVENTION

First, the advantages of the present invention as compared with a conventional TFT will be described with reference to FIGS. 34A to 34H.

The feature of the present invention is that two kinds of low concentration impurity regions of a second impurity region (gate overlap type LDD region) and a third impurity region (gate non-overlap type LDD region) are formed in a semiconductor layer.

Figure 34A:
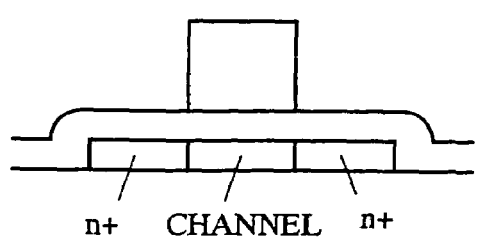
Figure 34B:
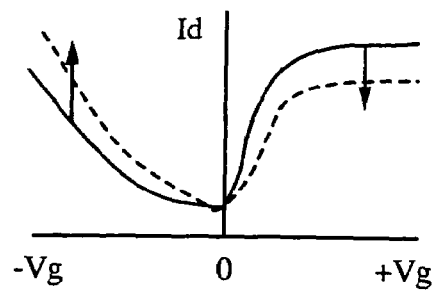
Figure 34C:
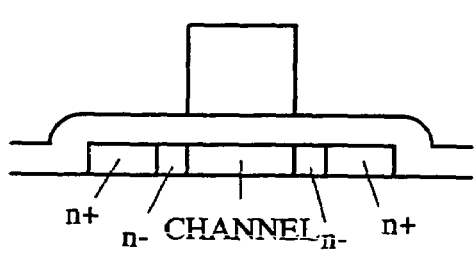
Figure 34D:
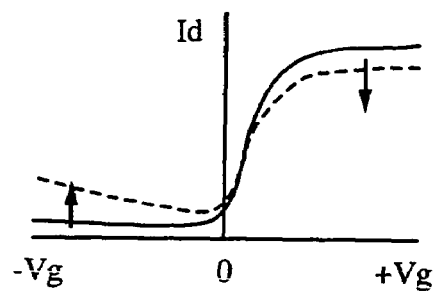
Figure 34E:
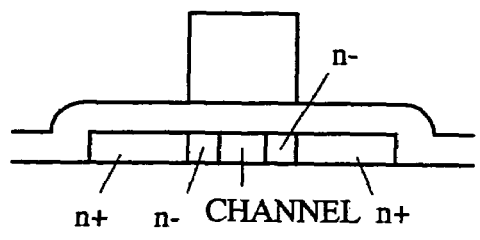
Figure 34F:
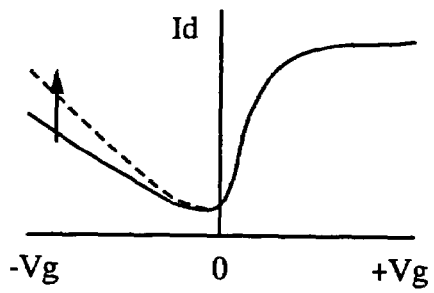
Figure 34G:
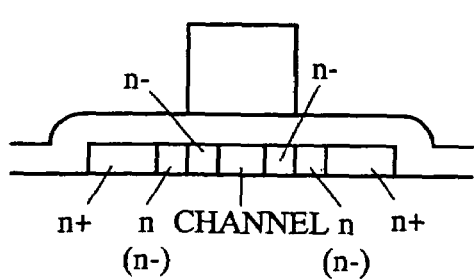
Figure 34H:
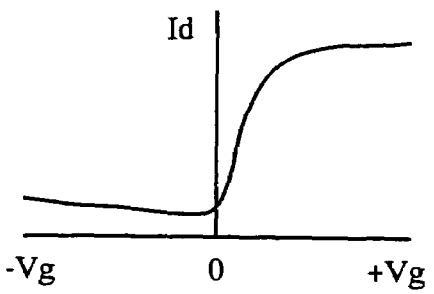

FIG. 34A is a schematic view of an n-channel TFT without an LDD region, and FIG. 34B is a view showing its electrical characteristics (characteristics of gate voltage Vg versus drain current Id). Similarly, FIGS. 34C and 34D show a case of a normal LDD structure, FIGS. 34E and 34F show a case of a so-called GOLD structure, and FIGS. 34G and 34H show a case of an n-channel TFT of the present invention.

In the drawings, reference character "$n^+$" designates a source region or drain region, "channel" designates a channel formation region, and "$n^-$" designates a low concentration impurity region having an impurity concentration lower than the region "$n^+$". The reference character "Id" designates a drain current and "Vg" designates a gate voltage.

As shown in FIGS. 34A and 34B, in the case where an LDD does not exist, an off current (drain current when a TFT is in an off state) is high, and an on current (drain current when the TFT is in an on state) and the off current are apt to deteriorate.

On the other hand, by forming a gate non-overlap type LDD, the off current can be considerably suppressed, and deterioration of both the on current and the off current can be suppressed. However, the deterioration of the on current is not completely suppressed (FIGS. 34C and 34D).

The TFT structure shown in FIGS. 34E and 34F (GOLD structure) has only an overlap type LDD in which an LDD region overlaps with a gate electrode, and this structure is such that importance is attached to the suppression of deterioration of an on current in the conventional LDD structure.

In this case, although the deterioration of the on current can be sufficiently suppressed, this structure has a problem that the off current is slightly higher than the normal non-overlap type LDD structure. The paper disclosed in the prior art adopts this structure, and on the premise of the recognition of this problem that the off current is high, the present invention is a result obtained after searching for a structure to solve this problem.

As shown in FIGS. 34G and 34H, the structure of the present invention is such that an LDD region (second impurity region) which is made to overlap with a gate electrode and an LDD region (third impurity region) which does not overlap with the gate electrode are formed in a semiconductor layer. By adopting this structure, it becomes possible to reduce the off current while the effect of suppressing the deterioration of the on current is maintained.

The present applicant has presumed the reason why the off current becomes high in the case of the structure as shown in FIGS. 34E and 34F as follows: When an n-channel TFT is in an off state, a negative voltage of minus several tens volts is applied to a gate electrode. If a positive voltage of plus several tens volts is applied to a drain region in that state, a very large electric field is formed at a drain side end of a gate insulating film.

At this time, holes are induced in the LDD region, and a current path through minority carriers and connecting the drain region, the LDD region, and the channel formation region is formed. It is expected that this current path causes the increase of the off current.

The present applicant has considered that in order to cut off such a current path on the way, it is necessary to form another resistor, that is, a third impurity region of an LDD region at a position where it does not overlap with the gate electrode. The present invention relates to a thin film transistor having such a structure and a circuit using this thin film transistor.

EMBODIMENT MODE OF THE INVENTION

Embodiment modes of the present invention will be described with reference to FIGS. 1A to 7.

Embodiment Mode 1

In this embodiment mode, the present invention is applied to a TFT. Fabricating steps in this embodiment mode will be described with reference to FIGS. 1A to 4D.

Figure 1A:
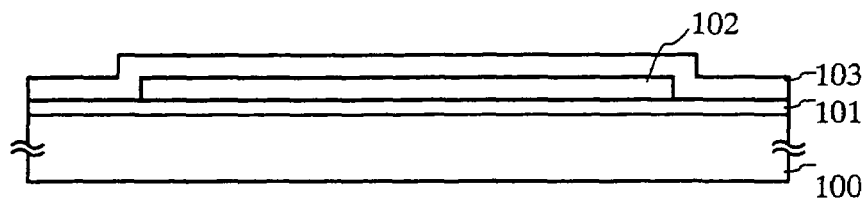
FIGS. 1A to 1D are sectional views showing fabricating steps of a TFT of the present invention (embodiment mode 1)

First, an under film 101 is formed on the entire surface of a substrate 100, and an island-like semiconductor layer 102 is formed on the under film 101. An insulating film 103 which becomes a gate insulating film is formed on the entire surface of the substrate 100 to cover the semiconductor layer 102 (FIG. 1A).

As the substrate 100, a glass substrate, a quartz substrate, a crystalline glass substrate, a stainless substrate, or a resin substrate of polyethylene terephthalate (PFT) etc. may be used.

The under film 101 is a film for preventing an impurity such as a sodium ion from diffusing from the substrate to the semiconductor layer 102 and for increasing the adhesion of a semiconductor film formed on the substrate 100. As the under film 101, a single-layer or multi-layer film of an inorganic insulating film such as a silicon oxide film, a silicon nitride film, and a silicon nitride oxide film.

As a method of forming the under film 101, it is possible to use not only a CVD method or a sputtering method, but also a method of forming a silicon oxide film by forming and thermally oxidizing an amorphous silicon film in the case where a heat-resistant substrate such as a quartz substrate is used.

As the under film 101, it is possible to use not only the above inorganic insulating film, but also a multi-layer film in which the above inorganic insulating film as an upper layer is laminated on a lower layer of a conductive film of metal or alloy such as silicide of tungsten silicide etc., chromium, titanium, titanium nitride, and aluminum nitride.

The material and crystallinity of the semiconductor layer 102 may be suitably selected according to characteristics required for the TFT. It is possible to use amorphous silicon, amorphous silicon germanium, amorphous germanium, or crystalline silicon, crystalline germanium, or crystalline silicon germanium, which is obtained by crystallizing the amorphous semiconductor with laser irradiation or heating treatment. The thickness of the semiconductor layer 102 may be made 10 to 150 nm.

The insulating film 103 is a film for making a gate insulating film of the TFT and is a single-layer film or a multi-layer film of an inorganic film of silicon oxide, silicon nitride, or silicon nitride oxide. For example, in the case of making a laminate film, a two-layer film of a silicon nitride oxide film and a silicon oxide film, a laminate film of a silicon nitride film sandwiched between silicon oxide films, or the like may be used.

As a method of forming the insulating film 103, a chemical vapor deposition method (CVD) such as a plasma CVD method or ECRCVD method, or a physical vapor deposition method (PVD) such as a sputtering method may be used.

Figure 1B:
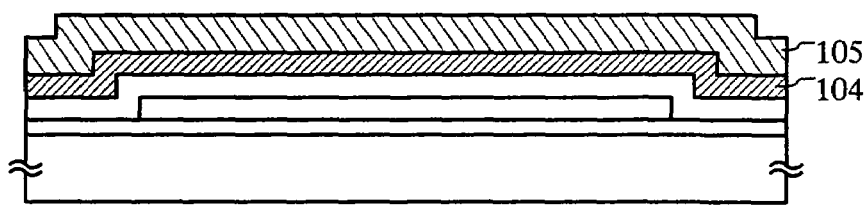

A first conductive film 104 and a second conductive film 105 for making a gate electrode (gate wiring line) are formed on the insulating film 103 (FIG. 1B).

The first conductive film 104 makes a first gate electrode (first gate wiring line) 108 having a taper portion. Thus, it is desirable to use a material in which taper etching can be easily carried out. For example, a material containing chromium (Cr) or tantalum (Ta) as its main ingredient (composition ratio is 50% or more), or n-type silicon containing phosphorus is typically used. Besides, a material containing titanium (Ti), tungsten (W), molybdenum (Mo), or the like as its main ingredient may be used. Besides, it is possible to use not only a single-layer film of the material but also a multi-layer film, for example, a three-layer film of tantalum nitride (TaN) films and a tantalum film sandwiched between them.

The second conductive film 105 is a film for making a second gate electrode (second gate wiring line) 109, and it may be formed of a material containing aluminum (Al), copper (Cu), chromium (Cr), tantalum (Ta), titanium (Ti), tungsten (W), or molybdenum (Mo) as its main ingredient (composition ratio is 50% or more), or a material such as n-type silicon containing phosphorus or silicide. However, it is necessary to select such materials that there is an etching selection ratio in mutual patterning of the first conductive film and the second conductive film.

For example, as the first conductive film 104/the second conductive film 105, it is possible to select the combination of n-type Si/Ta, n-type Si/Ta—Mo alloy, Ta/Al, Ti/Al, WN/W, TaN/Ta, etc. As another index of selection of materials, it is desirable that the second conductive film 105 has resistivity as low as possible, and is made of a material having sheet resistance lower than, at least, the first conductive film 104. This is because contact is made between the second gate wiring line and an upper layer wiring line in order to connect the gate wiring line to the upper layer wiring line. The thickness of the first conductive film 104 is made 10 to 400 nm, the thickness of the second conductive film is made 10 to 400 nm, and the total of the thicknesses is made 200 to 500 nm.

Figure 1C:
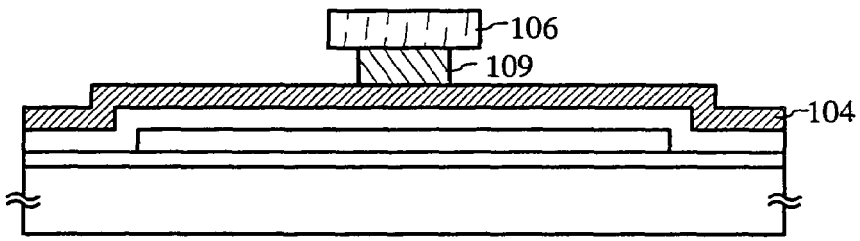
Figure 1D:
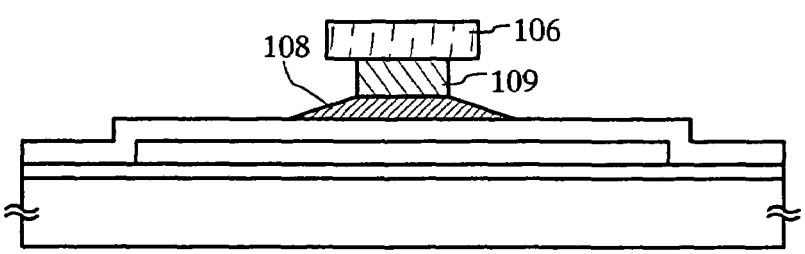

Next, a resist mask 106 is formed on the second conductive film 105. The second conductive film 105 is etched by using the resist mask 106 to form a second gate electrode 109. As etching, isotropic wet etching may be used. If an etching selection ratio can be secured with respect to the first conductive film 104, dry etching may be used (FIG. 1C).

The first conductive film 104 is anisotropically etched (so-called taper etching) by using the same resist mask 106 to form a first gate electrode (first gate wiring line) 108. A new resist mask may be formed for this etching.

Figure 3:
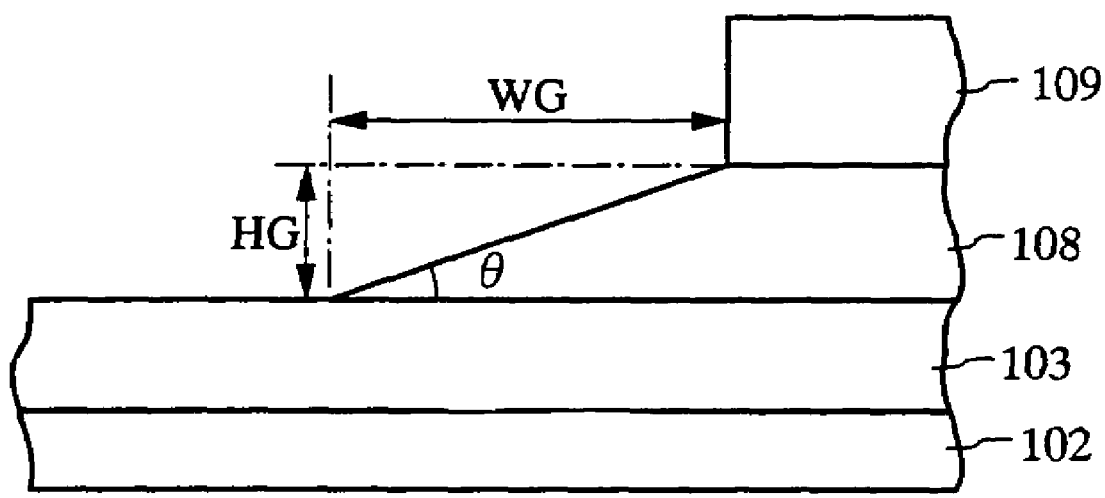
FIG. 3 is a partial sectional view of a gate electrode (embodiment Mode 1)

By this etching, as shown in FIG. 3, a taper angle θ between a side of the gate electrode 108 and the gate insulating film 103 is made from 3 degrees to 60 degrees. This taper angle θ is made preferably from 5 degrees to 45 degrees, more preferably from 7 degrees to 20 degrees. The smaller the angle θ is, the smaller the change in the thickness of the taper portion of the gate electrode 108 is, and correspondingly to this, it is possible to moderate the change of concentration of an n-type or p-type impurity in a portion of the semiconductor layer which intersects with the taper portion.

As shown in FIG. 3, the taper angle θ is defined as tan θ=HG/WG using the width WG of the taper portion and the thickness HG.

The resist mask 106 is removed and an impurity of predetermined conductivity (n-type or p-type) is added into the semiconductor layer 102 by using the gate electrodes 108 and 109 as masks. As a method of the addition, an ion implantation method or an ion doping method may be used. The n-type impurity is an impurity which becomes a donor, is an element in group 15 with respect to silicon or germanium, and is typically phosphorus (P) or arsenic (As). The p-type impurity is an impurity which becomes an acceptor, is an element in group 13 with respect to silicon or germanium, and is typically boron (B).

Here, phosphorus is added by the ion doping method to form $n^-$-type impurity regions 111 and 112. In this adding step, the concentration distribution of the n-type impurity in $n^-$-type second impurity regions 124 and 125, and $n^-$-type third impurity regions 126 and 127 is determined. In this specification, the term $n^-$-type indicates that the concentration of an impurity which becomes a donor is lower than $n^+$ type, and the sheet resistance is higher (FIG. 2A).

Since phosphorus is added into the $n^-$-type impurity regions 111 and 112 through the taper portion of the first gate electrode 108, the concentration gradient reflects the change in the thickness of the taper portion of the first gate electrode 108 as shown in the drawing. That is, in the concentration distribution of phosphorus in the depth direction, when attention is paid to a depth where the concentration has an arbitrary value, the gradient of the concentration becomes a profile reflecting the slant of the taper portion of the gate electrode.

Further, as described later, the concentration gradient of the $n^-$-type impurity regions 111 and 112 depends on also an acceleration voltage at the time of doping. In the present invention, for the purpose of making phosphorus pass through the taper portion of the first gate electrode 108 and the insulating film 103, it is necessary to set the acceleration voltage of doping as high as 40 to 100 keV. If this acceleration voltage is selected, phosphorus can pass through the portion with a thickness of 100 nm or less of the taper portion of the gate electrode 108.

Figure 2A:
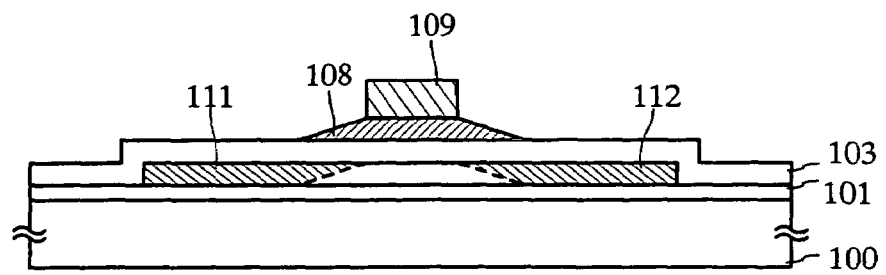
FIGS. 2A to 2C are sectional views showing fabricating steps of a TFT of the present invention (embodiment mode 1)

In FIG. 2A, although the regions overlapping with the first electrode 108 in the $n^-$-type impurity regions 111 and 112 are respectively shown by a hatching portion and a blank portion, this does not indicate that phosphorus is not added into the blank portion, but as described above, this is intended to make it possible to intuitively understand that the concentration distribution of phosphorus in this region reflects the thickness of the taper portion of the first gate electrode 108. The same thing can be said of the other drawings in this specification.

Next, a resist mask 120 covering the gate electrodes 108 and 109 is formed. The length of the third impurity region is determined by this mask 120. Phosphorus as an n-type impurity is again added into the semiconductor layer 102 by the ion doping method through the resist mask 120 (FIG. 2B).

Phosphorus is selectively added into the $n^-$-type impurity regions 111 and 112 not covered with the resist mask 120, so that $n^+$-type first impurity regions 122 and 123 are formed. Since a region 121 covered with the second gate electrode 109 is not added with phosphorus in the adding steps of FIGS. 2A and 2B, it becomes a channel formation region.

Figure 2B:
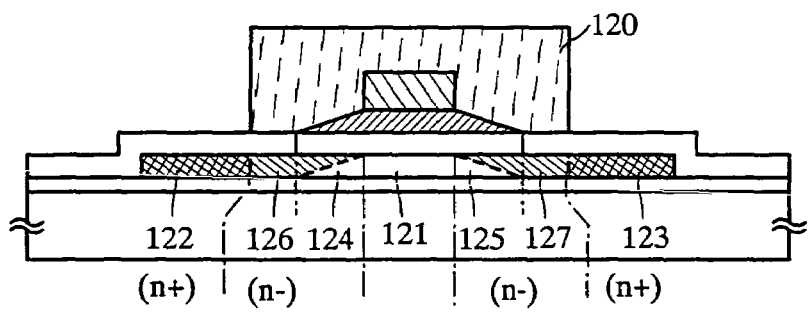
Figure 2C:
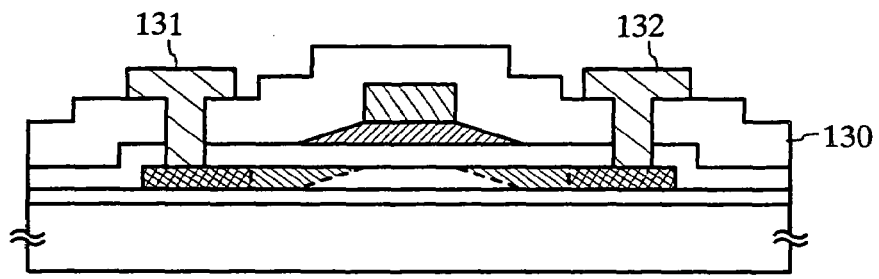

In the $n^-$-type impurity regions 111 and 112, regions which were not added with phosphorus in the adding step of FIG. 2B become low concentration impurity regions 124 to 127 which have resistance higher than source/drain regions.

The regions 124 and 125 overlapping with the first gate electrode 108 become the $n^-$-type second impurity region, and the regions not overlapping with the first electrode 108 become the $n^-$-type third impurity regions 126 and 127.

Incidentally, prior to the adding step of FIG. 2B, the surface of the semiconductor layer 102 may be exposed by etching the insulating film 103 with the gate wiring line as a mask.

As shown in FIGS. 4A to 4D, the second impurity region 124 is classified into four types. For the purpose of distinguishing these, FIG. 4 is divided into FIGS. 4A to 4D, and reference numerals 121 and 124 are added with indices A-D. Although not shown in FIGS. 4A to 4D, the other second impurity region 125 symmetrically formed with respect to the gate electrode 109 is also similar to the region 124.

As shown in FIG. 4A, the concentration of phosphorus in a second impurity region 124A is in inverse proportion to the change of the thickness of the taper portion of the first gate electrode 108, and it is almost linearly decreased from the third impurity region 126A toward a channel formation region 121A. That is, in the case where the concentration of phosphorus in the second impurity region 124A is averaged in the depth direction, the averaged concentration of phosphorus increases from the channel formation region 121A toward the third impurity region 126A.

In this case, in the third impurity region 126A, the averaged concentration of phosphorus in the thickness direction becomes almost uniform in the region 126A. Since phosphorus is not absolutely added into the semiconductor layer covered with the second gate electrode 109, this region becomes the channel formation region 121A, and a channel length LA becomes the width of the second gate electrode 109 in the channel length direction.

In the phosphorus adding step of FIG. 2A, in the case of making an acceleration voltage higher than the case of FIG. 4A, as shown in FIG. 4B, phosphorus is added also into a connection portion of a second impurity region 124B to a channel formation region 121B. Also in this case, the channel formation region 121B is a region covered with the second gate electrode 109, and a channel length LB becomes the width of the second gate electrode 109 in the channel length direction. Even if the acceleration voltage is the same as the case of FIG. 4A, also in the case where the taper angle is small or the thickness of the taper portion is thin, the second impurity region 124B can be formed.

In the case of further increasing the acceleration voltage, as shown in FIG. 4C, the concentration of phosphorus averaged in the thickness direction can also be made uniform in a second impurity region 124C. In this case, a channel length LC becomes the width of the second gate electrode 109 in the channel length direction.

When the acceleration voltage is made smaller than the case of FIG. 4A in the phosphorus adding step of FIG. 2A, as shown in FIG. 4D, since phosphorus can pass through only a thin portion of the taper portion of the first gate electrode 108, a second impurity region 124D becomes narrower than that in FIG. 4A.

In the second impurity region 124D, similarly to FIG. 4A, the averaged concentration of phosphorus in the depth direction is gradually decreased from a third impurity region 126D toward a channel formation region 121D. However, the case of FIG. 4D is different from FIG. 4A, that is, the connection portion between the second impurity region 124D and the channel formation region 121D exists under the taper portion of the first gate electrode 108. Thus, a channel length LD becomes wider than the width of the second gate electrode 109 in the channel length direction.

Even if the acceleration voltage is the same as FIG. 4A, also in the case where the taper angle is large or the film of the first gate electrode 108 is thick, the second impurity region 124D of FIG. 4D can be formed.

As described above, when the impurity is added by the plasma doping method, in the taper portion of the first gate electrode 108, the impurity can pass through the portion with a thickness of 100 nm or less to form the second impurity region 124, so that the channel length and the length of the second impurity region can be controlled by adjusting the thickness of the first conductive film 104 (thickness of a portion where the thickness of the first gate electrode 108 becomes maximum) and the taper angle $\theta$.

Here, the length (in the channel length direction) of the first impurity regions 122 and 123 is 2 to 20 μm (typically 3 to 10 μm). The concentration of the impurity (in this case, phosphorus) to give the conductivity to the semiconductor layer is $1 \times 10^{19}$ to $1 \times 10^{21}$ atoms/cm$^3$ (typically $1 \times 10^{20}$ to $5 \times 10^{20}$ atoms/cm$^3$). The first impurity regions 122 and 123 are respectively low resistance regions to electrically connect a source wiring line or drain wiring line with the TFT, and become a source region or drain region.

The length of the second impurity regions 124 and 125 is 0.1 to 1 μm (typically 0.1 to 0.5 μm, preferably 0.1 to 0.2 μm), and the concentration of phosphorus is $1 \times 10^{15}$ to $1 \times 10^{17}$ atoms/cm$^3$ (typically $5 \times 10^{15}$ to $5 \times 10^{16}$ atoms/cm$^3$, preferably $1 \times 10^{16}$ to $2 \times 10^{16}$ atoms/cm$^3$). Since the impurity is added through the first gate electrode 108, the concentration of phosphorus becomes lower than the first and third impurity regions.

The length of the third impurity regions 126 and 127 is 0.5 to 2 μm (typically 1 to 1.5 μm), and the concentration of phosphorus is $1 \times 10^{16}$ to $1 \times 10^{19}$ atoms/cm$^3$ (typically $1 \times 10^{17}$ to $5 \times 10^{18}$ atoms/cm$^3$, preferably $5 \times 10^{17}$ to $1 \times 10^{18}$ atoms/cm$^3$).

The channel formation region 121 is made of an intrinsic semiconductor layer, and is a region which does not contain an impurity (phosphorus) added into the first impurity region or a region which contains boron with a concentration of $1 \times 10^{16}$ to $5 \times 10^{18}$ atoms/cm$^3$. Boron is an impurity for controlling threshold voltage or for preventing punch through, and other elements may be used if the same effect is obtained. Also in that case, its concentration is made the same as boron.

Although the low concentration impurity region (third impurity regions 126, 127) not overlapping with the gate electrode is formed between the first impurity regions 122, 123 and the second impurity regions 124, 125, two or more impurity regions where impurity concentration is different from each other may be formed in this portion. In the present invention, at least one impurity region with impurity (phosphorus) concentration lower than the first impurity regions 122, 123, that is, at least one impurity region with resistance higher than the first impurity regions 122, 123 has only to exist at least between the first impurity regions 122, 123 and the second impurity regions 124, 125. Of course, it is also important that this impurity region (third impurity region) with high resistance does not overlap with the gate electrode.

After the first impurity regions 122 and 123 are formed, the resist mask 120 is removed. Phosphorus added into the semiconductor layer 102 is activated by a heat treatment. As the activation step, not only the heat treatment but also light annealing by laser or infrared lamp light may be carried out.

Next, an interlayer insulating film 130 made of silicon oxide or the like is formed. Contact holes reaching the first impurity regions 122 and 123, and the second gate wiring line 109 are formed in the gate insulating film 103 and the interlayer insulating film 130. A source electrode 131, a drain electrode 132, and a not-shown lead electrode for the gate wiring line are formed.

Embodiment Mode 2

Fabricating steps of a TFT of this embodiment mode 2 will be described with reference to FIGS. 5A to 5C and FIGS. 6A to 6C. This embodiment mode is a modified example of the embodiment mode 1, in which the structure of a gate electrode (gate wiring line) is modified, and another main structure is the same as the embodiment mode 1.

Although the gate electrode in the embodiment mode 1 has such a structure that two gate electrodes with different widths are laminated, in this embodiment mode, the upper second electrode is omitted, and the gate electrode is formed of only a first gate electrode having a taper portion.

Figure 5A:
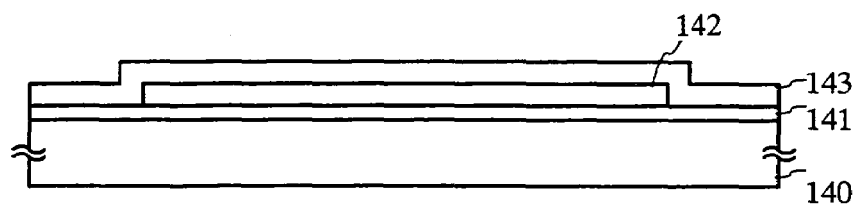
FIGS. 5A to 5C are sectional views showing fabricating steps of a TFT of the present invention (embodiment mode 2)

First, an under film 141 is formed on the entire surface of a substrate 140, and an island-like semiconductor layer 142 is formed on the under film 141. An insulating film 143 which becomes a gate insulating film is formed on the entire surface of the substrate 140 to cover the semiconductor layer 142 (FIG. 5A).

Figure 5B:
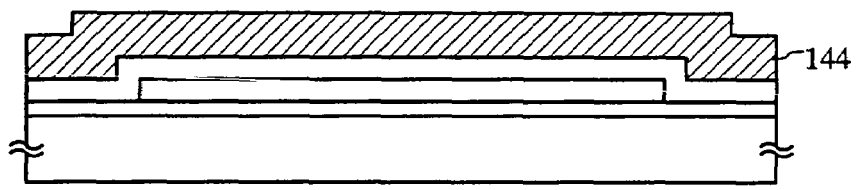

A conductive film 144 for making a gate electrode (gate wiring line) is formed on the gate insulating film 143. It is desirable that this conductive film 144 is made of a material in which taper etching can be easily carried out. For example, a material containing chromium (Cr) or tantalum (Ta) as its main ingredient (composition ratio is 50% or more), or n-type silicon containing phosphorus is typically used. A material containing titanium (Ti), tungsten (W), molybdenum (Mo), etc. as its main ingredient may also be used. Besides, it is possible to use not only a single layer film of these materials but also a multi-layer film. For example, it is possible to use a three-layer film made of tantalum nitride (TaN) films and a tantalum film sandwiched between them. The thickness of the conductive film 144 is made 200 to 500 nm (FIG. 5B).

Figure 5C:
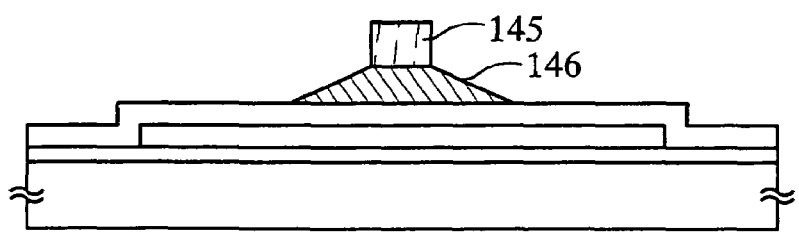

Next, a resist mask 145 is formed on the conductive film 144. The conductive film is etched by using the mask 145 to form a gate electrode (gate wiring line) 146 (FIG. 5C).

By this etching, as shown in FIG. 3, a taper angle $\theta$ between a side of the gate electrode 146 and the gate insulating film is made from 3 degrees to 60 degrees. This taper angle $\theta$ is preferably from 5 degrees to 45 degrees, more preferably from 7 degrees to 20 degrees.

Figure 6A:
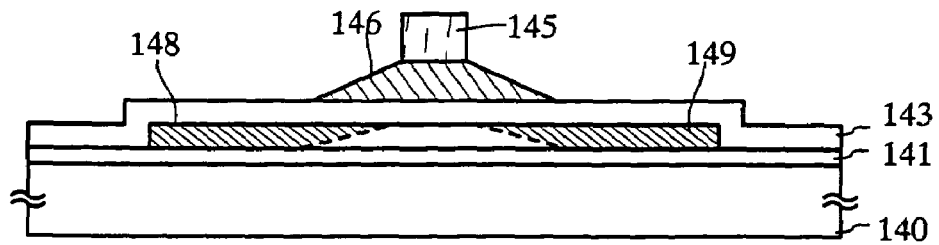
FIGS. 6A to 6C are sectional views showing fabricating steps of a TFT of the present invention (embodiment mode 2)

An impurity of predetermined conductivity (n-type or p-type) is added into the semiconductor layer 142 in the state where the resist mask 145 exists. Here, phosphorus is added by an ion doping method to form n$^-$-type impurity regions 148 and 149. In this adding step, the concentration distribution of n$^-$-type second impurity regions 154 and 155, and n$^-$-type third impurity regions 156 and 157 is determined. Although described later, a region covered with the resist mask 145 becomes a channel formation region 151 (FIG. 6A).

Since a second gate electrode does not exist, this adding step requires a mask to prevent phosphorus from being added into a region where a channel of the semiconductor layer 142 is formed. Although the resist mask 145 used for etching of the conductive film 144 was used as such a mask, a mask for addition of an impurity may be newly formed.

Next, the resist mask 145 is removed, and a resist mask 150 covering the gate electrode 146 is formed. Since phosphorus as an n-type impurity is again added into the semiconductor layer 142 by the ion doping method through the resist mask 150, the length of the third impurity region is determined by the resist mask 150. Prior to this adding step, the surface of the semiconductor layer 142 may be exposed by etching the insulating film 143 using the gate wiring line 146 as a mask (FIG. 6B).

Figure 6B:
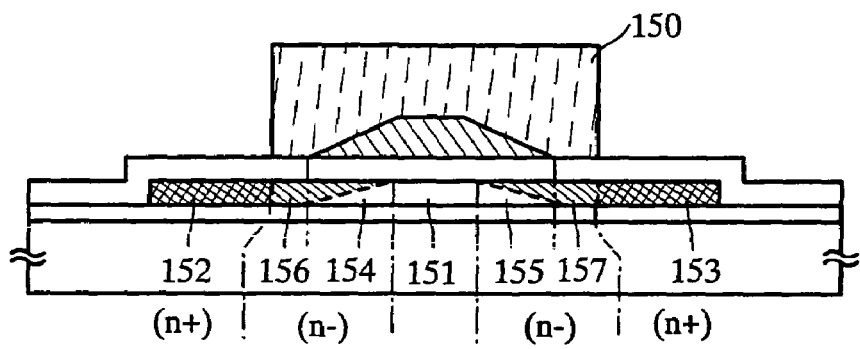
Figure 6C:
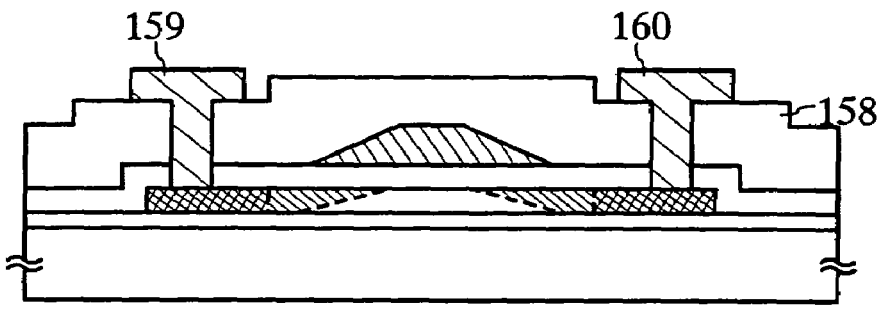

As shown in FIG. 6B, phosphorus is selectively added into portions of the n⁻-type impurity regions 148 and 149 which are not covered with the resist mask 150, so that n⁺-type first impurity regions 152 and 153 are formed.

The state of FIG. 6A is maintained in conductivity and resistance value of the region covered with the resist mask 150. Thus, the region 151 previously covered with the resist mask 145 becomes the channel formation region. The (overlap) regions overlapping with the gate electrode 146 become the n⁻-type second impurity regions 154 and 155, and the regions not overlapping with the gate electrode 146 become the n⁻-type third impurity regions 156 and 157. The second and third impurity regions 154 to 157 are low concentration impurity regions with resistance higher than the first impurity regions 152 and 153.

Similarly to the embodiment mode 1, also in this embodiment mode 2, the second impurity regions 154 and 155 can be respectively classified into the four types shown in FIGS. 4A to 4D. With respect to the channel formation region 151 and the first to third impurity regions 152 to 157, the length in the channel length direction and the impurity concentration are the same as the embodiment mode 1. However, in this embodiment mode, instead of the gate electrode 109 of the embodiment mode 1, the channel length is determined by the resist mask 145 used in the adding step of FIG. 6A.

Since the gate electrode of the embodiment mode 1 has the laminate structure of the electrodes with different shapes, even if the thickness of the first gate electrode 108 is made thin, it is possible to reduce the resistance by thickening the second gate electrode 109. However, since the gate electrode 146 of this embodiment mode is a single-layer electrode having a taper portion, the thickness becomes larger than the first gate electrode 108.

Since the width WG (see FIG. 3) of the taper portion has a limit in view of the width of the gate electrode, it is most practical that the concentration distribution of the impurity in the second impurity regions 154 and 155 is made the type shown in FIG. 4D.

Although one low concentration impurity region (third impurity regions 156, 157) not overlapping with the gate electrode is formed in a portion between the first impurity regions 152, 153 and the second impurity regions 154, 155, two or more impurity regions where impurity concentration is different from each other may be formed in this portion. In the present invention, at least one impurity region with an impurity (phosphorus) concentration lower than and with resistance higher than the first impurity regions 152, 153 has only to exist at least between the first impurity regions 152, 153 and the second impurity regions 154, 155.

After the first impurity regions 152 and 153 are formed, the resist mask 150 is removed. Phosphorus added into the semiconductor layer 142 is activated by a heat treatment. As the activation step, not only the heat treatment but also light annealing by laser or infrared lamp light may be carried out. However, in order to activate phosphorus in the second impurity regions 154 and 155, since they overlap with the gate electrode 146, the heat treatment is indispensable.

Next, an interlayer insulating film 158 made of silicon oxide or the like is formed. Contact holes reaching the first impurity regions 152 and 153 and the second gate wiring line 146 are formed in the gate insulating film 143 and the interlayer insulating film 158. A source electrode 159, a drain electrode 160, and a not-shown lead electrode for the gate wiring line 146 are formed.

Embodiment Mode 3

Figure 7:
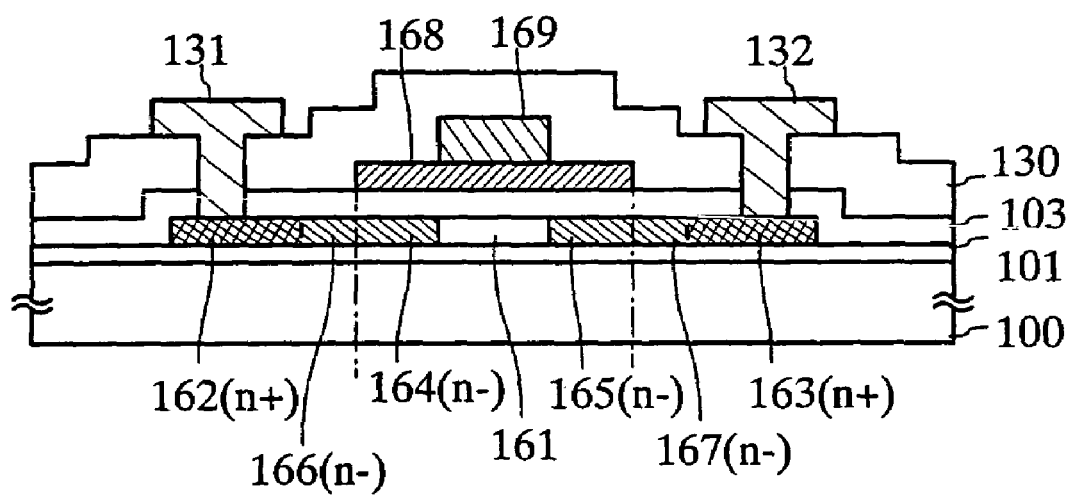
FIG. 7 is a sectional view of a TFT of the present invention (embodiment mode 3)

Fabricating step of a TFT of this embodiment mode will be described with reference to FIG. 7. This embodiment mode is also a modified example of the embodiment mode 1, in which the structure of a gate electrode (gate wiring line) is modified, and another main structure is the same as the embodiment mode 1. Incidentally, in FIG. 7, the same reference numerals as FIGS. 1 and 2 designate the same structural elements.

Similarly to the embodiment mode 1, although a gate electrode of this embodiment mode 3 has such a structure that a first gate electrode 168 and a second gate electrode 169 are laminated to each other, this embodiment mode is an example in which a side of the first gate electrode 168 is not made taper-shaped. In this embodiment mode, the portion of the first gate electrode 168 extending from the side of the second gate electrode 169 to the outside also has an almost constant film thickness.

A channel formation region 161, n⁺-type first impurity regions 162 and 163, n⁻-type second impurity regions 164 and 165, and n⁻-type third impurity regions 166 and 167 are formed in a semiconductor layer through addition of phosphorus similar to the embodiment mode 1.

In this embodiment mode, since the thickness of the first gate electrode 168 is made constant, the impurity concentration in the second impurity regions 164 and 165 hardly has a gradient.

Embodiment Mode 4

This embodiment mode is a modified example of the embodiment mode 1 and the embodiment mode 2. In the embodiment modes 1 and 2, the thickness of the taper portion of the gate electrode changes almost linearly. In this embodiment mode, the thickness of a taper portion is nonlinearly changed.

Figure 8:
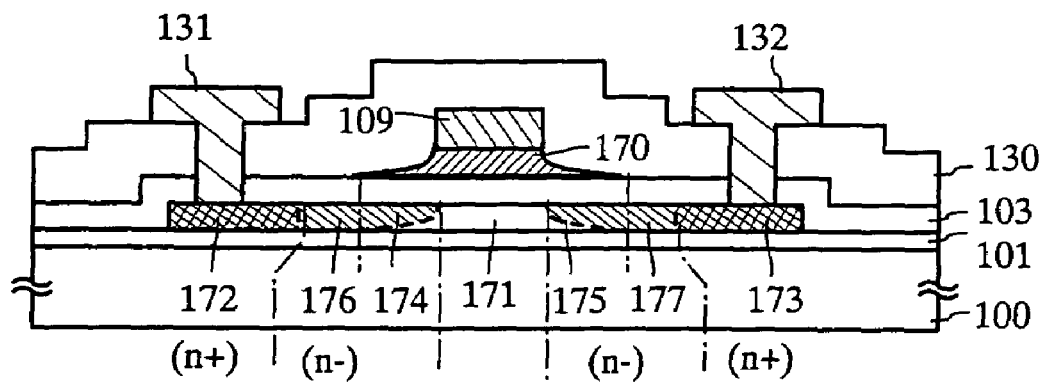
FIG. 8 is a sectional view of a TFT of the present invention (embodiment mode 4)

FIG. 8 shows a modified example of a TFT of the embodiment mode 1. In FIG. 8, the same reference numerals as those of FIGS. 2A to 2C designate the same structural elements. As shown in FIG. 8, the thickness of a taper portion of a first gate electrode 170 (gate wiring line) is nonlinearly changed. A channel formation region 171, n⁺-type first impurity regions 172 and 173, n⁻-type second impurity regions 174 and 175, and n⁻-type third impurity regions 176 and 177 are formed in a semiconductor layer through addition of phosphorus similar to the embodiment mode 1.

Figure 9:
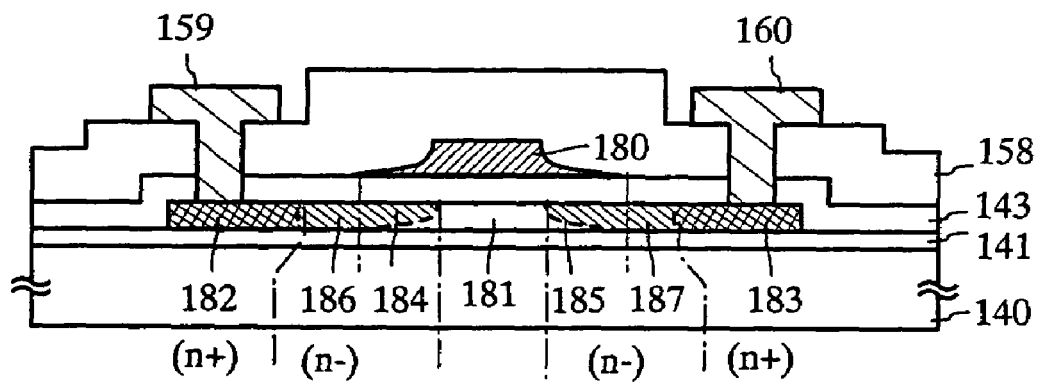
FIG. 9 is a sectional view of a TFT of the present invention (embodiment mode 4)

FIG. 9 shows a modified example of a TFT of the embodiment mode 2. In FIG. 9, the same reference numerals as those of FIGS. 6A to 6C designate the same structural elements. As shown in FIG. 9, the thickness of a taper portion of a gate electrode 180 (wiring line) is nonlinearly changed. A channel formation region 181, n⁺-type first impurity regions 182 and 183, n⁻-type second impurity regions 184 and 185, and n⁻-type third impurity regions 186 and 187 are formed in a semiconductor layer through addition of phosphorus similar to the embodiment mode 1.

As shown in the sectional views of FIGS. 8 and 9, the thickness of a portion of the gate electrodes 170, 180 which are slightly shifted from a portion where its thickness is constant is made extremely thin, so that an impurity which becomes a donor or acceptor is made to easily pass through the gate electrodes 170, 180.

In order to form the taper portion as shown in the drawings at the gate electrodes 170, 180, a conductive film has only to be etched through combination of anisotropic etching and isotropic etching.

Incidentally, it is needless to say that the structure of the TFT disclosed in the embodiment modes 1 to 4 can be applied to all examples of the present invention described below.

EXAMPLES

Examples of the present invention will be described with reference to FIGS. 10 to 25.

Example 1

Example 1 is an example in which the present invention is applied to an active matrix type liquid crystal display device.

Figure 10:
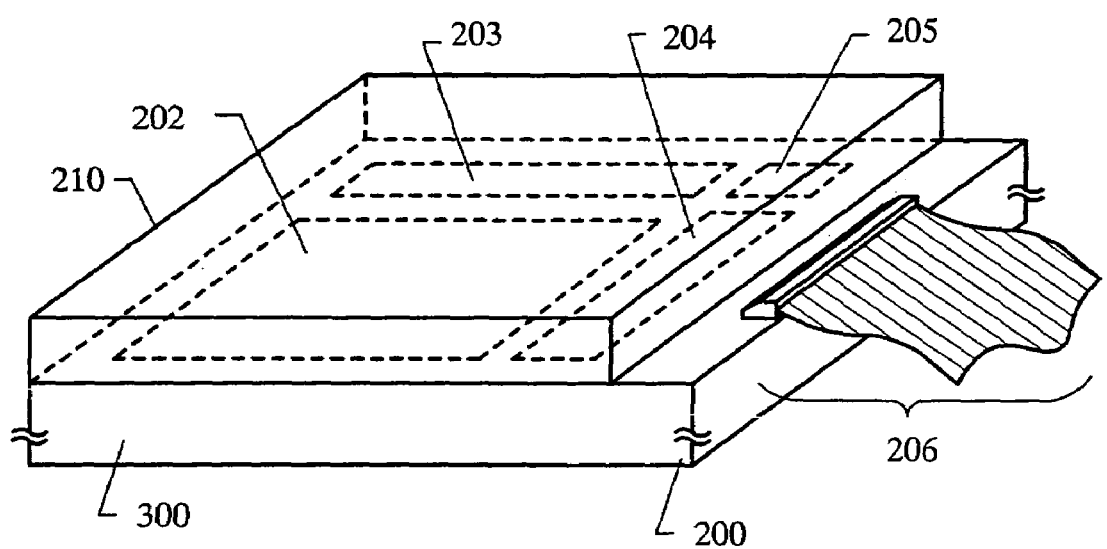
FIG. 10 is a view showing the outline of a liquid crystal display device of the present invention (example 1)

FIG. 10 is a schematic structural view of an active matrix type liquid crystal display panel of this example. The liquid crystal panel has such a structure that a liquid crystal is held between an active matrix substrate and an opposite substrate, and can display a picture on the panel by applying voltage corresponding to picture data to the liquid crystal through electrodes formed on the active matrix substrate and the opposite substrate.

In an active matrix substrate 200, a pixel portion 202 using TFTs as switching elements, and a gate driver circuit 203 and a source driver circuit 204 for driving the pixel portion 202 are formed on a glass substrate 300. The driver circuits 203 and 204 are respectively connected to the pixel portion 202 through a source wiring line and a drain wiring line.

Further, a signal processing circuit 205 for processing signals inputted to the driver circuits 203 and 204, and external terminals for inputting electric power and control signals to the driver circuits 202 and 203 and the signal processing circuit 205 are formed on the glass substrate 300, and an FPC 206 is connected to the external terminals.

In the opposite substrate 210, a transparent conductive film such as an ITO film is formed on the entire surface of a glass substrate. The transparent conductive film is an opposite electrode to a pixel electrode of the pixel portion 202, and the liquid crystal material is driven by an electric field formed between the pixel electrode and the opposite electrode. Further, if necessary, an orientation film and a color filter are formed on the opposite substrate 210.

Figure 11A:
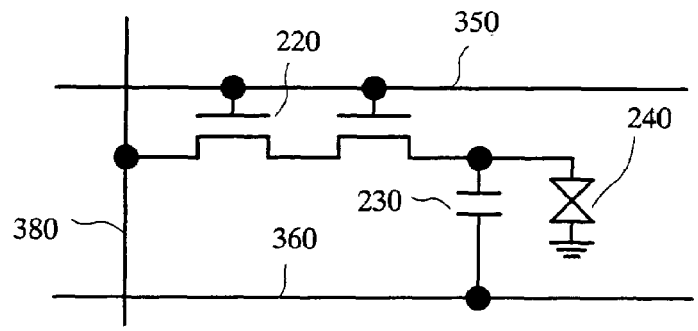
FIGS. 11A to 11C are top views showing a pixel portion and a CMOS circuit of the present invention (example 1)
Figure 11B:
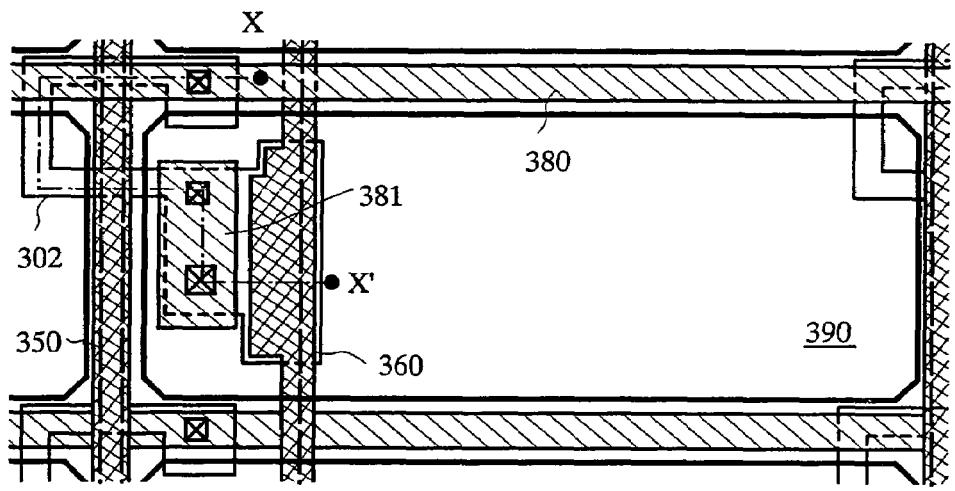
Figure 11C:
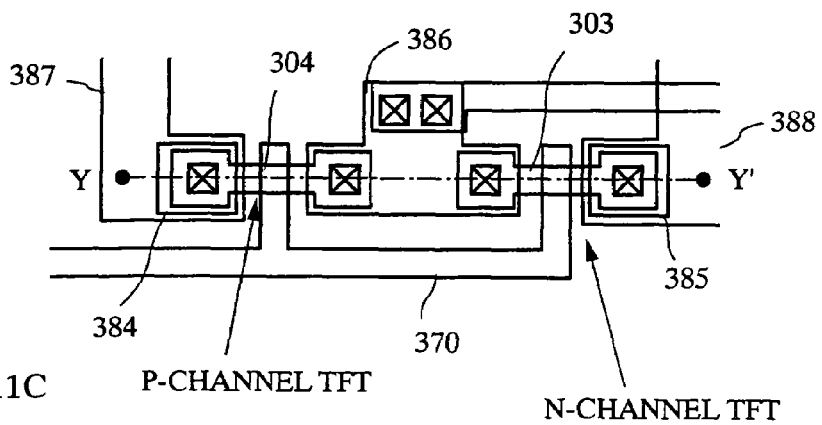

FIG. 11A shows an equivalent circuit of one pixel of the pixel portion, FIG. 11B is a top view of the pixel portion 202. FIG. 11C is a top view of a CMOS circuit constituting the driver circuits 202 and 203.

Figure 12A:
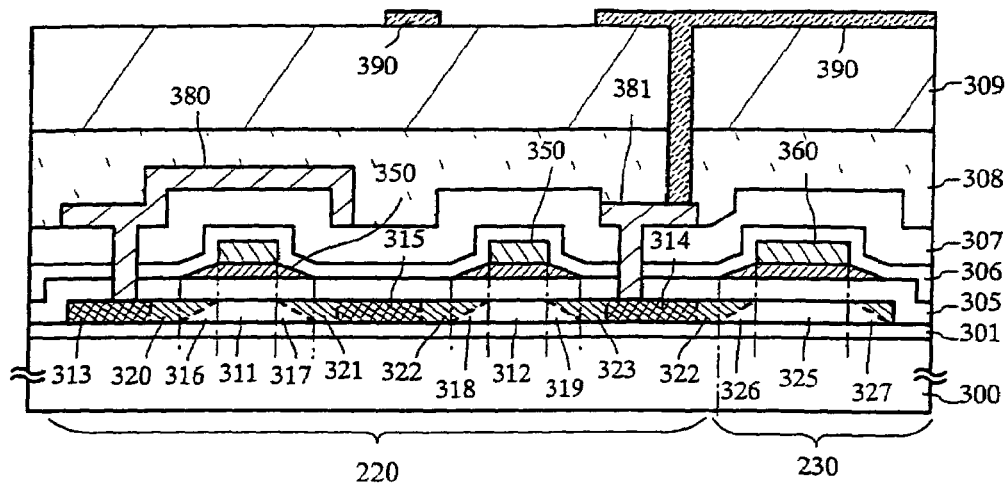
FIGS. 12A and 12B are sectional views of an active matrix substrate of the present invention (example 1)
Figure 12B:
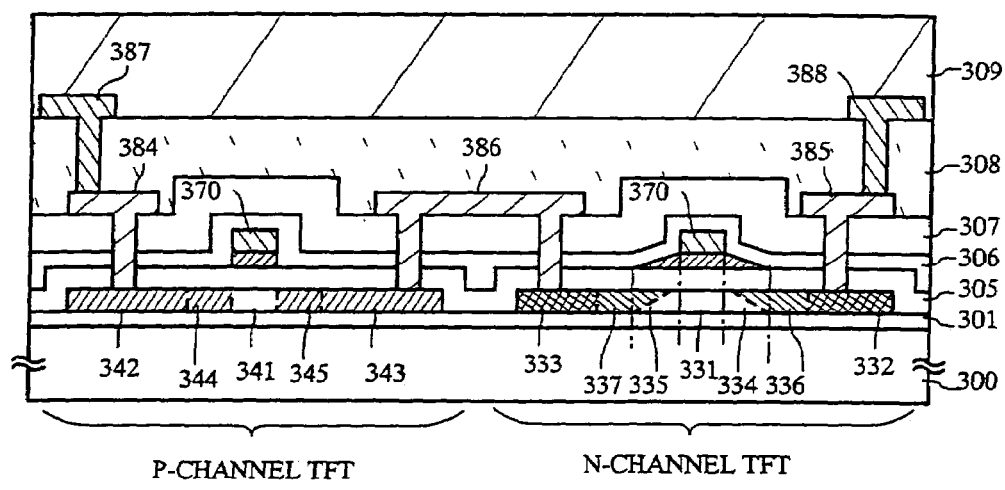

FIGS. 12A and 12B are sectional views of the active matrix substrate. FIG. 12A is a sectional view of the pixel portion 202, and corresponds to a section taken along chain line X-X' of FIG. 11B. FIG. 12B is a sectional view of the CMOS circuit, and corresponds to a section taken along chain line Y-Y' of FIG. 11C. As shown in FIGS. 12A and 12B, a pixel TFT and a thin film transistor of the CMOS circuit are simultaneously formed on the same glass substrate 300.

In the pixel portion 202, a gate wiring line 350 is formed for every row, and a source wiring line 380 is formed for every column. A pixel TFT 220 is formed in the vicinity of an intersecting portion of the gate wiring line 350 and the source wiring line 380. A source region of the pixel TFT 220 is connected with the source wiring line 380, and a drain region is connected with two capacitors of a liquid crystal cell 240 and a storage capacity 230.

The liquid crystal cell 240 is a capacitor having a pair of electrodes of a pixel electrode 390 and a transparent electrode of the opposite substrate 210 and a dielectric of the liquid crystal, and is electrically connected to the pixel TFT 220 through the pixel electrode 390. The storage capacity 230 is a capacitor having a pair of electrodes of a common wiring line 360 and a channel region formed in a semiconductor layer of the pixel TFT 220, and a dielectric of a gate insulating film.

Fabricating steps of the active matrix substrate of this example will be described with reference to FIG. 13A to FIG. 16E. FIGS. 13A to 13F and FIGS. 14A to 14E are sectional views showing fabricating steps of the pixel portion, and FIGS. 15A to 15F and FIGS. 16A to 16E are sectional views showing fabricating steps of the CMOS circuit.

A glass substrate 300 is prepared. In this example, a substrate of 1737 glass made by Corning Inc. is used. A silicon oxide film with a thickness of 200 nm is formed as an under film 301 on the surface of the glass substrate 300 by a plasma CVD method and using a TEOS gas as a raw material. The under film 301 is heated at 400° C. for 4 hours.

Figure 13A:
FIGS. 13A to 13F are sectional views showing fabricating steps of a pixel portion of the present invention (example 1)
Figure 15A:
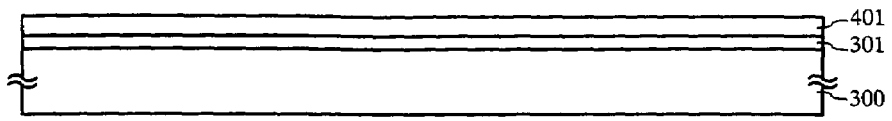
FIGS. 15A to 15F are sectional views showing fabricating steps of a CMOS circuit of the present invention (example 1)

An amorphous silicon film with a thickness of 500 nm is formed on the under film 301 by a PECVD method using $SiH_4$ diluted with $H_2$ gas. Next, the amorphous silicon film is heated at 450° C. for 1 hour so that a dehydrogenating process is carried out. The concentration of hydrogen atoms in the amorphous silicon film is made 5 atomic % or less, preferably 1 atomic % or less. The amorphous silicon film after the dehydrogenating process is irradiated with excimer laser light so that a crystalline (polycrystal) silicon film 401 is formed. The condition of the laser crystallization is such that an XeCl excimer laser is used as a laser light source, laser light is shaped into a linear beam by an optical system, a pulse frequency is made 30 Hz, an overlap ratio is made 96%, and a laser energy density is made 359 mJ/cm$^2$ (FIG. 13A, FIG. 15A).

As the method of forming the amorphous silicon film, other than the PECVD method, an LPCVD method or a sputtering method may be used. As the laser for crystallizing the amorphous silicon, other than a pulse oscillation type layer such as an excimer laser, a continuous-wave laser such as an Ar laser may be used. Besides, a lamp annealing step using a halogen lamp or mercury lamp, or a heat treatment step at 600° C. or more may be used instead of the laser crystallization.

Figure 13B:
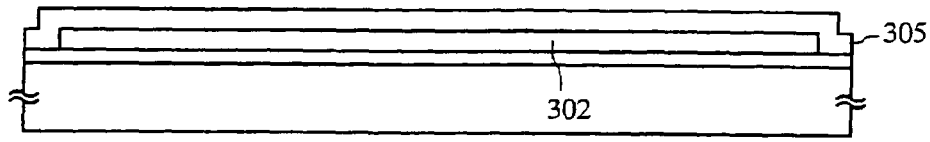
Figure 15B:
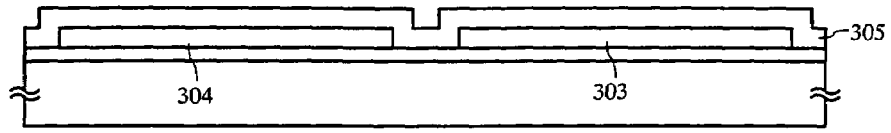

Next, a not-shown photoresist pattern is formed by using a photolithography step, and the crystalline silicon film 401 is patterned into island shapes by using this photoresist pattern, so that semiconductor layers 302, 303, and 304 are formed. A silicon nitride oxide film is formed as a gate insulating film 305 to cover the semiconductor layers 302, 303 and 304. The method of film formation is made the PECVD, and $SiH_4$ and $NO_2$ are used as a raw material gas. The thickness of the silicon nitride oxide film is made 120 nm (FIG. 13B, FIG. 15B).

Figure 13C:
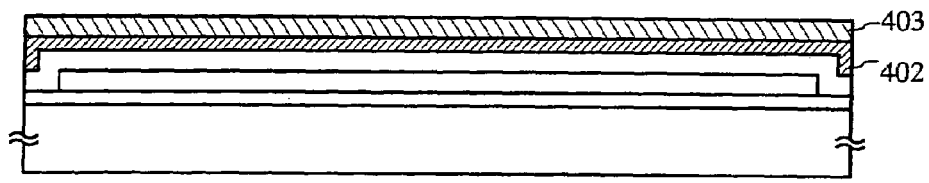
Figure 15C:
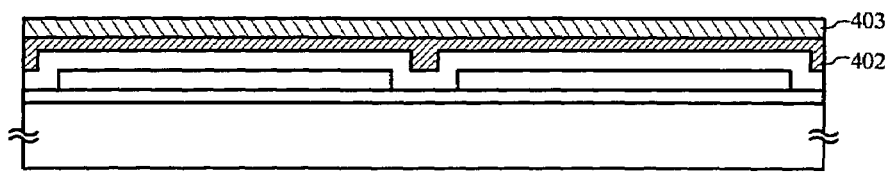

A laminate film of an n-type silicon film 402 containing phosphorus and a molybdenum-tungsten alloy (Mo—W) film 403 is formed on the gate insulating film 305 by a sputtering method. The thickness of the silicon film 402 is made 200 nm, and the thickness of the Mo—W film 403 is made 250 nm. In a target material for the Mo—W film 403, a composition ratio of Mo to W is made 1:1 (FIG. 13C, FIG. 15C).

Figure 13D:
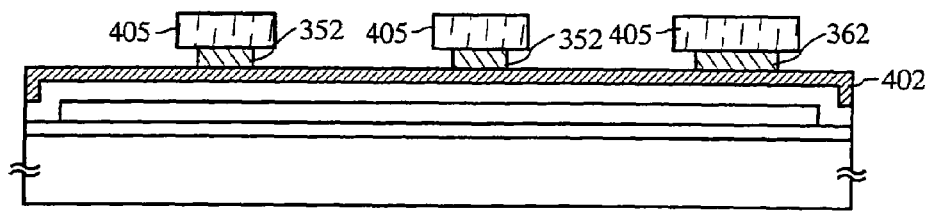
Figure 15D:
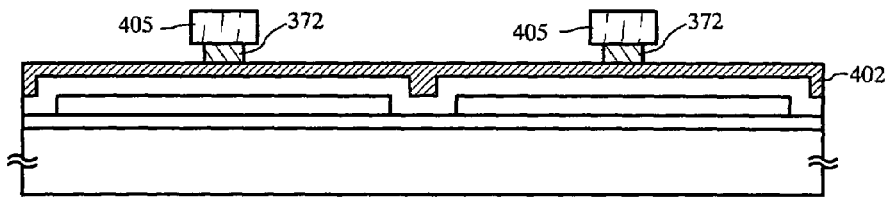

A resist mask 405 is formed on the Mo—W film 403. The Mo—W film 403 is etched by wet etching using the resist mask 405 to form a gate wiring line of the pixel TFT, a common wiring line, a second gate wiring line 352 as an upper wiring line of a gate wiring line of the CMOS circuit, a second common wiring line 362, and a second gate wiring line 372 (FIG. 13D, FIG. 15D).

Figure 13E:
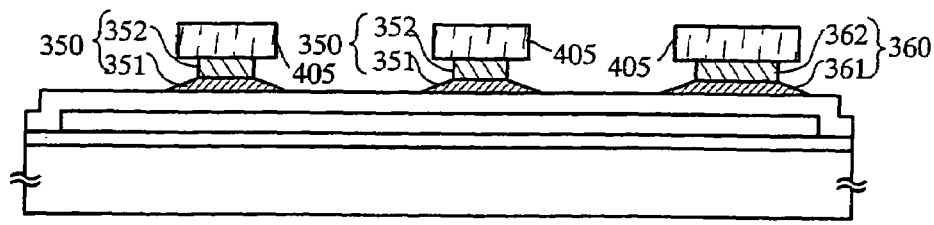
Figure 13F:
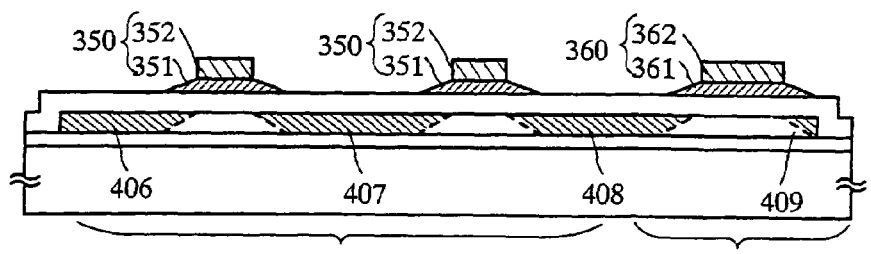
Figure 15E:
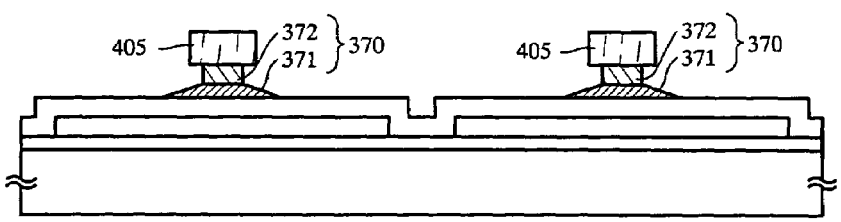
Figure 15F:
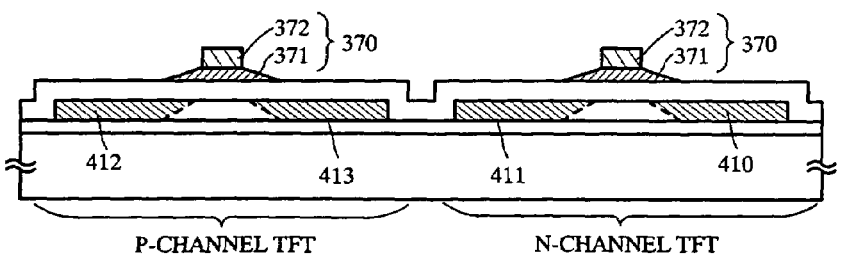

By using the resist mask 405 again, anisotropic etching using a chlorine-based gas is carried out to etch the n-type silicon film 402, so that a first gate wiring line 351, a second common wiring line 361, and a first gate wiring line 371 are formed. At this time, an angle (taper angle) between a side of each of the wiring lines 351, 361, and 371 and the gate insulating film 305 is made 20 degrees, and a taper portion is formed at a side portion (FIG. 13E, FIG. 15E).

After the resist mask 405 is removed, phosphorus is added into the semiconductor layers 302 to 304 by an ion doping method using the wiring lines 350, 360, and 370 as masks, so that n⁻-type regions 406 to 413 are formed in a self-aligning manner. In this adding step of phosphorus, since phosphorus is added through the taper portions of the first electrodes 351, 361, and 371 (portions outside the sides of the second electrodes 352, 362, and 372) and the gate insulating film 305, an acceleration voltage is set rather high and is made 90 keV.

Since the concentration of phosphorus in the n⁻-type impurity regions 406 to 413 determine the concentration of phosphorus in the n⁻-type low concentration impurity regions of the final TFTs, the dose amount is made low so that in the n⁻-type impurity regions 406 to 413, the concentration of phosphorus in the regions which do not intersect with the electrodes 350, 360, and 370 becomes $1 \times 10^{18}$ atom/cm³. Phosphine diluted with hydrogen is used as a doping gas.

Next, resist masks 415 covering the electrodes 350, 360, and 370 are formed. The length of the n⁻-type low concentration impurity regions which do not overlap with the first electrodes 351, 361, and 371 is determined by the length of the resist masks 415 extending outside from the sides of the first electrodes 351, 361, and 371 of the respective electrodes. Here, the resist mask is not formed on the semiconductor layer 304 of the CMOS circuit.

Phosphorus is added by an ion doping method using the resist masks 415. Also in this adding step, phosphine diluted with hydrogen is used as a doping gas. In order to enable phosphorus to pass through the gate insulating film 305, an acceleration voltage is set as high as 80 keV, and the dose amount is set so that the concentration of phosphorus in the n⁺-type impurity regions 313 to 315, 332, 333, 421, and 422 formed in this step becomes $5 \times 10^{20}$ atoms/cm³.

Figure 14A:
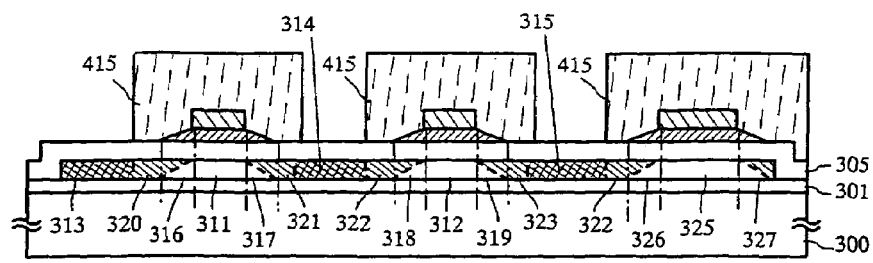
FIGS. 14A to 14E are sectional views showing fabricating steps of the pixel portion of the present invention (example 1)

In the pixel portion 202, phosphorus is selectively added into the n⁻-type impurity regions 406 to 409 of the semiconductor layer 302, so that the n⁺-type impurity regions 313 to 315 are formed. Regions of the n⁻-type impurity regions 406 to 409 where phosphorus was not added function as high resistance regions, and are defined as the n⁻-type impurity regions 316 to 319, 326, and 327 overlapping with the first gate electrode 351 and the first common electrode, and the n⁻-type impurity regions 320 to 323 not overlapping with the first gate electrode 351 and the first common electrode 361. Further, regions 311, 312, and 325 where phosphorus was not added in the two phosphorus adding steps are defined as channel formation regions (FIG. 14A).

The concentration of phosphorus in the n⁻-type impurity regions 316 to 319 is lower than the n⁻-type impurity regions 320 to 323, and the concentration of phosphorus decreases from the n⁻-type impurity regions 320 to 323 toward the channel formation regions 311 and 312.

In the CMOS circuit, phosphorus is selectively added also into the n⁻-type impurity regions 410 and 411 of the semiconductor layer 303 of the n-channel TFT, so that the n⁺-type impurity regions 332 and 333 are formed. On the other hand, in the n⁻-type impurity regions 410 and 411, regions where phosphorus was not added function as high resistance regions, and are defined as the n⁻-type impurity regions 334 and 335 which overlap with the first gate electrode 371, and the n⁻-type impurity regions 336 and 337 which do not overlap with the first gate electrode 371. The region 331 where phosphorus was not added in the two phosphorus adding steps is defined as the channel formation region.

The concentration of phosphorus in the n⁻-type impurity regions 334 and 335 is lower than the n⁻-type impurity regions 336 and 337, and the concentration of phosphorus decreases from the n⁻-type impurity regions 336 and 337 toward the channel formation region 331.

Figure 16A:
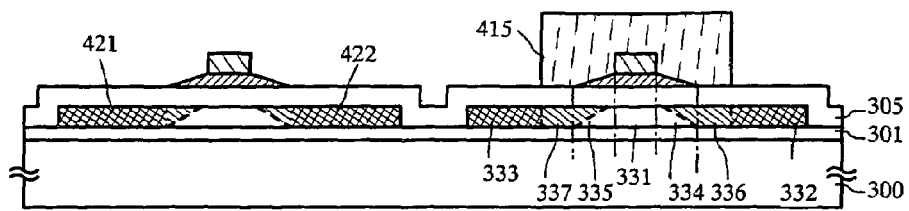
FIGS. 16A to 16E are sectional views showing fabricating steps of the CMOS circuit of the present invention (example 1)

In the semiconductor layer 304 of the p-channel TFT, phosphorus is hardly added into the portion on which the gate electrode 370 exist, and n⁺-type regions 421 and 422 are formed in the portion on which the gate electrode 370 does not exist. An n⁻-type impurity region remains in the under portion of the first gate electrode 371 (FIG. 16A).

Figure 14B:
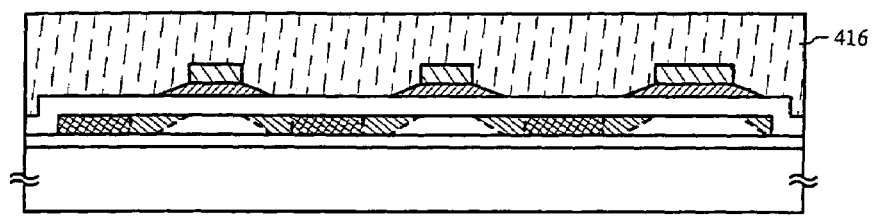
Figure 16B:
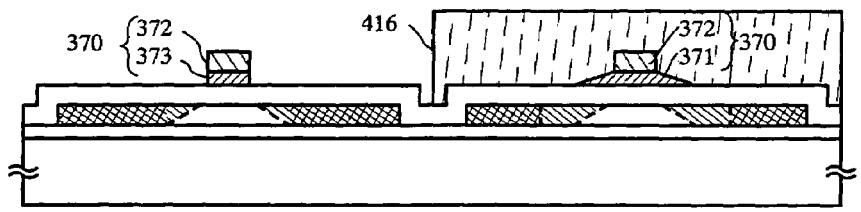

After the resist mask 415 is removed, a resist mask 416 covering the n-channel TFT is formed. The first gate electrode 371 at the side of the semiconductor layer 305 is made thin by etching using the second gate electrode 372 of the p-channel TFT as a mask, so that a third gate electrode 373 is formed (FIG. 14B, FIG. 16B).

A taper angle θ between a side of the third gate electrode 373 and the gate insulating film 305 becomes 75 degrees. The taper angle of the third electrode 373 is made from 60 degrees to 90 degrees, more preferably from 70 degrees to 85 degrees.

Figure 14C:
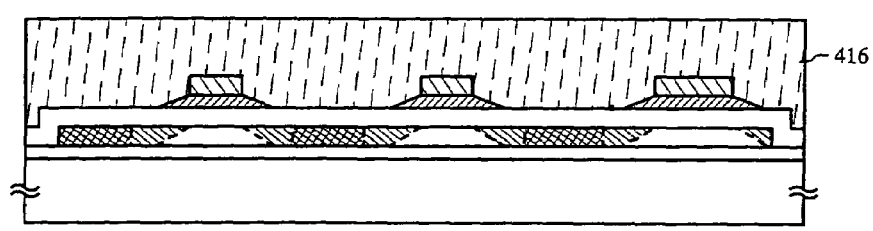
Figure 14D:
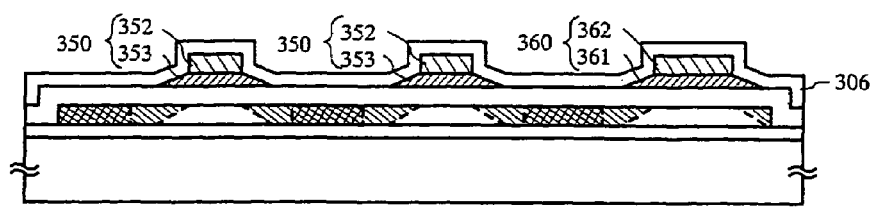
Figure 16C:
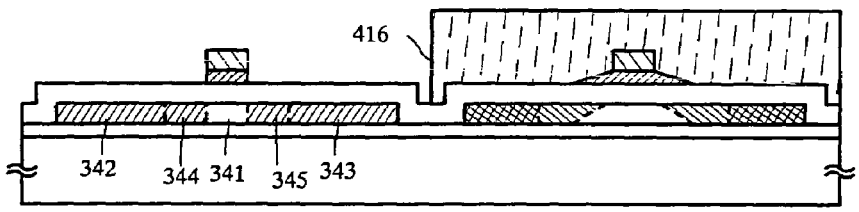
Figure 16D:
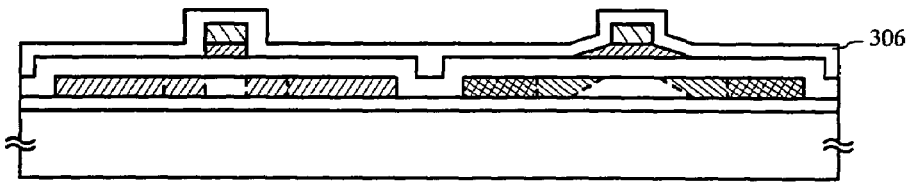

Boron is added into the semiconductor layer 304 by an ion doping method in the state where the resist mask 416 is made to remain. The gate electrodes 371 and 373 function as masks, and a channel formation region 341, p⁺-type impurity regions 342 and 343, and p⁺-type impurity regions 344 and 345 are formed in a self-aligning manner. Incidentally, the resist mask 416 may be removed and instead thereof, a new resist mask may be formed (FIG. 14C, FIG. 16C).

In the adding step of boron, an acceleration voltage is set at 80 keV, and the dose amount is set so that the concentration of boron in the p⁺-type impurity regions 342 to 345 becomes $3 \times 10^{21}$ atoms/cm³. Since diborane diluted with hydrogen is used as doping gas, although the concentration of boron in the p⁺-type impurity regions 344 and 345 is the same as the p⁺-type impurity regions 342 and 343, the concentration of phosphorus in the former is lower than that of the latter. The concentration distribution of the p⁺-type impurity regions 344 and 345 corresponds to the change in the film thickness of the taper portion of the first gate electrode 371, and decreases toward the channel formation region 341.

After the resist mask 416 is removed, phosphorus and boron added into the semiconductor layer are activated by heating at 500° C. Prior to the heat treatment, a protective film 306 made of silicon oxide with a thickness of 50 nm is formed so as to prevent oxidation of the gate wiring line 350, the common electrode 360, and the gate wiring line 370 (FIG. 14C, FIG. 16C).

Next, as an interlayer insulating film 307, a silicon nitride film with a thickness of 20 nm and a silicon oxide film with a thickness of 900 nm are formed and laminated by the PECVD method. Contact holes reaching the n⁺-type impurity regions 313 to 315, the n⁺-type impurity regions 332 and 333, the p⁺-type impurity regions 342 and 343, and the second gate wiring line 372 are formed in the interlayer insulating film 307, the protective film 306, and the gate insulating film 305.

Figure 14E:
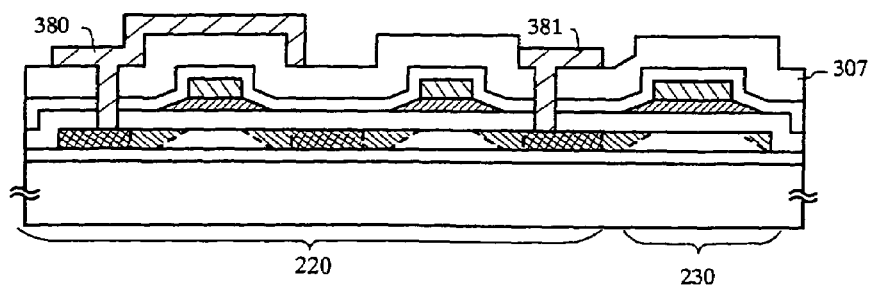
Figure 16E:
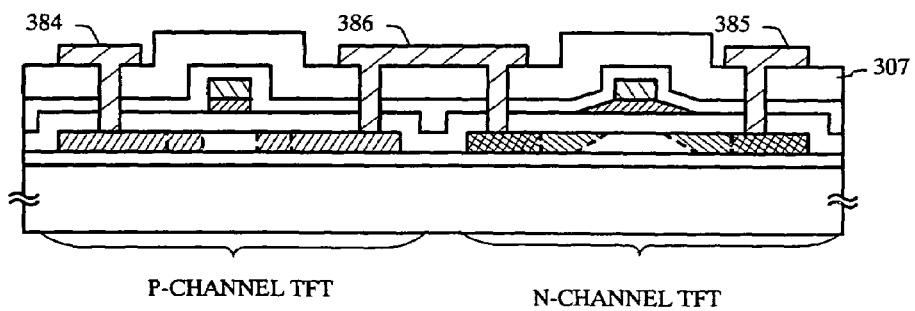

A laminate film of titanium (150 nm)/aluminum (500 nm)/titanium (100 nm) is formed on the interlayer insulating film 307 by a sputtering method, and is patterned to form a source wiring line 380, a drain electrode 381, source electrodes 384 and 385, and a drain electrode 386. From the above, the circuits 203 to 205 mainly constituted by the CMOS circuit, and the pixel portion 202 provided with the pixel TFT 220 and the storage capacity 230 are formed on the same glass substrate 300 (FIG. 14E, FIG. 16E).

In order to complete the active matrix substrate, a leveling film 308 is further formed on the entire surface of the substrate 300. Here, acryl is applied by a spin coating method, and is fired to form an acryl film with a thickness of 1 μm.

Contact holes for the source electrodes 384 and 385 of the CMOS circuit are bored in the leveling film 308. A titanium film with a thickness of 200 nm is formed by a sputtering method, and is patterned to form source wiring lines 387 and 388.

Next, in the same manner as the first leveling film 308, an acryl film with a thickness of 0.5 μm is formed as a second leveling film 309. A contact hole for the drain electrode 381 is formed in the flattened films 308 and 309. An ITO film is formed by a sputtering method, and is patterned to form a pixel electrode 390 connected to the drain electrode 381 (FIG. 12A, FIG. 12B).

In this example, although a low concentration impurity region functioning as a high resistance region is not formed for the p-channel TFT, since the p-channel TFT originally has high reliability even if a high resistance region is not provided, there is no problem. Rather, an on current can be gained in a case where a high resistance region is not formed, and balance with the characteristic of the n-channel TFT can be kept, which is convenient.

Example 2

This example is a modified example of Example 1, in which the sequence of adding steps of phosphorus and boron are changed and others are the same as Example 1. Fabricating steps of this example will be described with reference to FIGS. 17A to 17E. In FIGS. 17A to 17E, the same reference numerals as those of FIGS. 15A to 15F and 16A to 16E designate the same structural elements.

Although boron is added after phosphorus is added into the semiconductor layer in Example 1, boron is first added in this Example 2.

Although fabricating steps of a CMOS circuit will be described in this example, it is needless to say that this example can be applied to fabricating steps of an active matrix substrate in which a pixel portion and a driver circuit are integrated as in Example 1.

Figure 17A:
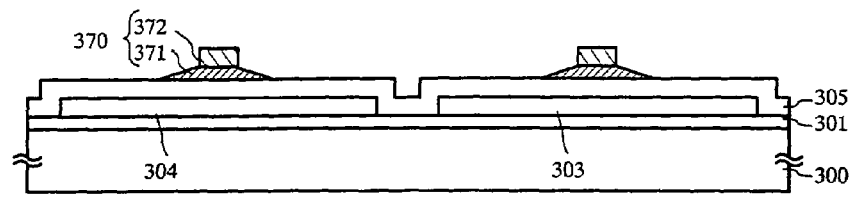
FIGS. 17A to 17E are sectional views showing fabricating steps of a CMOS circuit of the present invention (example 2)

The structure of FIG. 15E is obtained in accordance with the steps shown in Example 1. Next, a resist mask 405 is removed. FIG. 17A shows this state.

Next, a resist mask 451 covering an n-channel TFT is formed. Boron is added into a semiconductor layer 304 by an ion doping method using the resist mask 451. Gate electrodes 371 and 372 function as masks, and a channel formation region 501, $p^+$-type impurity regions 502 and 503 functioning as a source region and a drain region are formed in the semiconductor layer 304 in a self-aligning manner.

Figure 17B:
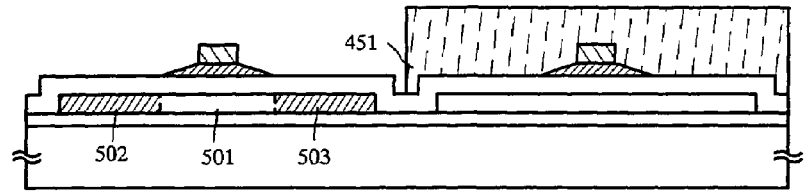

An acceleration voltage is made 80 keV, and the dose amount is set so that the concentration of boron in the $p^+$-type impurity regions 502 and 503 becomes $3\times10^{20}$ atoms/cm$^3$. Here, it is expected that the $p^+$-type impurity regions 502 and 503 slightly overlap with a lower portion because of rounding of boron at the time of doping and a small thickness of a side of the gate electrode 370 (FIG. 17B).

Figure 17C:
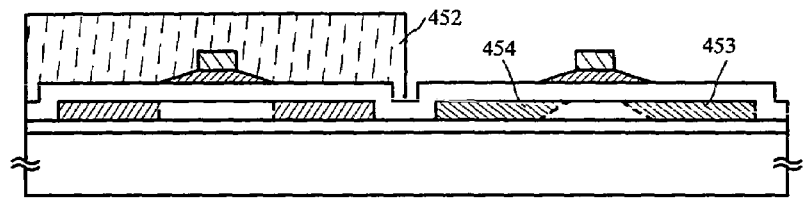

After the resist mask 451 is removed, a resist mask 452 covering the p-channel TFT is formed. Phosphorus is added into the semiconductor layer 303 by an ion doping method, so that $n^-$-type regions 453 and 454 are formed in a self-aligning manner. An acceleration voltage is made 90 keV, and the dose amount is set so that the concentration of phosphorus in the $n^-$-type impurity regions 453 and 454 becomes $1\times10^{18}$ atoms/cm$^3$. Phosphine diluted with hydrogen is used as a doping gas (FIG. 17C).

Next, the resist mask 452 is removed, and a resist mask 456 covering all the p-channel TFT and a part of the n-channel TFT is newly formed. In the n-channel TFT, the length of the mask 456 extending from the side of the first gate electrode 371 to the outside determines the length of an $n^-$-type impurity region which does not overlap with the first gate electrode 371.

Phosphorus is added by an ion doping method using the resist mask 456. Also in this adding step, phosphine diluted with hydrogen is used as a doping gas.

In the CMOS circuit, phosphorus is selectively added into the $n^-$-type impurity regions 453 and 454 of the semiconductor layer 303 of the n-channel TFT, so that $n^+$-type impurity regions 512 and 513 are formed. In this step, in order to make phosphorus pass through the gate insulating film 305, the acceleration voltage is made as high as 80 keV. The dose amount is set so that the concentration of phosphorus in the $n^+$-type impurity regions 512 and 513 becomes $5\times10^{20}$ atoms/cm$^3$.

Figure 17D:
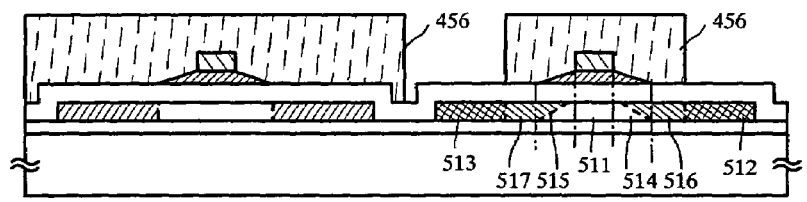

On the other hand, in the $n^-$-type impurity regions 453 and 454, regions where phosphorus was not added function as high resistance regions, and are defined as ne-type impurity regions 514 and 515 overlapping with the first gate electrode 371 and $n^-$-type impurity regions 516 and 517 not overlapping with the first gate electrode 371. A region 511 where phosphorus was not added in the two phosphorus adding steps is defined as a channel formation region (FIG. 17D).

Also in this example, the concentration of phosphorus in the $n^-$-type impurity regions 514 and 515 overlapping with the gate electrode 371 is lower than the $n^-$-type impurity regions 516 and 517 (and the $n^+$-type impurity regions 512 and 513), and the concentration of phosphorus becomes low toward the channel formation region 511.

Figure 17E:
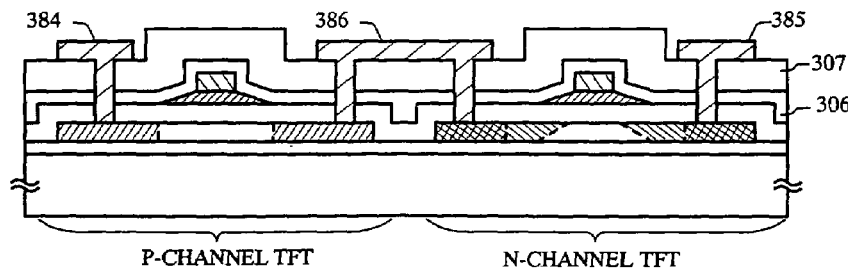

After the resist mask 456 is removed, a protective film 306 having a thickness of 50 nm and made of silicon oxide is formed, and phosphorus and boron added into the semiconductor layer are activated by a heat treatment. An interlayer insulating film 307 is formed, contact holes are bored, and source electrodes 384 and 385 and a drain electrode 386 are formed. From the above, the CMOS circuit is fabricated (FIG. 17E).

In this example, it is possible to omit the step of thinning the first gate electrode of the p-channel TFT. Incidentally, prior to the adding step of boron of FIG. 17B, it is also possible to add a step in which the first gate electrode 371 of the p-channel TFT is etched by using the second gate electrode 372 as a mask to form a third gate electrode 373.

Example 3

Also in this example, similarly to Example 2, fabricating steps in which the sequence of adding steps of phosphorus and boron is changed will be described. The fabricating steps of this example will be described with reference to FIGS. 18A to 18E. In FIGS. 18A to 18E, the same reference numerals as those of FIGS. 15A to 15F and 16A to 16E designate the same structural elements.

This example also corresponds to a modified example of Example 2. In Example 2, in the fabrication of the n-channel TFT, boron is added after phosphorus is added at a low concentration. However, this example is an example in which boron is first added at a high concentration.

Figure 18A:
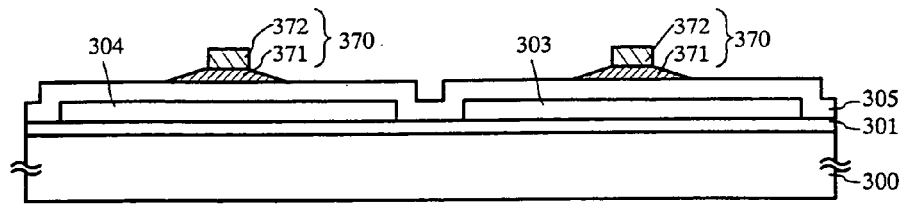
FIGS. 18A to 18E are sectional views showing fabricating steps of a CMOS circuit of the present invention (example 3)
Figure 18B:
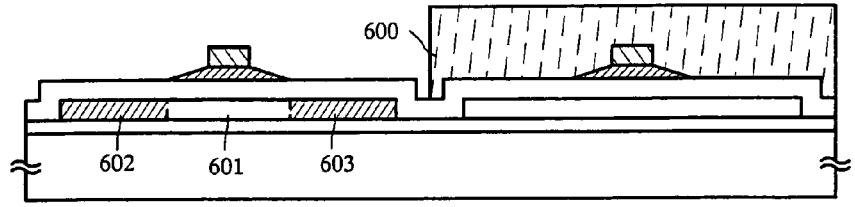

The structure of FIG. 15E is obtained in accordance with the steps shown in Example 1. Next, a resist mask 405 is removed. FIG. 18A shows this state.

Next, a resist mask 600 covering an n-channel TFT is formed. Boron is added into a semiconductor layer 304 by an ion doping method using the resist mask 600. Gate electrodes 371 and 372 function as masks, and a channel formation region 601 and $p^+$-type impurity regions 602 and 603 functioning as a source region and a drain region are formed in the semiconductor layer 304 in a self-aligning manner. The acceleration voltage of doping is made 80 keV, and the dose amount is set so that the concentration of boron of the p$^+$-type impurity regions 602 and 603 become 2×10$^{20}$ atoms/cm$^3$.

Figure 18C:
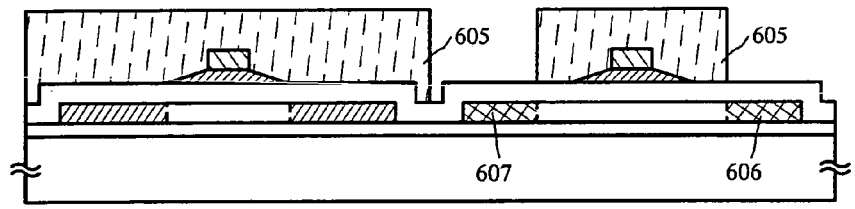

A resist mask 605 covering all the p-channel TFT and a part of the n-channel TFT is formed. Phosphorus is added by an ion doping method using the resist mask 605. Also in this adding step, phosphine diluted with hydrogen is used as a doping gas. Phosphorus is selectively added into the semiconductor layer 303 of the n-channel TFT, and n$^+$-type impurity regions 606 and 607 are formed. In this step, in order to make phosphorus pass through the gate insulating film 305, the acceleration voltage is made as high as 80 keV (FIG. 18C).

After the resist mask 605 is removed, a resist mask 608 covering the p-channel TFT is formed. Phosphorus is added into the semiconductor layer 303 by an ion doping method. The gate electrode 370 functions as a mask, so that a channel formation region 611, n$^-$-type impurity regions 614 and 615, and ne-type impurity regions 616 and 617 are formed in a self-aligning manner.

Figure 18D:
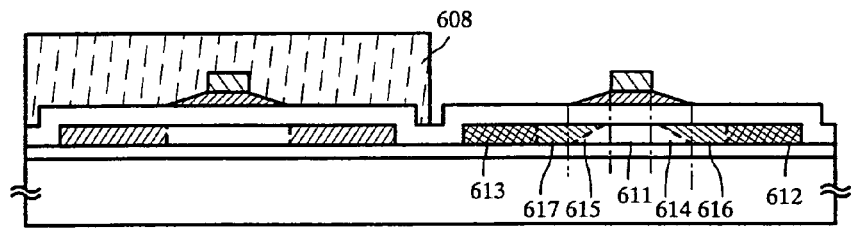

The n$^+$-type impurity regions 612 and 613 function as source/drain regions, and the resistance is reduced by making the concentration of phosphorus 5×10$^{20}$ atoms/cm$^3$. The concentration of phosphorus in the n$^-$-type impurity regions 614 to 617 is made lower than the n$^+$-type impurity regions 612 and 613 and the resistance is made high. The concentration of phosphorus in the n$^-$-type impurity regions 616 and 617 not overlapping with the first gate electrode 371 is made 1×10$^{18}$ atoms/cm$^3$ (FIG. 18D).

Figure 18E:
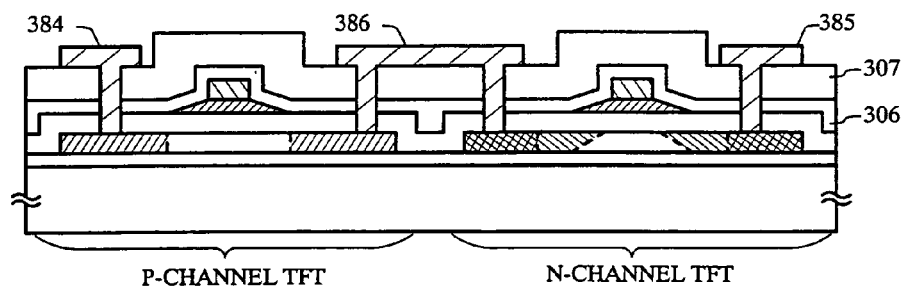

After the resist mask 608 is removed, a protective film 306 having a thickness of 50 nm and made of silicon oxide is formed, and phosphorus and boron added into the semiconductor layer are activated by a heat treatment. An interlayer insulating film 307 is formed, contact holes are bored, and source electrodes 384 and 385 and a drain electrode 386 are formed. From the above, the CMOS circuit is fabricated (FIG. 18E).

In this example, although the resist masks 605 and 606 covering the p-channel TFT are formed in the adding steps of phosphorus, the resist mask 605 and/or the resist mask 608 may be omitted. In this case, since phosphorus is added into the p$^+$-type impurity regions 602 and 603, it is necessary to add a lot of boron in view of the concentration of added phosphorus.

Example 4

This example is also a modified example of Example 1, in which the sequence of adding steps of phosphorus and boron is changed, and the main structure is the same as Example 1.

Fabricating steps of this example will be described with reference to FIGS. 19A to 19E. In FIGS. 19A to 19E, the same reference numerals as those of FIGS. 15A to 15F and 16A to 16E designate the same structural elements.

The structure of FIG. 15E is obtained in accordance with the steps shown in Example 1. Next, a resist mask 405 is removed. Then a resist mask covering at least a portion functioning as a gate electrode of an n-channel TFT is formed in a gate wiring line 370. A first gate electrode (wiring line) 371 is etched by using a second gate electrode (wiring line) 372 as an etching mask to form a third gate electrode.

Figure 19A:
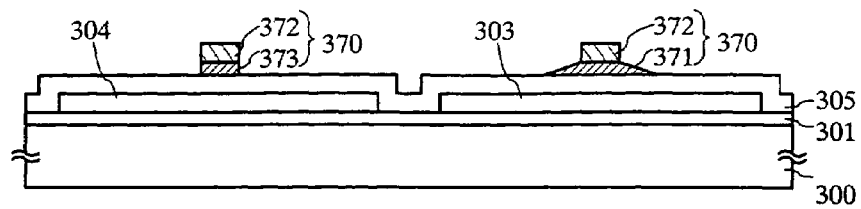
FIGS. 19A to 19E are sectional views showing fabricating steps of a CMOS circuit of the present invention (example 4)

That is, at least in the first gate wiring line 371, the width of a portion overlapping with the semiconductor layer 304 of the p-channel TFT is made thin, so that the third gate electrode 373 is formed (FIG. 19A).

Figure 19B:
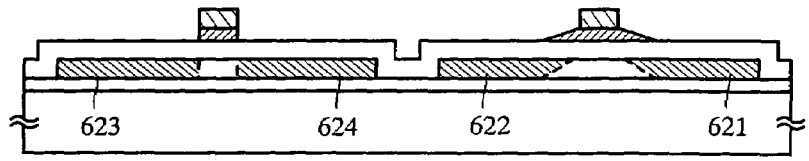

Phosphorus is added at a low concentration into the semiconductor layers 303 and 304 by an ion doping method. The first to third gate electrodes 371 to 373 function as masks, so that n$^-$-type regions 621 to 624 are formed in a self-aligning manner (FIG. 19B).

Figure 19C:
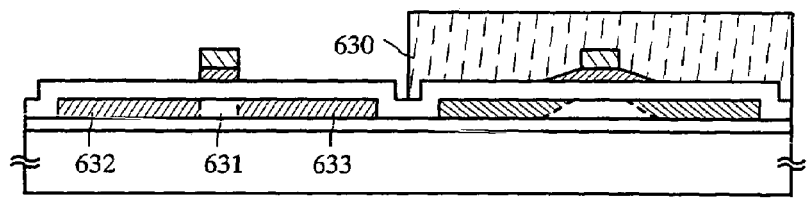

Next, a resist mask 630 covering the n-channel TFT is formed. Boron is added at a high concentration to the semiconductor layer 304 by an ion doping method using the resist mask 630. The first and third gate electrodes 371 and 373 function as masks, so that a channel formation region 631, and p$^+$-type impurity regions 632 and 633 functioning as a source region and a drain region are formed in the semiconductor layer 304 in a self-aligning manner (FIG. 19C).

Figure 19D:
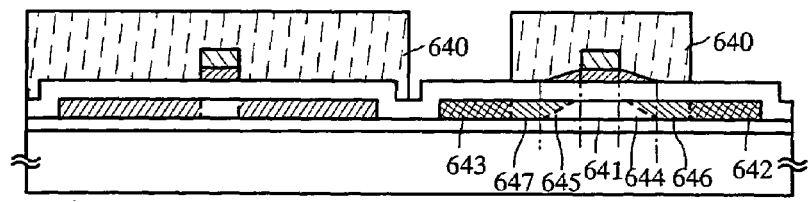

Next, the resist mask 630 is removed, and a resist mask 640 covering all the p-channel TFT and a part of the n-channel TFT is newly formed. Phosphorus is added at a high concentration by an ion doping method using the resist mask 640. Phosphorus is selectively added into the n$^-$-type impurity regions 621 and 622 of the semiconductor layer 303 of the n-channel TFT, so that n$^+$-type impurity regions 642 and 643 are formed. Further, regions covered with the resist mask 640 are defined as a channel formation region 641, n$^-$type impurity regions 644 and 645 overlapping with the first gate electrode 371, and n$^-$type impurity regions 646 and 647 not overlapping with the first gate electrode 371 (FIG. 19D).

Also in this example, the concentration of phosphorus in the n$^-$-type impurity regions 644 and 645 overlapping with the gate electrode 371 is lower than the n$^-$-type impurity regions 646 and 647 (and the n$^+$-type impurity regions 642 and 643), and the concentration of phosphorus becomes low toward the channel formation region 641.

Figure 19E:
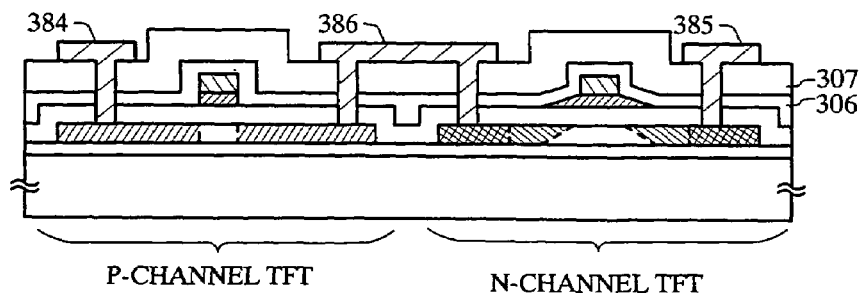

After the resist mask 640 is removed, a protective film 306 having a thickness of 50 nm and made of silicon oxide is formed, and phosphorus and boron added into the semiconductor layer are activated by a heat treatment. An interlayer insulating film 307 is formed, contact holes are bored, and source electrodes 384 and 385 and a drain electrode 386 are formed. From the above, the CMOS circuit is fabricated (FIG. 19E).

In this example, although the width of the first gate electrode of the p-channel TFT is made thin, this step may be omitted.

In this example, although the resist masks 630 and 640 covering the p-channel TFT are formed in the adding steps of phosphorus, the resist mask 630 and/or the resist mask 640 may be omitted. In this case, since phosphorus is added into the p$^+$-type impurity regions 632 and 633, it is necessary to add a lot of boron in view of the concentration of added phosphorus.

Example 5

This example is a modified example of Example 1, in which the sequence of adding steps of phosphorus and boron is changed. Its main structure is the same as Example 1.

Fabricating steps of this example will be described with reference to FIGS. 20A to 20E. In FIGS. 20A to 20E, the same reference numerals as those of FIGS. 15A to 15F and FIGS. 16A to 16E designate the same structural elements.

Figure 20A:
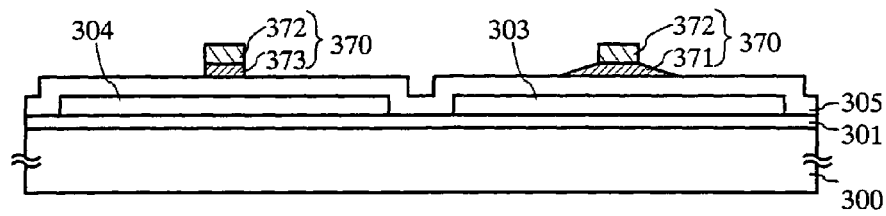
FIGS. 20A to 20E are sectional views showing fabricating steps of a CMOS circuit of the present invention (example 5)

Besides, this example corresponds to a modified example of Example 4, and similarly to Example 4, a first gate electrode of a p-channel TFT is made thin so that a third gate electrode 373 is formed (FIG. 20A).

Figure 20B:
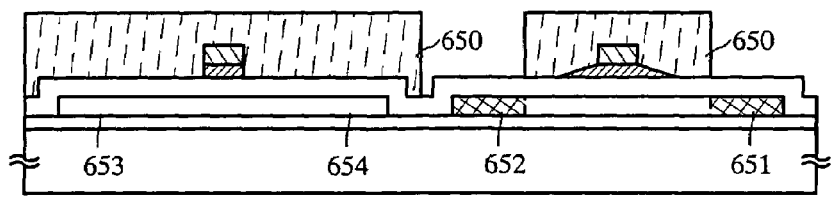

Next, a resist mask 650 covering all the p-channel TFT and a part of an n-channel TFT is formed. Phosphorus is added at a high concentration by an ion doping method using the resist mask 650, so that n-type regions 651 and 652 are formed (FIG. 20B).

Figure 20C:
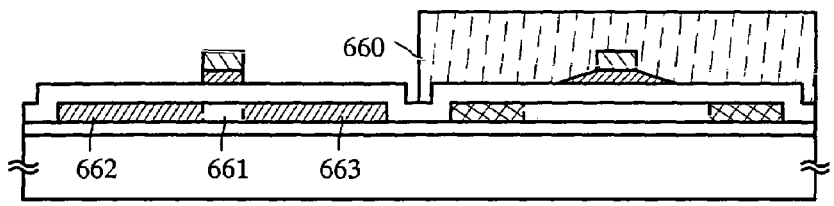

Next, a resist mask 660 covering the n-channel TFT is formed. Boron is added at a high concentration into the semiconductor layer 304 by an ion doping method using the resist mask 660. The first and third gate electrodes 371 and 373 function as masks, so that a channel formation region 661, and p$^+$-type impurity regions 662 and 663 functioning as a source region and a drain region are formed in the semiconductor layer 304 in a self-aligning manner (FIG. 20C).

Next, the resist mask 660 is removed, and a resist mask 670 covering all the p-channel TFT is newly formed. Phosphorus is added at a low concentration by an ion doping method. The acceleration voltage is set as high as 90 keV so that phosphorus passes through a taper portion of the first gate electrode 371.

Figure 20D:
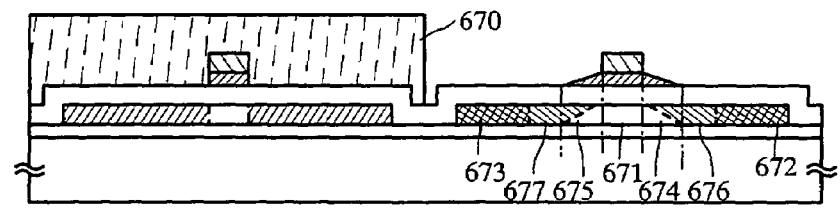

As a result, a channel formation region 671, n$^+$-type impurity regions 672 and 673, n$^-$-type impurity regions 674 and 675 overlapping with the first gate electrode 371, n$^-$-type impurity regions 676 and 677 not overlapping with the first gate electrode 371 are formed in the semiconductor layer 303 of the n-channel TFT in a self-aligning manner (FIG. 20D).

Figure 20E:
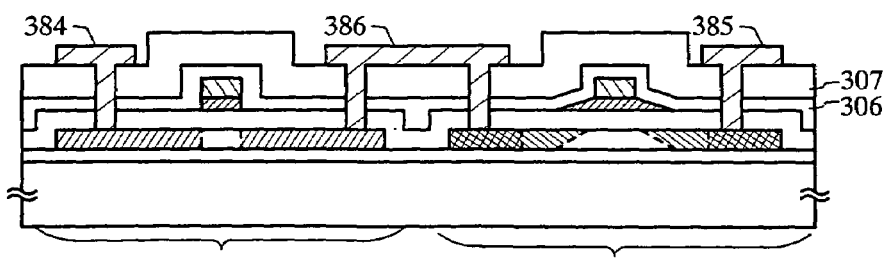

After the resist mask 670 is removed, a protective film 306 having a thickness of 50 nm and made of silicon oxide is formed, and phosphorus and boron added into the semiconductor layer are activated by a heat treatment. An interlayer insulating film 307 is formed, contact holes are bored, and source electrodes 384 and 385 and a drain electrode 386 are formed. From the above, the CMOS circuit is fabricated (FIG. 20E).

In this example, although the width of the first gate electrode of the p-channel TFT is made thin, this step may be omitted.

In this example, although the resist masks 650 and 670 covering the p-channel TFT are formed in the adding steps of phosphorus, the resist mask 650 and/or the resist mask 670 may be omitted. In this case, since phosphorus is added into the p$^+$-type impurity regions 662 and 663, it is necessary to add a lot of boron in view of the concentration of added phosphorus.

Example 6

This example is a modified example of Example 1, in which the sequence of adding steps of phosphorus and boron is changed, and another structure is almost similar to Example 1.

Fabricating steps of this example will be described with reference to FIGS. 21A to 21E. In FIGS. 21A to 21E, the same reference numerals as those of FIGS. 15A to 15F and FIGS. 16A to 16E designate the same structural elements.

Besides, this example corresponds to a modified example of Example 5, and similarly to Example 5, a first gate electrode of a p-channel TFT is made thin, so that a third gate electrode 373 is formed (FIG. 21A).

Further, similarly to Example 5, a resist mask 680 covering all the p-channel TFT and a part of an n-channel TFT is formed. Phosphorus is added at a high concentration by an ion doping method using the resist mask 680, so that n-type regions 681 and 682 are formed (FIG. 21B).

Next, the resist mask 680 is removed and a resist mask 690 covering all the p-channel TFT is newly formed. Phosphorus is added at a low concentration by an ion doping method. The acceleration voltage is set as high as 90 keV so that phosphorus passes through a taper portion of the first gate electrode 371.

As a result, a channel formation region 691, n$^+$-type impurity regions 692 and 693, n$^-$-type impurity regions 694 and 675 overlapping with the first gate electrode 371, and n$^-$-type impurity regions 696 and 697 not overlapping with the first gate electrode 371 are formed in a self-aligning manner (FIG. 21C).

Next, after a resist mask 700 covering all the n-channel TFT is formed, boron is added at a high concentration into the semiconductor layer 304 by an ion doping method. The first and third gate electrode 371 and 373 function as masks, so that a channel formation region 701, and p$^+$-type impurity regions 702 and 703 functioning as a source region and a drain region are formed in the semiconductor layer 304 in a self-aligning manner (FIG. 21D).

After the resist mask 700 is removed, a protective film 306 having a thickness of 50 nm and made of silicon oxide is formed, and phosphorus and boron added into the semiconductor layer are activated by a heating treatment. An interlayer insulating film 307 is formed, contact holes are bored, and source electrodes 384 and 385 and a drain electrode 386 are formed. From the above, the CMOS circuit is fabricated (FIG. 21E).

In this example, although the width of the first gate electrode of the p-channel TFT is made thin, this step may be omitted.

In this example, although the resist masks 680 and 690 covering the p-channel TFT are formed in the adding steps of phosphorus, the resist mask 680 and/or the resist mask 690 may be omitted. In this case, since phosphorus is added into the p$^+$-type impurity regions 702 and 703, it is necessary to add a lot of boron in view of the concentration of added phosphorus.

As described above, although the fabricating steps of the CMOS circuit have been described in Examples 2 to 6, it is needless to say that the examples can be applied to fabricating steps of an active matrix substrate in which a pixel portion and a driver circuit are integrated as in Example 1.

Example 7

In this example, an example of a gate electrode having a taper portion shown in Example 1 etc. and a method of forming the gate electrode will be described.

First, a gate insulating film made of a silicon nitride oxide film is formed, and a metal laminate film is formed thereon by a sputtering method. In this example, a tungsten target with a purity of 6 N or more was used. As a sputtering gas, a single gas of argon (Ar), krypton (Kr), xenon (Xe), etc. or a mixed gas of those may be used. The condition of film formation such as a sputtering power, pressure of a gas, and temperature of a substrate may be suitably controlled by an operator. The metal laminate film has a tungsten nitride film indicated by WNx (0<x<1) as a lower layer and has a tungsten film as an upper layer.

The thus obtained metal laminate film hardly contains impurity elements, and especially an oxygen content can be made 30 ppm or less, and electric resistivity can be made 20 μΩ·cm or less, typically 6 to 15 μΩ·cm. The stress of the film can be made $-5 \times 10^9$ to $5 \times 10^9$ dyn/cm$^2$.

The silicon nitride oxide film is an insulating film expressed by SiOxNy, and indicates an insulating film containing silicon, oxygen, and nitrogen at a predetermined ratio.

Next, a resist mask pattern (film thickness: 1.5 μm) for obtaining a desired gate wiring line pattern is formed.

Next, in Example 7, an ICP (Inductively Coupled Plasma) etching apparatus using a high density plasma is used to carry out etching for the patterning of the metal laminate film, so that a gate electrode having a taper-shaped section and a gate electrode are formed.

Here, the plasma generating mechanism of the ICP dry etching apparatus will be described in detail with reference to FIG. 22.

Figure 22:
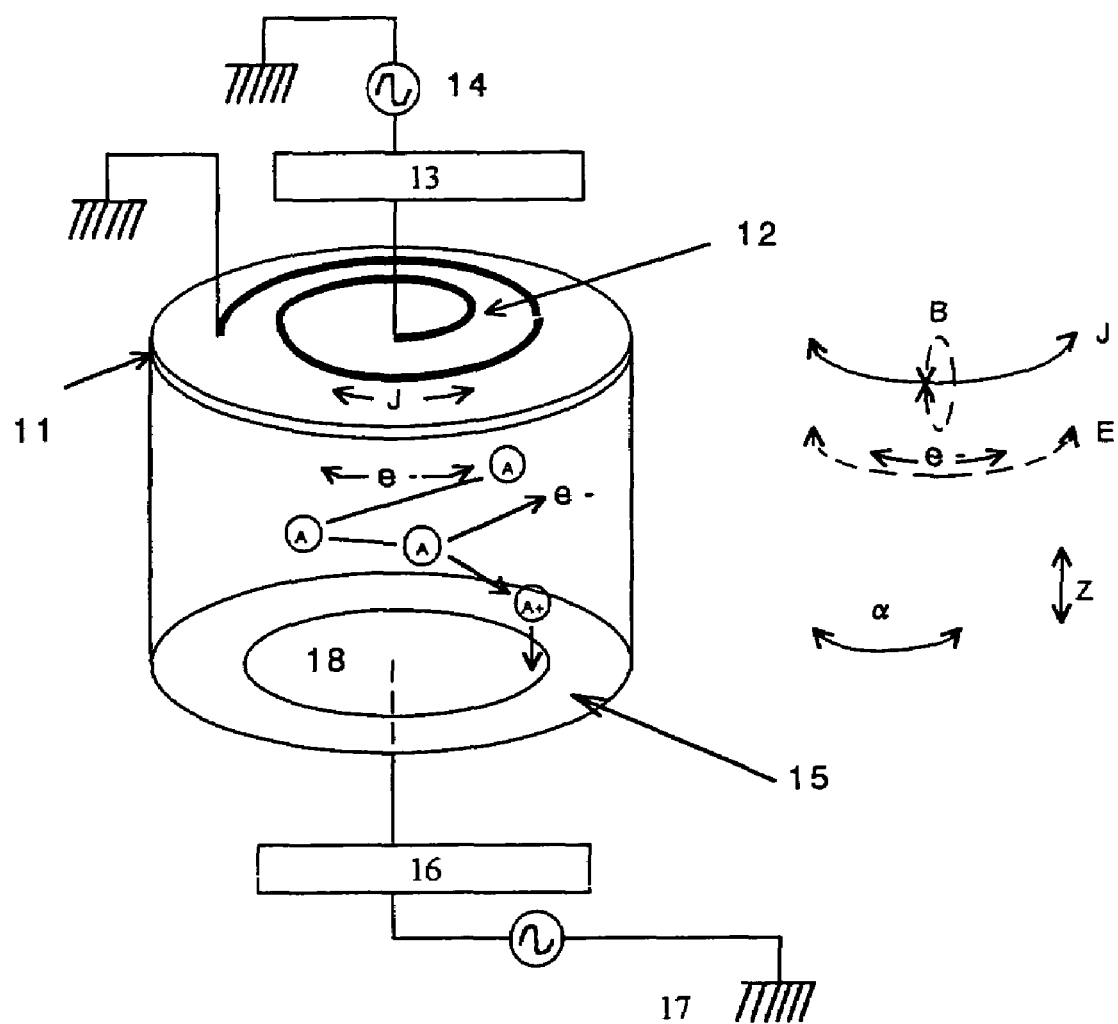
FIG. 22 is a view showing a plasma generating mechanism of an ICP etching apparatus (example 7)

FIG. 22 is a simplified structural view of an etching chamber. An antenna coil 12 is disposed on a quartz plate 11 at the upper portion of the chamber, and is connected to an RF power source 14 through a matching box 13. An oppositely disposed lower electrode 15 at a substrate side is also connected to an RF power source 17 through a matching box 16.

When an RF current is applied to the antenna coil 12 above the substrate, the RF current J flows through the antenna coil 12 in an a direction, and a magnetic field B is generated in a Z direction. The relation between the current J and the magnetic field B complies with the following equation.

$\mu_0 J = \mathrm{rot}\, B$ ($\mu_0$ is magnetic susceptibility)

In accordance with Faraday's law of electromagnetic induction expressed by the following equation, an induced electric field E is generated in the $\alpha$ direction.

$-\partial B/\partial t = \mathrm{rot}\, E$

An electron is accelerated by this induced electric field E in the $\alpha$ direction and collides with a gas molecule, so that a plasma is generated. Since the direction of the induced electric field is the $\alpha$ direction, the probability that a charged particle collides with an etching chamber wall or the substrate and loses its electric charge becomes low. Thus, even if the pressure is as low as about 1 Pa, the plasma can be generated at a high density. Since the magnetic field B hardly exists in a downstream portion, a high density plasma region extending in a sheet shape is obtained.

By adjusting the RF power applied to each of the antenna coil 12 (ICP power is applied) and the lower electrode 15 (bias power is applied) at the substrate side, it is possible to independently control the plasma density and self-bias voltage. It is also possible to apply RF powers of different frequencies according to a film to be etched.

Figure 23:
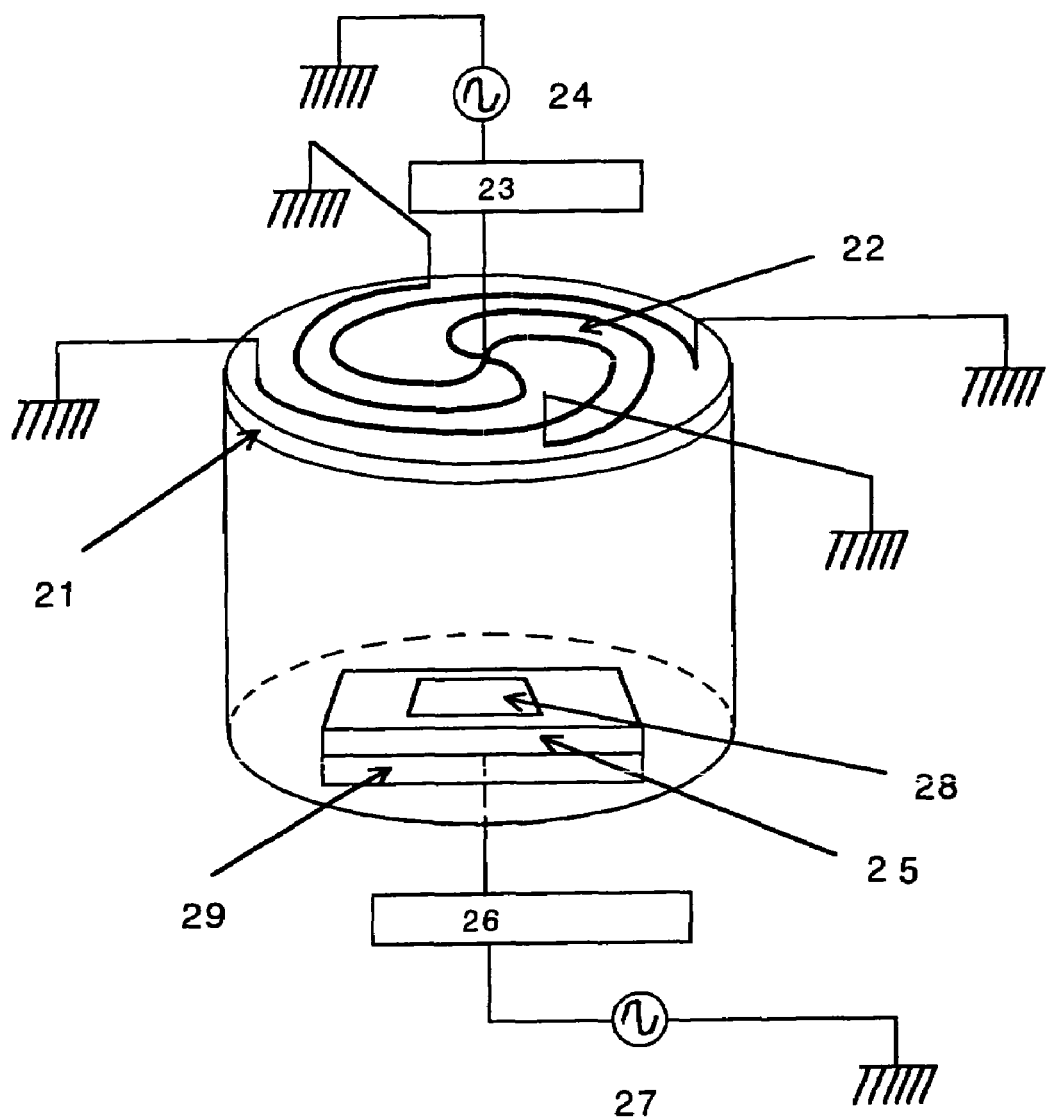
FIG. 23 is a conceptual view of an ICP etching apparatus of a multi-spiral coil system (example 7)

In order to obtain a high density plasma by the ICP etching apparatus, it is necessary to cause the RF current J flowing through the antenna coil 12 to flow at a low loss, and in order to increase an area, the inductance of the antenna coil 12 must be reduced. For that purpose, as shown in FIG. 23, an ICP etching apparatus of a multi-spiral coil 22 in which an antenna is divided has been developed. In FIG. 23, reference numeral 21 designates a quartz plate, 23 and 26 designate matching boxes, and 24 and 27 designate RF power sources. A lower electrode 25 for holding a substrate 28 is provided at the bottom of a chamber through an insulator 29.

In this example, among various ICP etching apparatuses, by using especially an ICP etching apparatus of multi-spiral coil system, a wiring line having a desired taper angle $\theta$ was formed.

Figure 24:
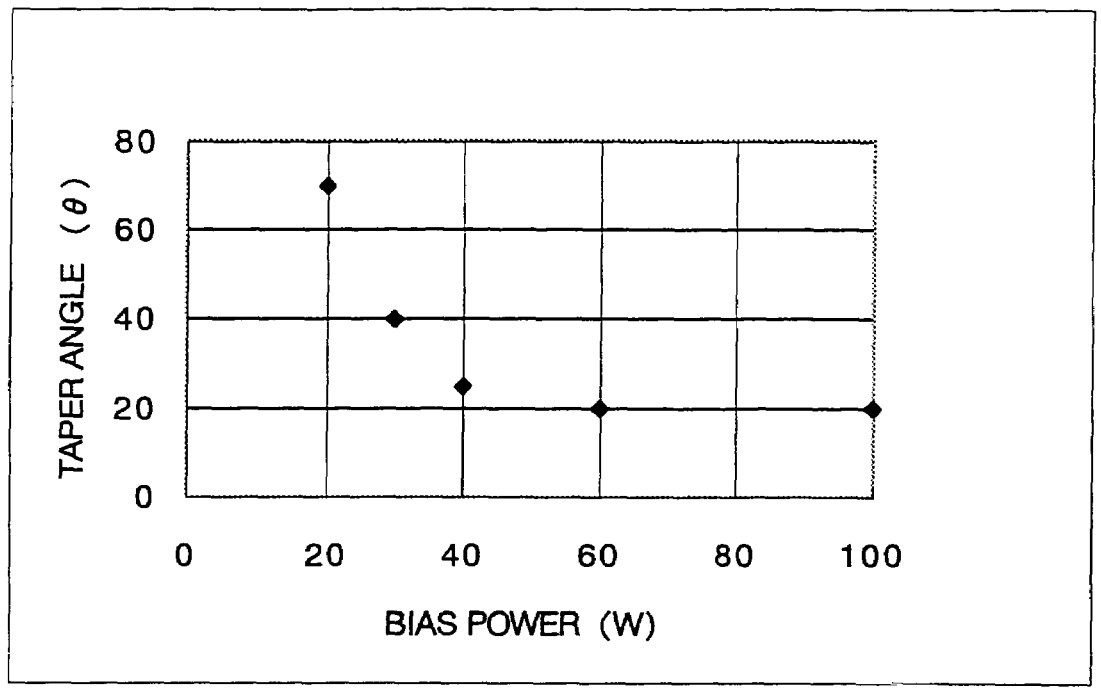
FIG. 24 is a characteristic view of bias power versus taper angle θ (example 7)

For the purpose of obtaining a desired taper angle $\theta$, in this example, the bias power density of the ICP etching apparatus is adjusted. FIG. 24 is a view showing the dependency of the taper angle $\theta$ upon the bias power. As shown in FIG. 24, the taper angle $\theta$ can be controlled in accordance with the bias power density.

Figure 25:
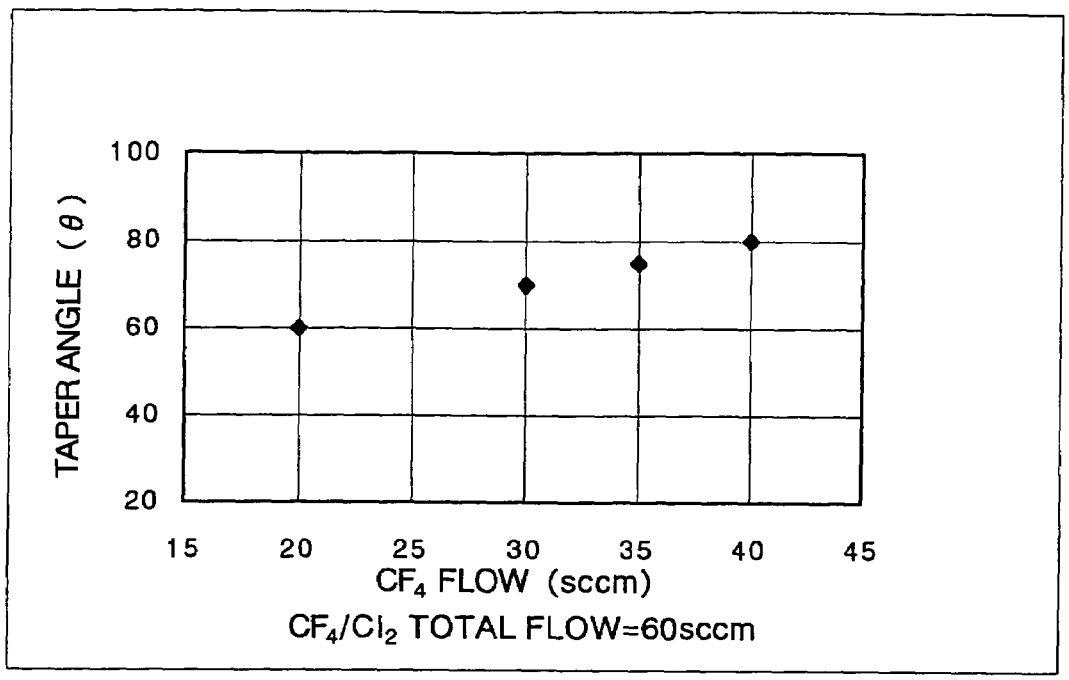
FIG. 25 is a characteristic view of $CF_4$ flow rate versus taper angle θ (example 7)

The flow ratio of $CF_4$ of an etching gas (mixed gas of $CF_4$ and $Cl_2$) may be adjusted. FIG. 25 is a view showing the dependency of the taper angle $\theta$ upon the $CF_4$ flow ratio. If the flow ratio of $CF_4$ is made large, the selection ratio of tungsten to resist becomes large, and the taper angle $\theta$ of a wiring line can be made large.

Figure 26:
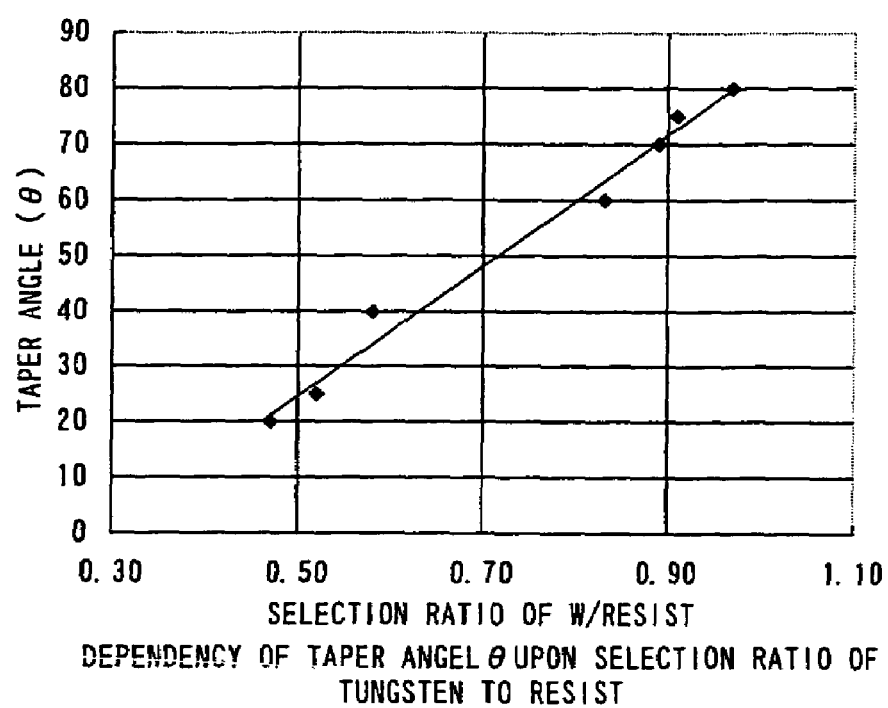
FIG. 26 is a characteristic view of (W/resist) selection ratio versus taper angle θ (example 7)

It is considered that the taper angle $\theta$ depends on the selection ratio of tungsten to resist. FIG. 26 shows the dependency of the taper angle $\theta$ upon the selection ratio of tungsten to resist.

Like this, by using the ICP etching apparatus and by suitably determining the bias power density or reaction gas flow ratio, it is possible to extremely easily obtain a gate electrode and wiring line having a desired taper angle $\theta=3$ to $60°$ (preferably 5 to 45°, more preferably 7 to 20°).

Here, although a W film is shown as an example, when the ICP etching apparatus is used for a generally known heat-resistant conductive material (Ta, Ti, Mo, Cr, Nb, Si, etc.), the end of a pattern can be easily processed as a taper shape.

Besides, although a mixed gas of $CF_4$ (carbon tetra fluoride gas) and $Cl_2$ is employed as an etching gas used for the above dry etching, the gas is not particularly limited, and for example, it is also possible to use a mixed gas of a reaction gas containing fluorine selected from $C_2F_6$ and $C_4F_8$ and a gas containing chlorine selected from $Cl_2$, $SiCl_4$, and $BCl_3$.

When subsequent steps in accordance with Example 1 are carried out, a semiconductor device is completed.

Incidentally, the structure of this example can be applied to the fabricating steps of the electrode having the taper portion of Examples disclosed in the present specification.

Example 8

In Example 1, although a polycrystalline silicon film crystallized by an excimer laser is used as a semiconductor layer, another crystallizing method will be described in this example.

A crystallizing process of this example is a crystallizing technique disclosed in Japanese Patent Application Laid-open No. Hei. 7-130652. The crystallizing process will be described with reference to FIGS. 27A and 27B.

Figure 27A:
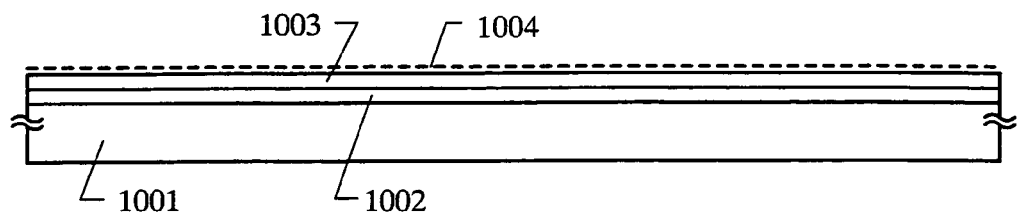
FIGS. 27A and 27B are views showing fabricating steps of a crystalline silicon film of the present invention (example 8)

First, a silicon oxide film 1002 as an under film is formed on a glass substrate 1001. An amorphous silicon film 1003 is formed on the silicon oxide film 1002. In this example, the silicon oxide film 1002 and the amorphous silicon film 1003 are subsequently formed by a sputtering method. Next, a nickel acetate salt solution containing nickel of 10 ppm in terms of weight is applied to form a nickel containing layer 1004 (FIG. 27A).

Instead of nickel (Ni), a kind of or plural kinds of elements selected from the group consisting of germanium (Ge), iron (Fe), palladium (Pd), tin (Sn), lead (Pb), cobalt (Co), platinum (Pt), copper (Cu), gold (Au), and silicon (Si) may be used.

Figure 27B:
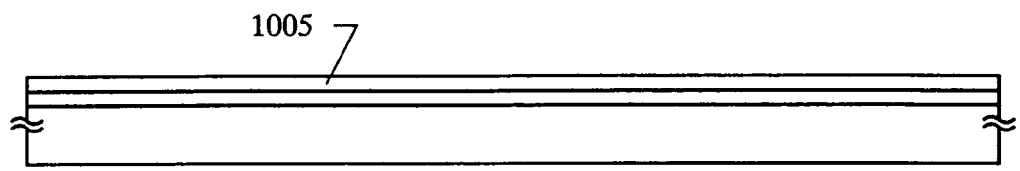

Next, after a dehydrogenating step at 600° C. for 1 hour is carried out, a heat treatment at 450 to 1100° C. for 4 to 12 hours (in this example, 500° C. for 4 hours) is carried out, so that a polysilicon film 1005 is formed. It is known that the thus obtained crystalline silicon film 1005 has extremely superior crystallinity (FIG. 27B).

Incidentally, the crystallizing process of this example can be applied to the forming process of the semiconductor layer disclosed in the present specification.

Example 9

This example relates to a crystallizing process different from Example 8, and an example of a case where crystallization is made by using a technique disclosed in Japanese Patent Application Laid-open No. Hei. 8-78329 will be described. The technique disclosed in Japanese Patent Application Laid-open No. Hei. 8-78329 is such that selective crystallization of a semiconductor film is made possible by selectively adding a catalytic element. The case where the same technique is applied to the present invention will be described with reference to FIGS. 28A and 28B.

First, a silicon oxide film 1012 is formed on a glass substrate 1011, and an amorphous silicon film 1013 and a silicon oxide film 1014 are subsequently formed thereon. At this time, the thickness of the silicon oxide film 1014 is made 150 nm.

Figure 28A:
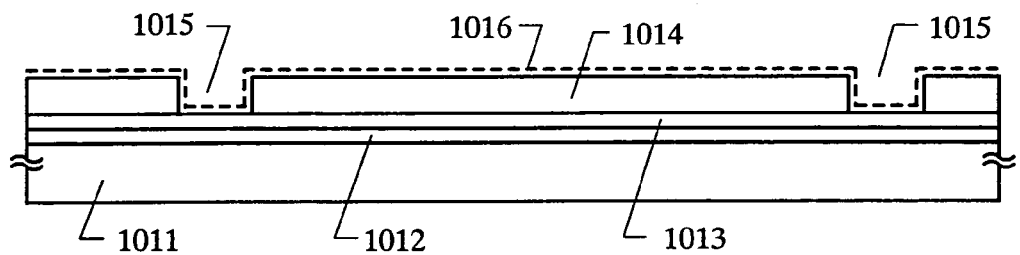
FIGS. 28A and 28B are views showing fabricating steps of a crystalline silicon film of the present invention (example 9)
Figure 28B:
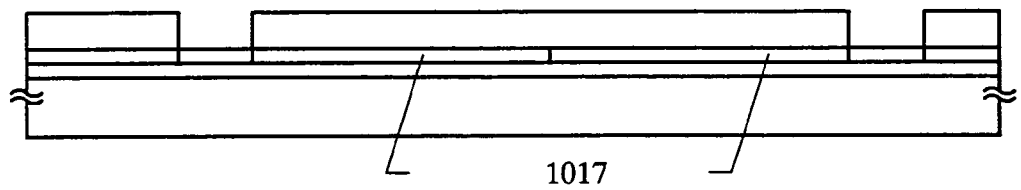

Next, the silicon oxide film 1014 is patterned to selectively form opening portions 1015. Thereafter, a nickel acetate salt solution containing nickel of 100 ppm in terms of weight is applied. A formed nickel containing layer 1016 comes to have such a state that it is in contact with the amorphous silicon film 1013 at only the bottoms of the opening portions 1015 (FIG. 28A).

Next, a heat treatment at 500 to 650° C. for 4 to 24 hours (in this example, 550° C. for 14 hours) is carried out, so that crystallization of the amorphous silicon film is carried out. In this crystallizing process, a portion with which nickel is in contact is first crystallized, and crystal growth progresses in the direction almost parallel to the substrate. It is crystallographically ascertained that the crystallization progresses in the <111> axis direction.

The thus formed polysilicon film 1017 is made of a collective of rod-like or needle-like crystals, and each rod-like crystal macroscopically grows with certain directionality. Thus, there is an advantage that crystallinity is uniform.

Also in the technique disclosed in the above publication, instead of nickel (Ni), a kind of or plural kinds of elements selected from the group consisting of germanium (Ge), iron (Fe), palladium (Pd), tin (Sn), lead (Pb), cobalt (Co), platinum (Pt), copper (Cu), gold (Au), and silicon (Si) may be used.

A semiconductor film containing crystals (including a polysilicon film and a polysilicon germanium film) is formed by using the technique as described above, and patterning is carried out to form a semiconductor layer made of the semiconductor film containing crystals. Subsequent steps may comply with Example 1. Of course, a combination with Examples 2 to 7 is also possible.

In the case where a TFT is fabricated by using a semiconductor film containing crystals, which was crystallized by using the technique of this example, although high field effect mobility (mobility) can be obtained, high reliability has been required because of that. However, when the TFT structure of the present invention is adopted, it becomes possible to fabricate a TFT which utilizes the technique of this example to the utmost.

Example 10

In this example, there is described an example in which a step of removing nickel used for crystallization of a semiconductor shown in Examples 8 and 9 is carried out by using phosphorus after crystallization. As a method for that, this example uses a technique disclosed in Japanese Patent Application Laid-open No. Hei. 10-135468 or No. Hei. 10-135469.

The technique disclosed in the publications is such that a catalytic element used for crystallization of an amorphous semiconductor film is removed after crystallization by using a gettering function of phosphorus. By using the technique, it is possible to reduce the concentration of a catalytic element in a crystalline semiconductor film to $1 \times 10^{17}$ atoms/cm$^3$ or less, preferably $1 \times 10^{16}$ atms/cm$^3$.

Figure 29A:
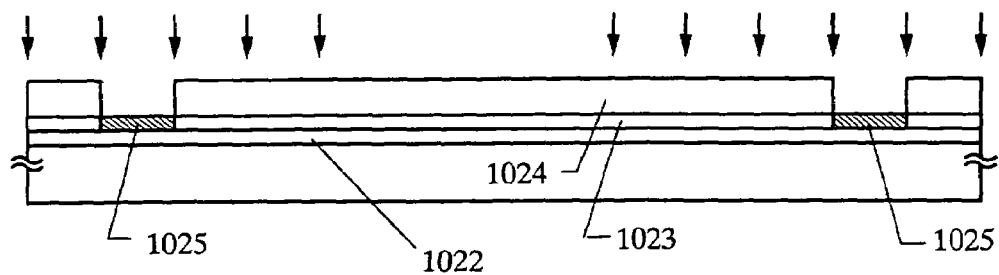
FIGS. 29A and 29B are views showing fabricating steps of a crystalline silicon film of the present invention (example 10)
Figure 29B:
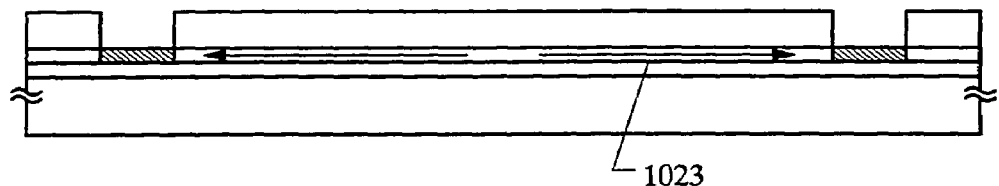

The structure of this example will be described with reference to FIGS. 29A and 29B. Here, an alkali-free glass substrate typified by a 1737 substrate made by Corning Inc. is used. FIG. 29A shows a state where an under film 1022 and a crystalline silicon film 1023 are formed by using the crystallizing technique described in Example 2. A silicon oxide film 1024 having a thickness of 150 nm and used for a mask is formed on the crystalline silicon film 1023. An opening portion is provided by patterning, and a region where the crystalline silicon film is exposed is provided. A step of adding phosphorus is carried out, so that a region 1025 where phosphorus was added into the crystalline silicon film is provided.

In this state, when a heat treatment at 550 to 1020° C. for 5 to 24 hours, for example, at 600° C. for 12 hours is carried out in a nitrogen atmosphere, the region 1025 where phosphorus was added into the crystalline silicon film functions as a gettering site, so that the catalytic element remaining in the crystalline silicon film 1023 can be segregated in the region 1025 where phosphorus was added.

By carrying out etching to remove the silicon oxide film 1024 used for the mask and the region 1025 where phosphorus was added, it is possible to obtain a crystalline silicon film in which the concentration of the catalytic element used in the step of crystallization is reduced to $1 \times 10^{17}$ atoms/cm$^3$ or less. This crystalline silicon film can be directly used as the semiconductor layer of the TFT of the present invention described in Example 1.

Example 11

This Example 11 is an example in which Examples 8 or 9 is combined with a technique disclosed in Japanese Patent Application Laid-open No. Hei. 10-135468 or No. Hei. 10-135469.

The technique disclosed in the publication is such that nickel used for crystallization of a semiconductor described in Examples 3 or 4 is removed by using a gettering function of a halogen element (typically chlorine) after crystallization. By using the technique, it is possible to reduce the concentration of nickel in a semiconductor layer to $1 \times 10^{17}$ atoms/cm$^3$ or less (preferably $1 \times 10^{16}$ atoms/cm$^3$ or less).

Figure 30A:
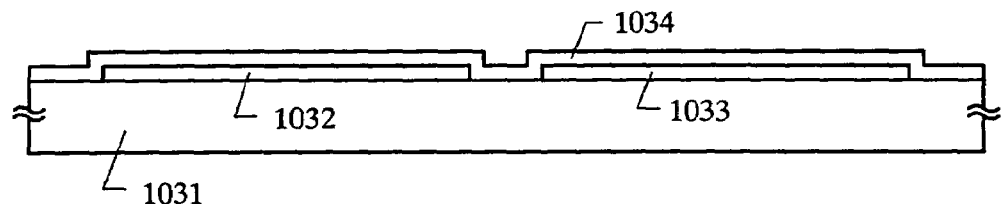
FIGS. 30A and 30B are views showing fabricating steps of a crystalline silicon film of the present invention (example 11)
Figure 30B:
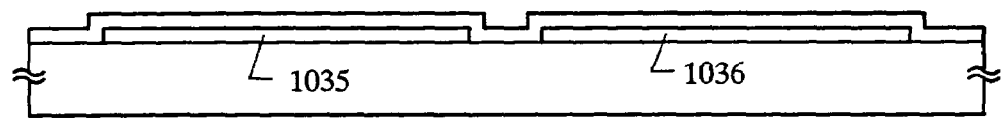

The structure of this example will be described with reference to FIGS. 30A and 30B. First, a quartz substrate 1031 having high heat resistance is used as a substrate. Of course, a silicon substrate or a ceramic substrate may be used. In the case where the quartz substrate is used, even if a silicon oxide film is not particularly provided as an under film, pollution from the substrate side does not occur.

Next, a polysilicon film (not shown) is formed by using the crystallizing method of Example 3 or 4, and patterning is carried out to form semiconductor layers 1032 and 1033. Further, a gate insulating film 1034 which covers those semiconductor layers and is made of a silicon oxide film is formed (FIG. 30A).

After the gate insulating film 1034 is formed, a heat treatment is carried out in an atmosphere containing a halogen element. In this example, a processing atmosphere is made an oxidizing atmosphere in which oxygen and hydrogen chloride are mixed, a processing temperature is made 950° C., and a processing time is made 30 minutes. It is sufficient if the processing temperature is selected between 700 to 1150° C. (typically 900 to 1000° C.), and the processing time is selected between 10 minutes to 8 hours (typically 30 minutes to 2 hours) (FIG. 30B).

At this time, nickel becomes volatile nickel chloride and goes out into the processing atmosphere, so that the concentration of nickel in the polysilicon film is reduced. Thus, the concentration of nickel contained in semiconductor layers 1035 and 1036 shown in FIG. 30B is reduced to $1 \times 10^{17}$ atoms/cm$^3$ or less.

The semiconductor layer is formed by using this example of the technique as described above, and the subsequent steps may comply with Example 1 or 2. It is known that especially the combination of this example and the crystallizing method of Example 4 can realize a crystalline silicon film with extremely high crystallinity.

(Findings as to Crystal Structure of a Semiconductor Layer)

A semiconductor layer formed in accordance with the above fabricating steps has microscopically a crystal structure in which a plurality of needle-like or rod-like crystals (hereinafter abbreviated to "rod-like crystal") are collected and arranged. This can be easily ascertained by observation with a TEM (Transmission Electron Microscope).

It is ascertained by using electron beam diffraction and X-ray diffraction that the surface (portion where a channel is formed) of the semiconductor layer has a main orientation plane of {110} plane although some deviation is included in crystal axes. As the result of the applicant's detailed observation for an electron beam diffraction photograph with a spot diameter of about 1.5 μm, it was ascertained that although diffraction spots corresponding to the {110} plane clearly appear, the respective spots have a distribution on concentric circles.

The present applicant observed crystal grain boundaries formed from contact of the respective rod-like crystals by using an HR-TEM (High Resolution Transmission Electron Microscope), and it was ascertained that crystal lattices have continuity at the crystal grain boundaries. This means that the observed lattice stripes are continuously connected at the crystal grain boundaries, which can be easily ascertained.

The continuity of the crystal lattice at the crystal grain boundary is caused from the fact that the crystal grain boundary is a grain boundary called "planar boundary". The definition of the planar boundary in the present specification is "Planar boundary" disclosed in "Characterization of High-Efficiency Cast-Si Solar Cell Wafers by MBIC Measurement; Ryuichi Shimokawa and Yutaka Hayashi, Japanese Journal of Applied Physics vol. 27, No. 5, pp. 751-758, 1988".

According to the above paper, the planar boundary includes a twin boundary, a specific laminate defect, a specific twist boundary, and the like. This planar boundary has a feature that it is electrically inactive. That is, since the planar boundary does not function as a trap to block the movement of a carrier though it is a crystal grain boundary, it can be regarded as not substantially existing.

Particularly in the case where a crystal axis (axis vertical to a crystal plane) is a <110> axis, a {211} twin boundary is also called a coincidence boundary of Σ3. The Σ value is a parameter which becomes an index showing the degree of conformity of the coincidence boundary, and it is known that as the value becomes small, the conformity of the grain boundary becomes excellent.

As the result of the applicant's detailed observation for a polysilicon film obtained by carrying out the present invention with the TEM, it was found that almost all (90% or more, typically 95% or more) crystal grain boundaries are coincidence boundaries of Σ3, that is, {211} twin boundaries.

In the crystal grain boundary formed between two crystal grains, and in the case where both crystals have a plane orientation of {110}, when an angle formed by lattice stripes corresponding to a {111} plane is θ, it is known that when θ=70.5°, the boundary becomes a coincidence boundary of Σ3.

In the polysilicon film of this example, the respective lattice stripes of crystal grains adjacent at the crystal grain boundary are continuous at just about 70.5°, and from this, it is concluded that this crystal grain boundary is the {211} twin boundary.

Although a boundary becomes a coincidence boundary of Σ9 when θ=38.9°, such other crystal grain boundaries also existed.

Such a coincidence boundary is formed only between crystal grain boundaries of the same plane orientation. That is, since the polysilicon film obtained by carrying out this example has substantially the uniform plane orientation of {110}, such a coincidence boundary can be formed over a wide range.

Such a crystal structure (correctly, structure of a crystal grain boundary) shows that two different crystal grains are connected to each other with extremely superior conformity at the crystal grain boundary. That is, such a structure is formed that crystal lattices are continuously connected at the crystal grain boundary and it is very hard to form a trap level due to a crystal defect etc. Thus, a semiconductor thin film with such a crystal structure can be regarded as substantially having no crystal grain boundary.

Besides, it is ascertained by TEM observation that defects existing in crystal grains almost disappear by a heat treatment step at a high temperature of 700 to 1150° C. This is obvious also from the fact that the number of defects is greatly decreased before and after this heat treatment step.

The difference in the number of defects appears as difference in spin density by electron spin resonance (ESR). At present, it is found that the spin density of a polysilicon film fabricated in accordance with the fabricating steps of this example is $3 \times 10^{17}$ spins/cm$^3$ or less (preferably $5 \times 10^{15}$ spins/cm$^3$ or less). However, since this measured value approximates the detection limit of existing measuring apparatuses, it is expected that an actual spin density is further lower.

From the above, since the polysilicon film obtained by carrying out this example does not substantially include crystal grains and crystal grain boundaries, the film can be considered as a single crystal silicon film or substantially a single crystal silicon film. The present applicant calls the polysilicon film having such a crystal structure CGS (Continuous Grain Silicon).

The disclosure of the CGS may be referred to Japanese Patent Application Laid-open No. Hei. 10-294280, Japanese Patent Application No. Hei. 10-152316, Japanese Patent Application No. Hei. 10-152308 or Japanese Patent Application No. Hei. 10-152305 by the present assignee.

(Findings as to Electrical Characteristics of a TFT)

A TFT fabricated in this example shows electrical characteristics comparable to a MOSFET. Data as shown below have been obtained from TFTs experimentally formed by the present applicant.

(1) The subthreshold coefficient as an index showing switching performance (promptness in switching of on/off operation) is as small as 60 to 100 mV/decade (typically 60 to 85 mV/decade) for both an N-channel TFT and a P-channel TFT.

(2) The field effect mobility (μFE) as an index showing an operation speed of a TFT is as large as 200 to 650 cm$^2$/Vs (typically 300 to 500 cm$^2$/Vs) for an N-channel TFT, and 100 to 300 cm$^2$/Vs (typically 150 to 200 cm$^2$/Vs) for a P-channel TFT.

(3) The threshold voltage (Vth) as an index of a driving voltage of a TFT is as small as −0.5 to 1.5 V for an N-channel TFT and −1.5 to 0.5 V for a P-channel TFT.

As described above, it has been ascertained that extremely superior switching characteristics and high speed operation characteristics can be realized.

(Findings as to Circuit Characteristics)

Next, frequency characteristics by a ring oscillator fabricated by using TFTs formed by carrying out this example will be described. The ring oscillator is a circuit in which odd number stages of inverter circuits made of CMOS structures are connected to form a ring, and is used to obtain a delay time for one stage of the inverter circuit. The structure of the ring oscillator used in the experiment is as follows:

number of stages: 9 stages thickness of a gate insulating film of a TFT: 30 nm and 50 nm gate length of a TFT: 0.6 µm As the result of the study of an oscillation frequency with this ring oscillator, it was possible to obtain an oscillation frequency of 1.04 GHz at the maximum value. Further, a shift register as one of TEGs of LSI circuits was actually fabricated and its operation frequency was ascertained. As a result, in the shift register circuit in which the thickness of a gate insulating film was 30 nm, the gate length was 0.6 µm, the power source voltage was 5 V, and the number of stages was 50, an output pulse having an operation frequency of 100 MHZ was obtained.

The surprising data of the ring oscillator and the shift register as described above indicate that the TFT of this example has performance (electrical characteristics) comparable to or superior to a MOSFET.

Example 12

This example also relates to a technique to getter a catalytic element used in a crystallizing step.

In Example 10, in order to getter the catalytic element in crystallized silicon, it is necessary to form the gettering region 1025 (see FIG. 29A). Since it becomes impossible to form a TFT in the gettering region, integration of circuits is obstructed. This example is a gettering method in which the above problem is resolved, and an n$^+$-type impurity region of an n-channel TFT and a p$^+$-type impurity region of a p-channel TFT are used as gettering regions.

In the steps described in the example 1, the n$^+$-type impurity regions 313 to 315 and the p$^+$-type impurity regions 332 and 333 contain phosphorus with a high concentration of $5 \times 10^{20}$ atoms/cm$^3$ (see FIG. 14A, FIG. 16A). Thus, these regions can be used as gettering regions.

Thus, in the case where the semiconductor layers 302 to 304 of the TFT are formed of crystalline silicon shown in Example 3 or 4, the activating step of phosphorus or born has only to be used also as a heating step for gettering. For example, in the activating step (see FIG. 14D, FIG. 16D), it is sufficient if a heat treatment is carried out at a processing temperature of 500 to 650° C. (typically 550 to 600° C.) for 2 to 24 hours (typically 4 to 12 hours).

In this heat treatment, nickel remaining in the channel formation regions 311, 312, 325, 331, and 341 of the respective TFTs diffuses toward the foregoing n$^+$-type impurity regions and the p$^+$-type impurity regions by the action of phosphorus and is captured there.

Thus, the concentration of nickel (catalyst) in the n$^+$-type impurity regions 313 to 315 and the p$^+$-type impurity regions 332 and 333 is increased to $1 \times 10^{17}$ to $1 \times 10^{20}$ atoms/cm$^3$ (typically $1 \times 10^{18}$ to $5 \times 10^{19}$ atoms/cm$^3$), while the concentration of nickel in the channel formation regions 311, 312, 325, 331, and 341 can be decreased to $2 \times 10^{17}$ atoms/cm$^3$ or less (typically $1 \times 10^{14}$ to $5 \times 10^{16}$ atoms/cm$^3$).

In order to obtain the effect of this example, in the n$^+$-type impurity regions 313 to 315 and the p$^+$-type impurity regions 332 and 333, the concentration of phosphorus or arsenic is made $1 \times 10^{19}$ atoms/cm$^3$ or more (preferably $1 \times 10^{20}$ to $5 \times 10^{21}$ atoms/cm$^3$).

Example 13

This example is a modified example of the CMOS circuit of Example 1. A structure of a TFT of this example will be described with reference to FIGS. 31A to 31D. In FIGS. 31A to 31D, the same reference numerals designate the same structural elements. Example 1 or 2 may be applied to fabricating steps of this example, and the detailed description will be omitted.

Figure 31A:
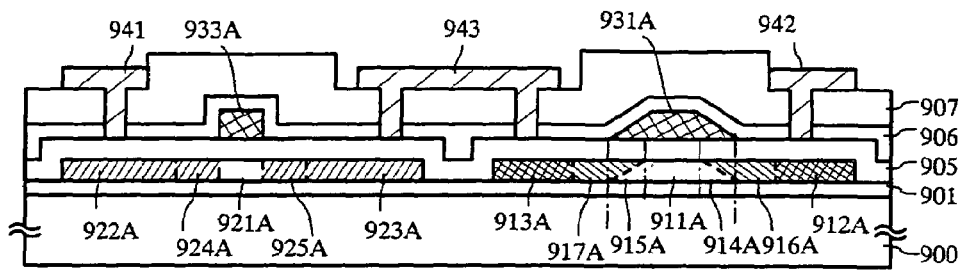
FIGS. 31A to 31D are views showing fabricating steps of a CMOS circuit of the present invention (example 13)

FIG. 31A shows a modified example of Example 1 in which a second gate electrode (wiring line) is omitted and a gate electrode (wiring line) is formed of only an electrode (wiring line) having a taper portion.

An under film 901 made of silicon oxide is formed on the entire surface of a substrate 900. Island-like semiconductor layers of an n-channel TFT and a p-channel TFT are formed on the under film 901. A gate insulating film 905 covering the island-like semiconductor layers is formed on the entire surface of the substrate 900. Further, a protective film 906 made of silicon nitride and an interlayer insulating film 907 are formed to cover the TFTs, and source electrodes 941 and 942 and a drain electrode 943 are formed on the interlayer insulating film 907.

A gate wiring line (gate electrode) 931 is formed to intersect with the semiconductor layer through the gate insulating film 905. The side of the gate wiring line 931 is formed into a taper shape. Here, this was formed of chromium with a thickness of 250 nm. Further, the width of a portion intersecting with the semiconductor layer of the p-channel TFT is made thin and a second gate electrode 933A is formed.

Example 1 is applied as a method of adding phosphorus and boron into the semiconductor layers. A channel formation region 911A, n$^+$-type impurity regions 912A and 913A, n$^-$-type impurity regions 914A and 915A overlapping with the gate electrode 931A, and n$^-$-type impurity regions 916A and 917A not overlapping with the gate electrode 931A are formed in the semiconductor layer of the n-channel TFT.

The concentration of phosphorus in the n$^-$-type impurity regions 914A and 915A and the n$^-$-type impurity regions 916A and 917A is lower than the n$^+$-type impurity regions 912A and 913A. Contact portions between the n$^-$-type impurity regions 914A, 915A and the channel formation region 911A exist under the taper portion of the gate electrode 931A, and the concentration of the n$^-$-type impurity regions 914A and 915A is decreased toward the channel formation region 911A.

On the other hand, a channel formation region 921A, p$^+$-type impurity regions 922A and 923A, and p$^+$-type impurity regions 924A and 925A are formed in the semiconductor layer of the p-channel TFT. The concentration of phosphorus in the p$^+$-type impurity regions 924A and 925A is lower than the p$^+$-type impurity regions 922A and 923A, and the concentration of boron in the former is equal to the latter.

Figure 31B:
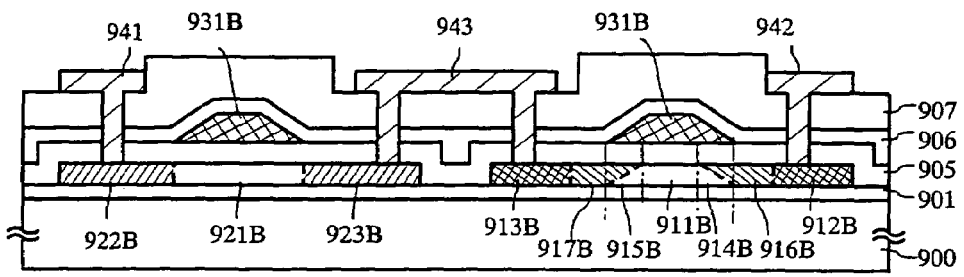

FIG. 31B shows a modified example of Example 2 or 3, in which a second electrode is omitted and a gate electrode is formed of only an electrode having a taper portion.

In FIG. 31B, gate electrodes 931B of both an n-channel TFT and a p-channel TFT are formed into a taper shape. Here, the electrode is formed of chromium with a thickness of 250 nm.

Example 2 is applied as a step of adding phosphorus and boron into the semiconductor layers. A channel formation region 911B, n$^+$-type impurity regions 912B and 913B, n$^-$-type impurity regions 914B and 915B overlapping with the gate electrode 931B, and n$^-$-type impurity regions 916B and 917B not overlapping with the gate electrode 931B are formed in the semiconductor layer of the n-channel TFT.

The concentration of phosphorus in the n$^-$-type impurity regions 914B and 915B and the n$^-$-type impurity regions 916B and 917B is lowered than that of the n$^+$-type impurity regions 912B and 913B. Contact portions between the n$^-$-type impurity regions 914B, 915B and the channel formation region 911B exist under the taper portion of the gate electrode 931B, and the concentration of the n$^-$-type impurity regions 914B and 915B is decreased toward the channel formation region 911B.

On the other hand, a channel formation region 921B, and p$^+$-type impurity regions 922B and 923B are formed in the semiconductor layer of the p-channel TFT by using the gate electrode 931B as a mask in a self-aligning manner.

Figure 31C:
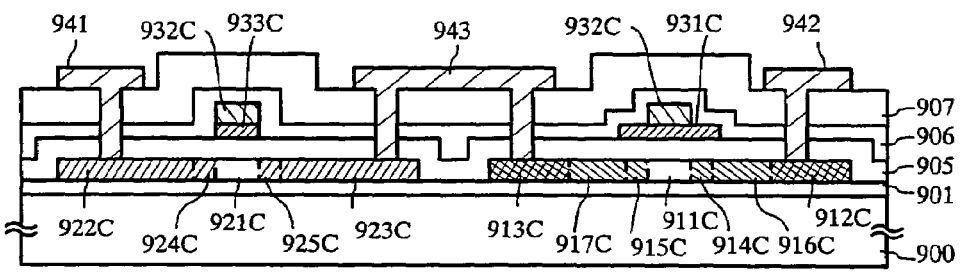

FIG. 31C shows an example in which taper etching of a first gate electrode is omitted in Example 1.

A gate wiring line is constituted by a first gate wiring line 931C and a second gate wiring line 932C with a width narrower in a channel length direction than the first gate wiring line 931C. In the portion where the first gate wiring line 931C intersects with the semiconductor layer of the p-channel TFT, a third gate electrode 933C the width of which is made thin by using the second gate wiring line 932C as a mask is formed.

A channel formation region 911C, n$^+$-type impurity regions 912C and 913C, n$^-$-type impurity regions 914C and 915C overlapping with the gate electrode 931C, and n$^-$-type impurity regions 916C and 917C not overlapping with the gate electrode 931C are formed in the semiconductor layer of the n-channel TFT.

The concentration of phosphorus in the n$^-$-type impurity regions 914C and 915C and the n$^-$-type impurity regions 916C and 917C is lowered than that of the n$^+$-type impurity regions 912C and 913C.

On the other hand, a channel formation region 921C, p$^+$-type impurity regions 922C and 923C, and p$^+$-type impurity regions 924C and 925C are formed in the semiconductor layer of the p-channel TFT. The concentration of phosphorus in the p$^+$-type impurity regions 924C and 925C is lower than that of the p$^+$-type impurity regions 922C and 923C.

Figure 31D:
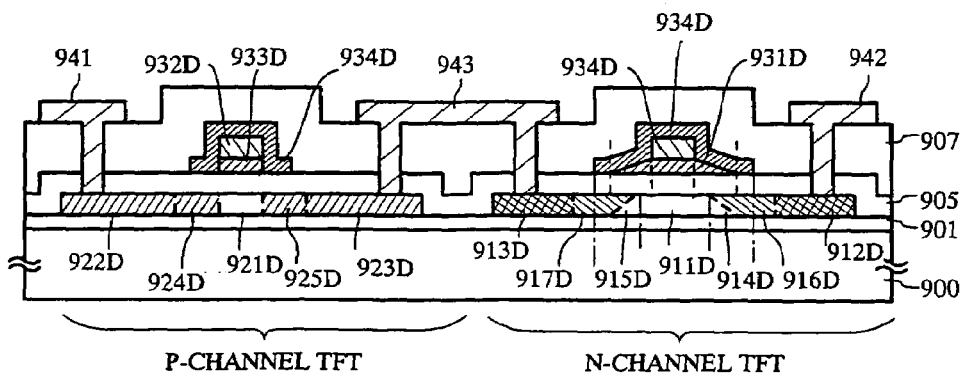

FIG. 31D shows an example in which a fourth gate wiring line covering the surface of a gate wiring line is formed in Example 1.

In a CMOS circuit, an adding step of boron is carried out in accordance with the steps of Example 1. Next, instead of formation of the protective film 906 made of silicon nitride, a metal film made of chromium (Cr), tantalum (Ta), titanium (Ti), tungsten (W), or molybdenum (Mo), or alloy containing these elements as its main ingredients, or a conductive material such as silicide is formed and is patterned, so that a fourth gate wiring line 934D is formed. Thereafter, activation may be carried out.

By this structure, it is possible to obtain a gate wiring line having such a structure that a second gate wiring line 932D is surrounded by the first gate wiring line 931D (including the third gate electrode 933D) and the fourth gate wiring line 934D.

In this case, a channel formation region 911D, n$^+$-type impurity regions 912D and 913D, n$^-$-type impurity regions 914D and 915D overlapping with the gate electrode 931D, and n$^-$-type impurity regions 916D and 917D not overlapping with the gate electrode 931D are formed in the semiconductor layer of the n-channel TFT. The n$^-$-type impurity regions 914D and 915D intersect with the first and fourth gate electrodes, and the n$^-$-type impurity regions 916D and 917D do not intersect with the fourth gate electrode 934D.

The advantage of this structure is especially effective in the case where phosphorus is hardly added into the semiconductor layer under the first gate electrode 931D. As shown in FIG. 31D, even if the n$^-$type impurity regions 914D and 915D hardly overlap with the first gate electrode 931D, the fourth gate electrode 934D can be made to overlap with the n$^-$-type impurity region, so that it becomes possible to certainly form the n$^-$-type impurity region which overlaps with the gate electrode.

On the other hand, a channel formation region 921D, p$^+$-type impurity regions 922D and 923D, and p$^+$-type impurity regions 924D and 925D are formed in the semiconductor layer of the p-channel TFT. The concentration of phosphorus in the p$^+$-type impurity regions 924D and 925D is lower than that of the p$^+$-type impurity regions 922D and 923D. In this case, the n$^-$-type impurity region overlaps with the fourth gate electrode 934D. In the case where there occurs a problem in off-current characteristics or withstand voltage properties, when the fourth gate wiring line 934D is formed, the fourth gate wiring line 934D is not formed in the portion where it intersects with the semiconductor layer of the p-channel TFT.

Example 14

The TFT of the present invention can be applied to not only the liquid crystal display device shown in Example 1 but also any semiconductor circuits. That is, it may be applied to a microprocessor such as a RISC processor or an ASIC processor, or may be applied to any circuits from a signal processing circuit such as a D/A converter to a high frequency circuit for a portable equipment (portable telephone, PHS, mobile computer).

Moreover, it is also possible to realize a semiconductor device of a three-dimensional structure in which an interlayer insulating film is formed on a conventional MOSFET and a semiconductor circuit is fabricated thereon by using the TFTs of the present invention. Like this, the present invention can be applied to any semiconductor devices in which LSIs are used at present. That is, the present invention may be applied to a SOI structure (TFT structure using a single crystal semiconductor thin film) such as SIMOX, Smart-Cut (registered trademark of SOITEC Inc.), and ELTRAN (registered trademark of Canon Inc.). Further, the semiconductor circuit of this example may be realized with any construction obtained by combining Examples 1 to 13.

Example 15

A semiconductor device using a TFT formed through carrying out the present invention may be applied to various electro-optical devices and semiconductor circuits. Namely, the present invention may be applicable to all the electronic equipments that incorporate those electro-optical devices and semiconductor circuits as components.

As such an electronic equipment, a video camera, a digital camera, a projector (rear-type projector or front-type projector), a head mount display (goggle-type display), a navigation system for vehicles, a personal computer, and a portable information terminal (a mobile computer, a cellular phone, or an electronic book, etc.) may be enumerated. Examples of those are shown in FIGS. 32A to 33D.

Figure 32A:
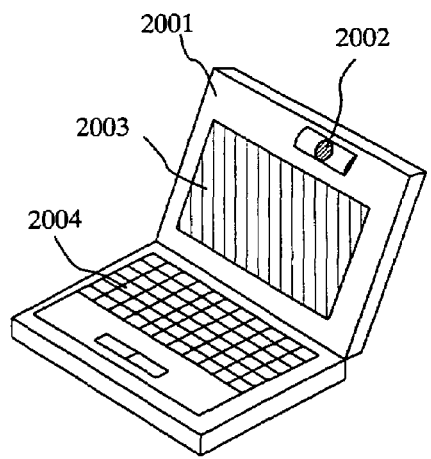
FIGS. 32A to 32F are views showing examples of electronic equipments of the present invention (example 15)

FIG. 32A shows a personal computer comprising a main body 2001, an image inputting unit 2002, a display device 2003, and a key board 2004. The present invention is applicable to the image inputting unit 2002, the display device 2003, and other signal control circuits.

Figure 32B:
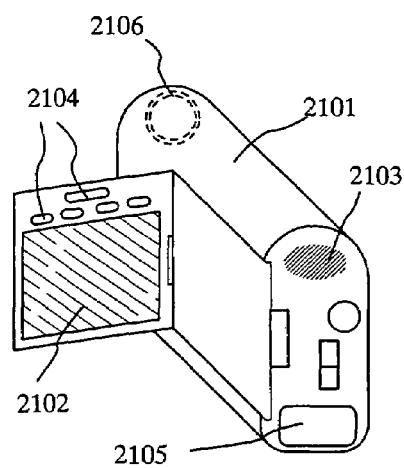

FIG. 32B shows a video camera comprising a main body 2101, a display device 2102, a voice input unit 2103, an operation switch 2104, a battery 2105, and an image receiving unit 2106. The present invention is applicable to the display device 2102, the voice input unit 2103, and other signal control circuits.

Figure 32C:
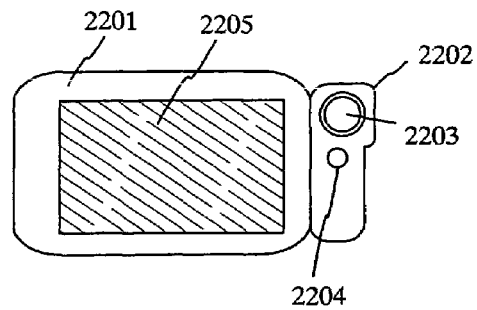

FIG. 32C shows a mobile computer comprising a main body 2201, a camera unit 2202, an image receiving unit 2203, an operation switch 2204, and a display device 2205. The present invention is applicable to the display device 2205 and other signal control circuits.

Figure 32D:
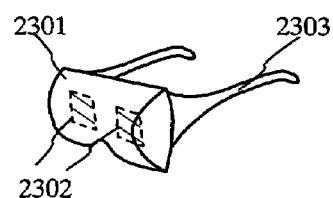

FIG. 32D shows a goggle-type display comprising a main body 2301, a display device 2302 and an arm portion 2303. The present invention is applicable to the display device 2302 and other signal control circuits.

Figure 32E:
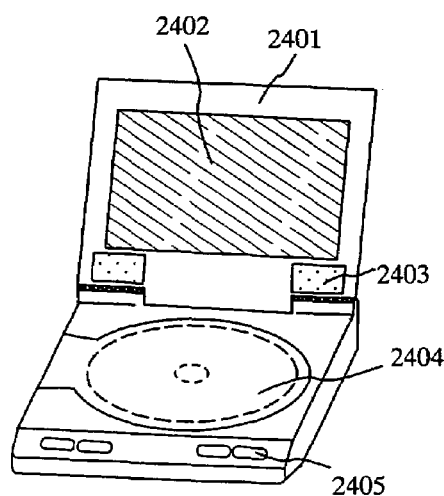

FIG. 32E shows a player that employs a recoding medium in which programs are recorded (hereinafter referred to as recording medium), and comprises a main body 2401, a display device 2402, a speaker unit 2403, a recording medium 2404, and an operation switch 2405. Incidentally, this player uses as the recoding medium a DVD (digital versatile disc), a CD and the like to serve as a tool for enjoying music or movies, for playing games and for connecting to the Internet. The present invention is applicable to the display device 2402 and other signal control circuits.

Figure 32F:
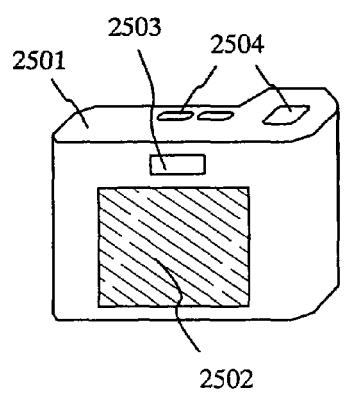

FIG. 32F shows a digital camera comprising a main body 2501, a display device 2502, an eye piece section 2503, an operation switch 2504, and an image receiving unit (not shown). The present invention is applicable to the display device 2502 and other signal control circuits.

Figure 33A:
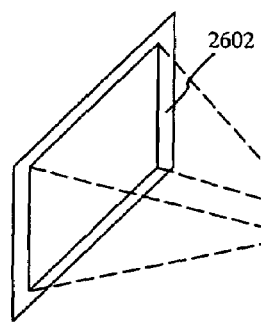
FIGS. 33A to 33D are views showing examples of electronic equipments of the present invention (example 15)

FIG. 33A shows a front-type projector comprising a display device 2601 and a screen 2602. The present invention is applicable to the display device and other signal control circuits.

Figure 33B:
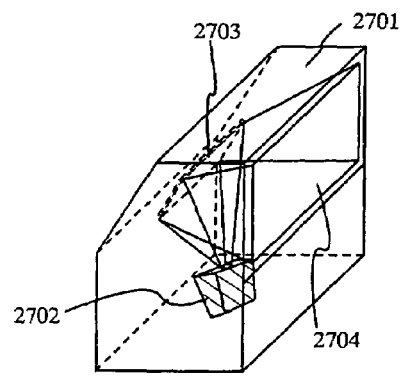

FIG. 33B shows a rear-type projector comprising a main body 2701, a display device 2702, a mirror 2703, and a screen 2704. The present invention is applicable to the display device and other signal control circuits.

Figure 33C:
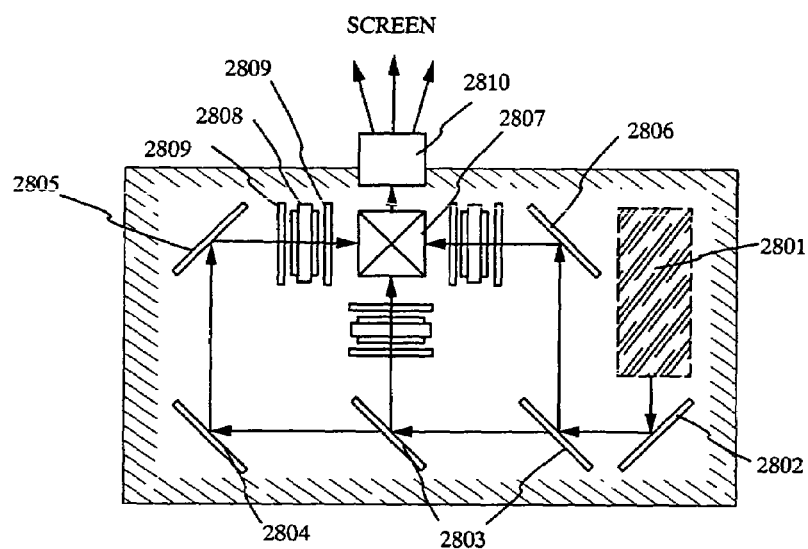

FIG. 33C is a diagram showing an example of the structure of the display devices 2601 and 2702 in FIGS. 33A and 33B. The display device 2601 or 2702 comprises a light source optical system 2801, mirrors 2802 and 2804 to 2806, a dichroic mirror 2803, a prism 2807, a liquid crystal display device 2808, a phase difference plate 2809 and a projection optical system 2810. The projection optical system 2810 consists of an optical system including a projection lens. This example shows an example of "three plate type", but not particularly limited thereto. For instance, the invention may be applied also to "single plate type". Further, in the light path indicated by an arrow in FIG. 33C, an optical system such as an optical lens, a film having a polarization function, a film for adjusting a phase difference, an IR film may be provided on discretion of a person who carries out the invention.

Figure 33D:
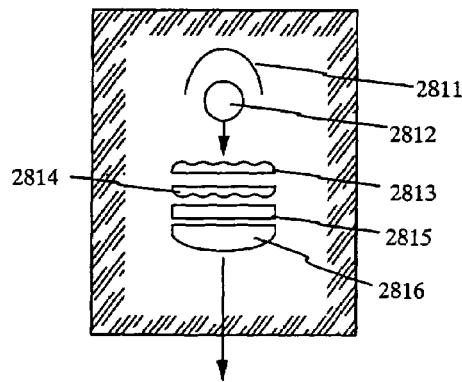

FIG. 33D is a diagram showing an example of the structure of the light source optical system 2801 in FIG. 33C. In this example, the light source optical system 2801 comprises a reflector 2811, a light source 2812, lens arrays 2813 and 2814, a polarizing converter element 2815 and a collimator lens 2816. Incidentally, the light source optical system shown in FIG. 33D is an example and not particularly limited thereto. For example, in the light source optical system, an optical system such as an optical lens, a film having a polarization function, a film for adjusting a phase difference, and an IR film may be provided on discretion of a person who carries out the invention.

As described above, the scope of application of the semiconductor device of the present invention is very wide, and the invention can be applied to electronic equipments of any fields. The semiconductor device of this example can be realized even if any combination of Examples 1 to 14 is used.

Example 16

This example demonstrates a process for producing an active matrix type EL (electroluminescence) display device according to the invention of the present invention.

Figure 35A:
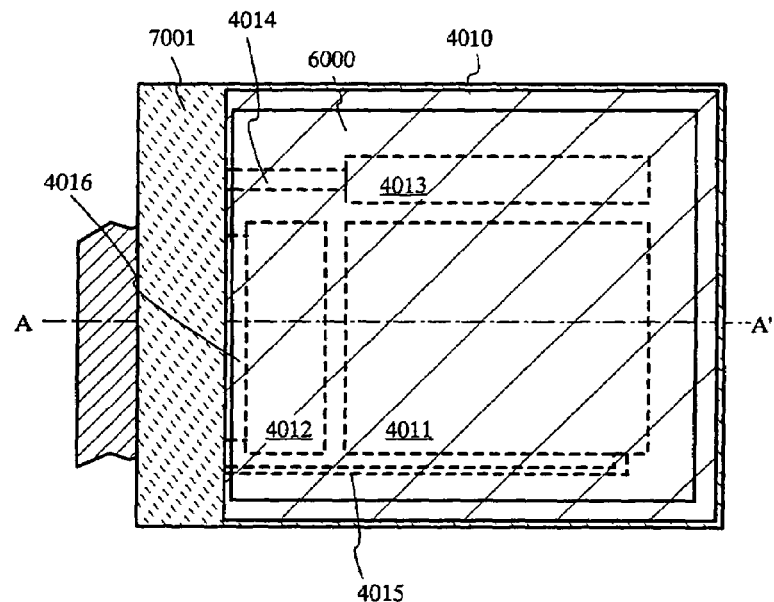
FIGS. 35A to 35B are views showing a structure of an active matrix type EL display panel (example 16)

FIG. 35A is a top view showing an EL display device, which was produced according to the present invention. In FIG. 35A, there are shown a substrate 4010, a pixel portion 4011, a source side driving circuit 4012, and a gate side driving circuit 4013, each driving circuit connecting to wirings 4014-4016 which reach FPC 4017 leading to external equipment.

The pixel portion, preferably together with the driving circuit, is enclosed by a covering material 6000, a sealing material (or housing material) 7000, and an end-sealing material (or second sealing material) 7001.

Figure 35B:
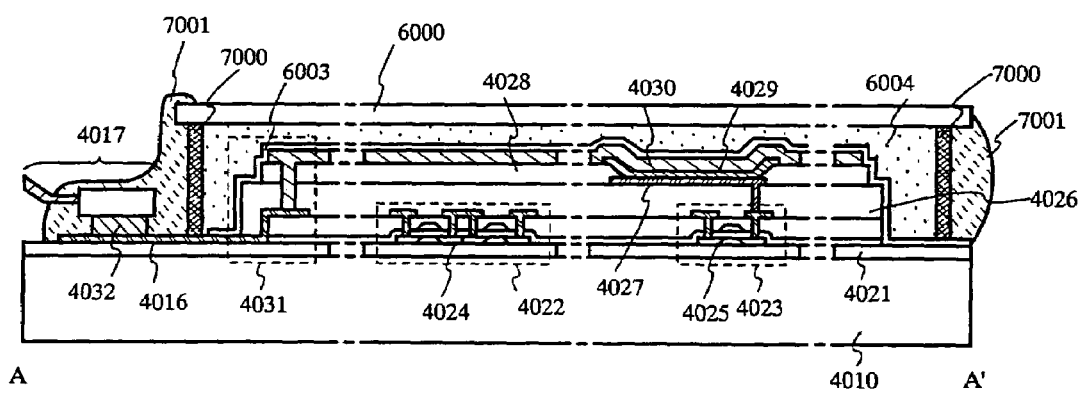

FIG. 35B is a sectional view showing the structure of the EL display device in this Example. There is shown a substrate 4010, a base film 4021, a TFT 4022 for the driving circuit, and a TFT 4023 for the pixel portion. (The TFT 4022 shown is a CMOS circuit consisting of an n-channel type TFT and a p-channel type TFT. The TF 14023 shown is the one, which controls current to the EL element.)

Incidentally, the present invention is used in the TFT 4022 for the driving circuit and the TFT 4023 for the pixel portion.

Upon completion of TFT 4022 (for the driving circuit) and TFT 4023 (for the pixel portion) according to the invention of the present application, a pixel electrode 4027 is formed on the interlayer insulating film (planarizing film) 4026 made of a resin. This pixel electrode is a transparent conductive film, which is electrically connected to the drain of TFT 4023 for the pixel unit. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single-layer structure or multi-layer structure by freely combining known EL materials such as a hole injection layer, a hole transport layer, a light emitting layer, an electron transport layer, and an electron injection layer. Any known technology may be available for such structure. The EL material is either a low-molecular material or a high-molecular material (polymer). The former may be applied by vapor deposition, and the latter may be applied by a simple method such as spin coating, printing, or ink-jet method.

In this example, the EL layer is formed by a vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 subsequently in a vacuum, or by forming the EL layer 4029 in an inert atmosphere and then forming the cathode 4030 in the same atmosphere without exposing to air. In this Example, the desired film was formed by using a film-forming apparatus of multi-chamber system (cluster tool system).

The multi-layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end-sealing material 7001 is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of µm sandwiched by a PVF film or a Mylar film.

It is noted that the covering material 6000 should have a light transparency with accordance to a light emitting direction (a light radiation direction) from the EL element.

The wiring 4016 is electrically connected to FPC 4017 through the gap between the sealing material 7000 and the end-sealing material 7001, and the substrate 4010. As in the wiring 4016 explained above, other wirings 4014 and 4015 are also electrically connected to FPC 4017 under the sealing material 4018.

Example 17

In this example, another active matrix type EL display device having a different structure from the example 16 is explained, as shown in FIGS. 34A and 34B. The same reference numerals in FIGS. 36A and 36B as in FIGS. 35A and 35B indicate same constitutive elements, so an explanation is omitted.

Figure 36A:
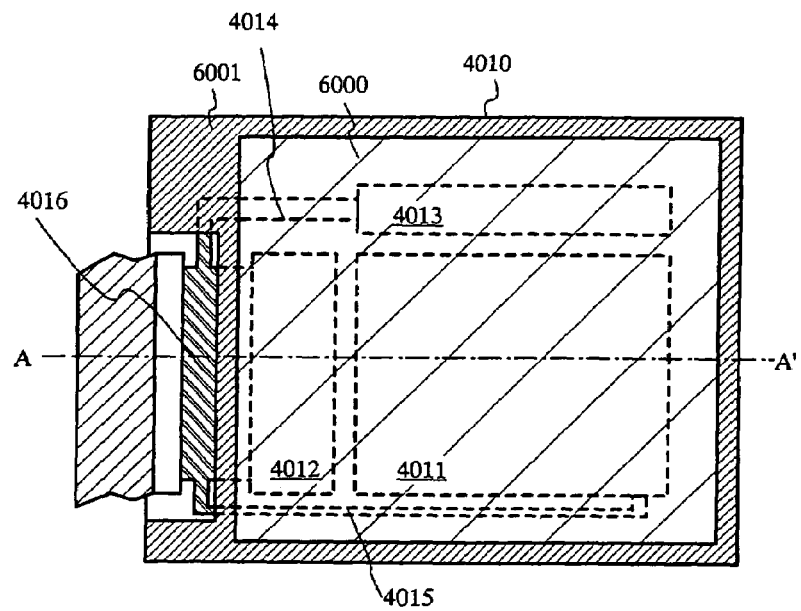
FIGS. 36A to 36B are views showing a structure of an active matrix type EL display panel (example 17)
Figure 36B:
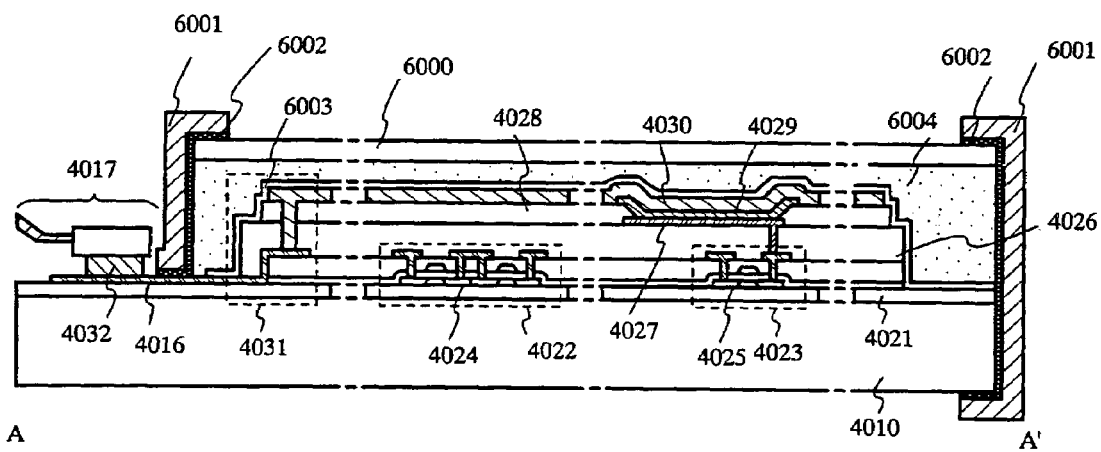

FIG. 36A shows a top view of the EL module in this example and FIG. 36B shows a sectional view of A-A' of FIG. 36A.

According to Example 16, the passivation film 6003 is formed to cover a surface of the EL element.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of µm sandwiched by a PVF film or a Mylar film.

It is noted that the covering material 6000 should have a light transparency with accordance to a light emitting direction (a light radiation direction) from the EL element.

Next, the covering material 6000 is adhered using the filling material 6004. Then, the flame material 6001 is attached to cover side portions (exposed faces) of the filling material 6004. The flame material 6001 is adhered by the sealing material (acts as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wirings 4014 and 4015 are also electrically connected to FPC 4017 under the sealing material 6002.

Example 18

Figure 37:
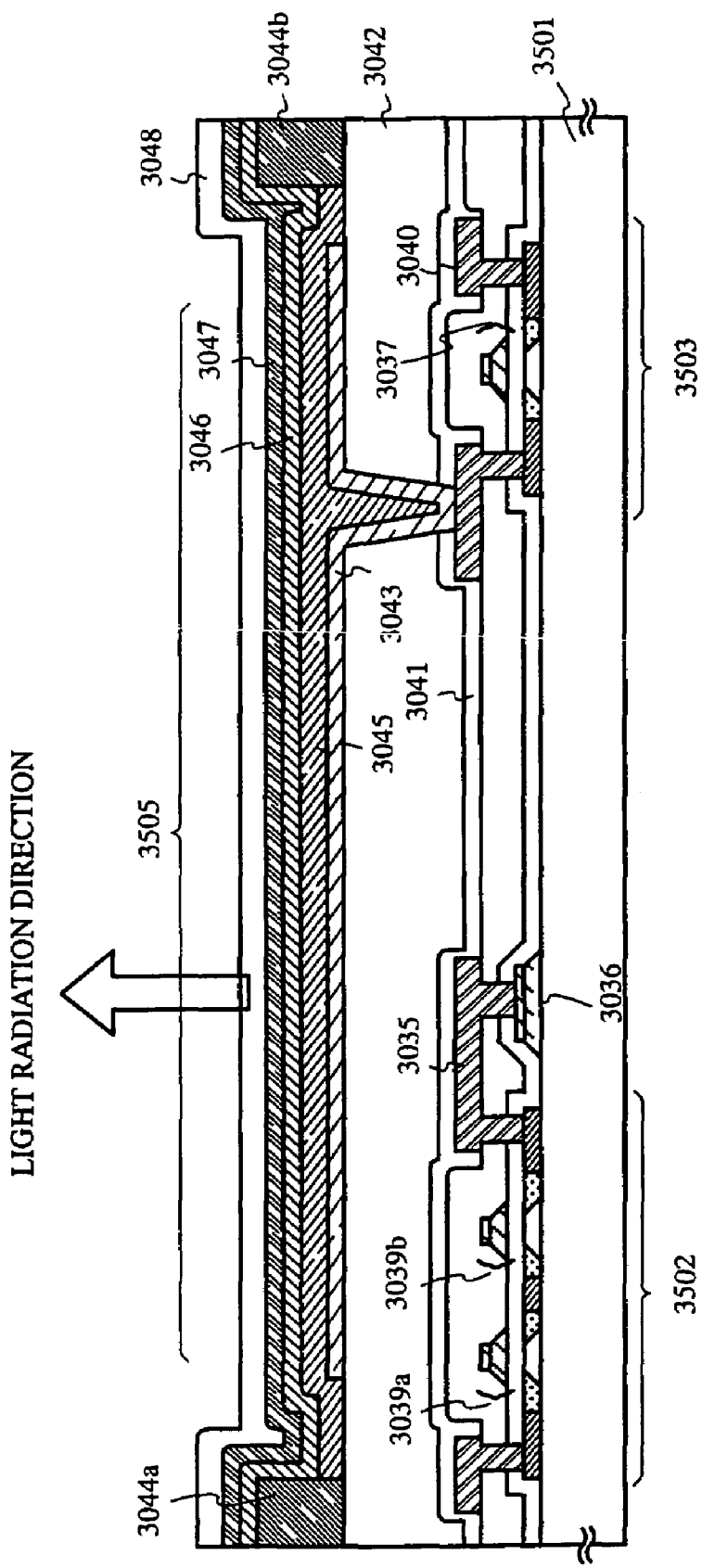
FIG. 37 is a view showing a cross section of a pixel portion in the an active matrix type EL display panel (example 18)
Figure 38A:
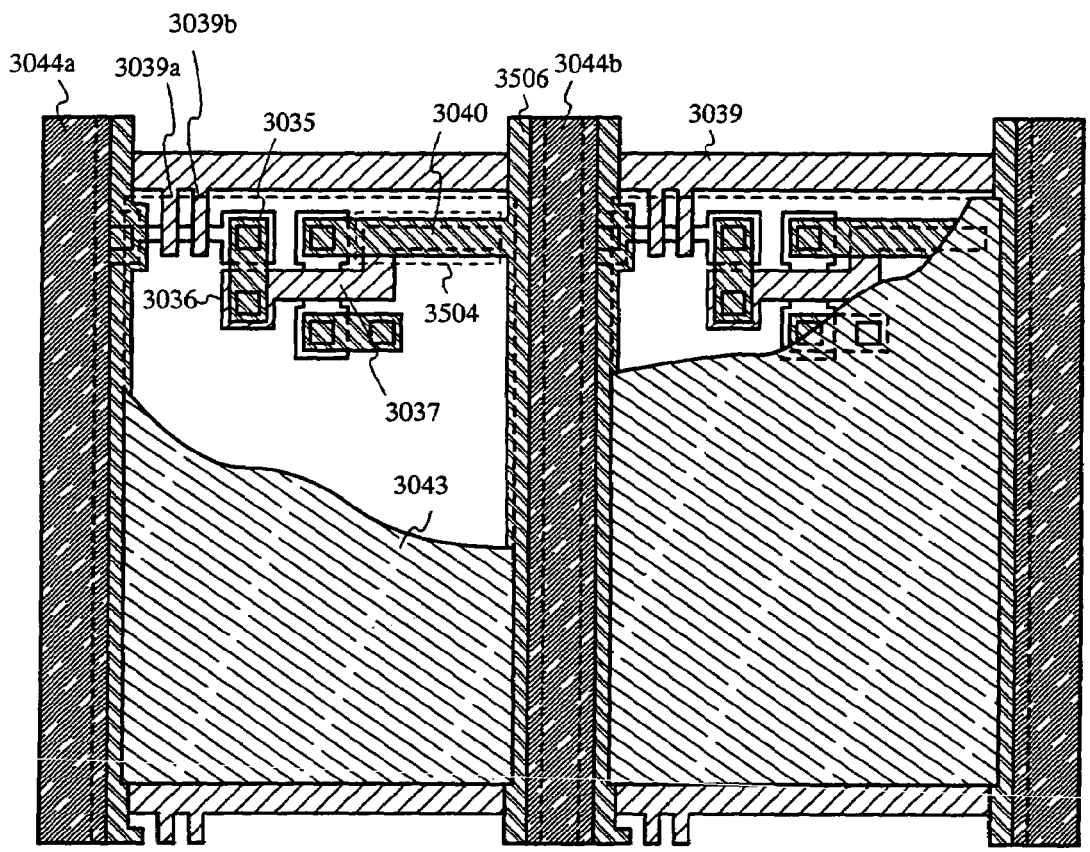
FIGS. 38A to 38B are views showing a structure of the pixel portion in an active matrix type EL display panel and a circuit structure for the pixel portion, respectively (example 18)
Figure 38B:
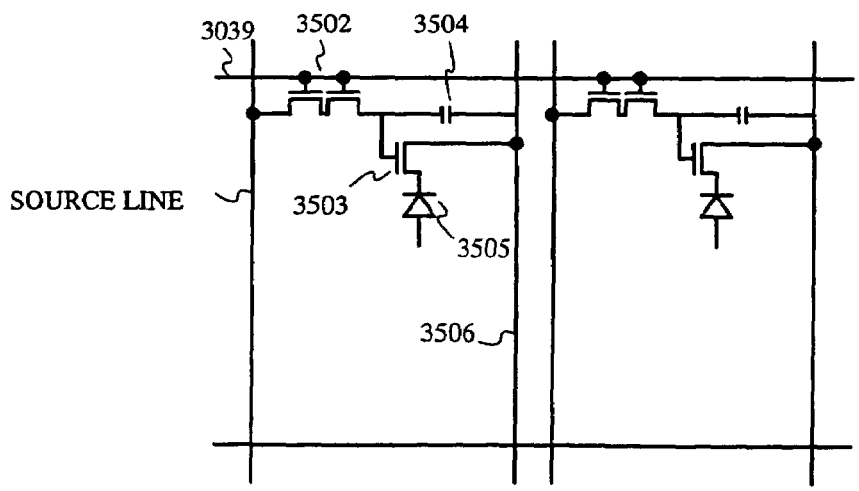

In the active matrix type EL display device having a structure based on the example 16 or 17, the present invention can be used. Although Examples 16 and 17 explain a structure in which a light is radiated toward a bottom surface, an example of the structure of the pixel region in the panel is illustrated in more detail in Example 18. FIG. 37 shows the cross section of the pixel region; FIG. 38A shows the top view thereof; and FIG. 38B shows the circuit structure for the pixel region. In FIG. 37, FIG. 38A and FIG. 38B, the same reference numerals are referred to for the same portions, as being common thereto. There is an example in which a light is radiated toward a top surface described in Example 18. However, needless-to-say, it is possible to fabricate an EL display device applied to the structure of the pixel portion of Example 18 in to Examples 16 and 17.

In FIG. 37, the switching TFT 3502 formed on the substrate 3501 is NTFT of the invention (cf. Examples 1 to 13). In this Example, it has a double-gate structure, but its structure and fabrication process do not so much differ from the structures and the fabrication processes illustrated hereinabove, and their description is omitted herein. However, the double-gate structure of the switching TFT 3502 has substantially two TFTs as connected in series, and therefore has the advantage of reducing the off-current to pass therethrough. In this Example, the switching TFT 3502 has such a double-gate structure, but is not limitative. It may have a single-gate structure or a triple-gate structure, or even any other multi-gate structure having more than three gates. As the case may be, the switching TFT 3502 may be PTFT of the invention.

The current-control TFT 3503 is NTFT of the invention. The drain wiring 3035 in the switching TFT 3502 is electrically connected with the gate electrode 3037 of the current-control TFT, via the wiring 3036 therebetween. Gate electrodes 3039a and 3039b of the switching TFT 3502 are extended from gate wiring 3039. Because the figure would be complicated, FIG. 38A shown only one layer for the gate wiring 3039, the gate electrodes 3037, 3039a and 3039b. In fact, however, the gate wiring and the gate electrodes have two-layered structure as shown in FIG. 38B.

It is very important that the current-control TFT 3503 has the structure defined in the invention. The current-control TFT is a unit for controlling the quantity of current that passes through the EL device. Therefore, a large quantity of current passes through it, and the unit, current-control TFT has a high risk of thermal degradation and degradation with hot carriers. To this unit, therefore, the structure of the invention is extremely favorable, in which an LDD region is so constructed that the gate electrode overlaps with the drain area in the current-control TFT, via a gate insulating film therebetween.

In this Example, the current-control TFT 3503 is illustrated to have a single-gate structure, but it may have a multi-gate structure with plural TFTs connected in series. In addition, plural TFTs may be connected in parallel so that the channel forming region is substantially divided into plural sections. In the structure of that type, heat radiation can be effected efficiently. The structure is advantageous for protecting the device with it from thermal deterioration.

As in FIG. 38A, the wiring to be the gate electrode 3037 in the current-control TFT 3503 overlaps with the drain wiring 3040 therein in the region indicated by 3504, via an insulating film therebetween. In this state, the region indicated by 3504 forms a capacitor. The capacitor 3504 functions to retain the voltage applied to the gate electrode in the current-control TFT 3503. The drain wiring 3040 is connected with the current supply line (power line) 3501, from which a constant voltage is all the time applied to the drain wiring 3040.

On the switching TFT 3502 and the current-control TFT 3503, a first passivation film 41 is formed. On the film 3041, formed is a planarizing film 3042 of an insulating resin. It is extremely important that the difference in level of the layered portions in TFT is removed through planarization with the planarizing film 3042. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 3043 indicates a pixel electrode (a cathode in the EL device) of an conductive film with high reflectivity. The pixel electrode 3043 is electrically connected with the drain region in the current-control TFT 3503. It is preferable that the pixel electrode 3043 is of a low-resistance conductive film of an aluminum alloy, a copper alloy or a silver alloy, or of a laminate of those films. Needless-to-say, the pixel electrode 3043 may have a laminate structure with any other conductive films.

In the recess (this corresponds to the pixel) formed between the banks 3044a and 3044b of an insulating film (preferably of a resin), the light-emitting layer 3044 is formed. In the illustrated structure, only one pixel is shown, but plural light-emitting layers could be separately formed in different pixels, corresponding to different colors of R (red), G (green) and B (blue). The organic EL material for the light-emitting layer may be any π-conjugated polymer material. Typical polymer materials usable herein include polyparaphenylenevinylene (PVV) materials, polyvinylcarbazole (PVK) materials, polyfluorene materials, etc.

Various types of PVV-type organic EL materials are known, such as those disclosed in H. Shenk, H. Becker, O. Gelsen, E. Klunge, W. Kreuder, and H. Spreitzer; Polymers for Light Emitting Diodes, Euro Display Proceedings, 1999, pp. 33-37 and in Japanese Patent Laid-Open No. 10-92576 (1998). Any of such known materials are usable herein.

Concretely, cyanopolyphenylenevinylenes may be used for red-emitting layers; polyphenylenevinylenes may be for green-emitting layers; and polyphenylenevinylenes or polyalkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, Example 18 is to demonstrate an example of using polymer materials to form light-emitting layers, which, however, is not limitative. Low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Example, a hole injection layer 3046 of PEDOT (polythiophene) or PAni (polyaniline) is formed on the light-emitting layer 3045 to give a laminate structure for the EL layer. On the hole injection layer 3046, formed is an anode 3047 of a transparent conductive film. In this Example, the light having been emitted by the light-emitting layer 3045 radiates therefrom in the direction toward the top surface (that is, in the upward direction of TFT). Therefore, in this, the anode must transmit light. For the transparent conductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent conductive film for the anode is of a material capable of being formed into a film at as low as possible temperatures.

When the anode 3047 is formed, the EL device 3505 is finished. The EL device 3505 thus fabricated herein indicates a capacitor comprising the pixel electrode (cathode) 3043, the light-emitting layer 3045, the hole injection layer 3046 and the anode 3047. As in FIG. 38A, the region of the pixel electrode 3043 is nearly the same as the area of the pixel. Therefore, in this, the entire pixel functions as the EL device. Accordingly, the light utility efficiency of the EL device fabricated herein is high, and the device can display bright images.

In this Example, a second passivation film 3048 is formed on the anode 3047. For the second passivation film 3048, preferably used is a silicon nitride film or a silicon nitride oxide film. The object of the second passivation film 3048 is to insulate the EL device from the outward environment. The film 3048 has the function of preventing the organic EL material from being degraded through oxidation and has the function of preventing it from degassing. With the second passivation film 3048 of that type, the reliability of the EL display device is improved.

As described hereinabove, the EL display panel of the invention fabricated in this Example has a pixel portion for the pixel having the constitution as in FIG. 37, and has the switching TFT through which the off-current to pass is very small to a satisfactory degree, and the current-control TFT resistant to hot carrier injection. Accordingly, the EL display panel fabricated herein has high reliability and can display good images.

The constitution of this Example can be combined with any constitution of Examples 1 to 13 in any desired manner. Incorporating the EL display panel of this Example into the electronic equipments of Example 15 as its display portion is advantageous.

Example 19

This Example is to demonstrate a modification of the EL display panel of Example 18, in which the EL device 3505 in the pixel portion has a reversed structure. For this Example, referred to is FIG. 39. The constitution of the EL display panel of this Example differs from that illustrated in FIG. 37 only in the EL device portion and the current-control TFT portion. Therefore, the description of the other portions except those different portions is omitted herein.

Figure 39:
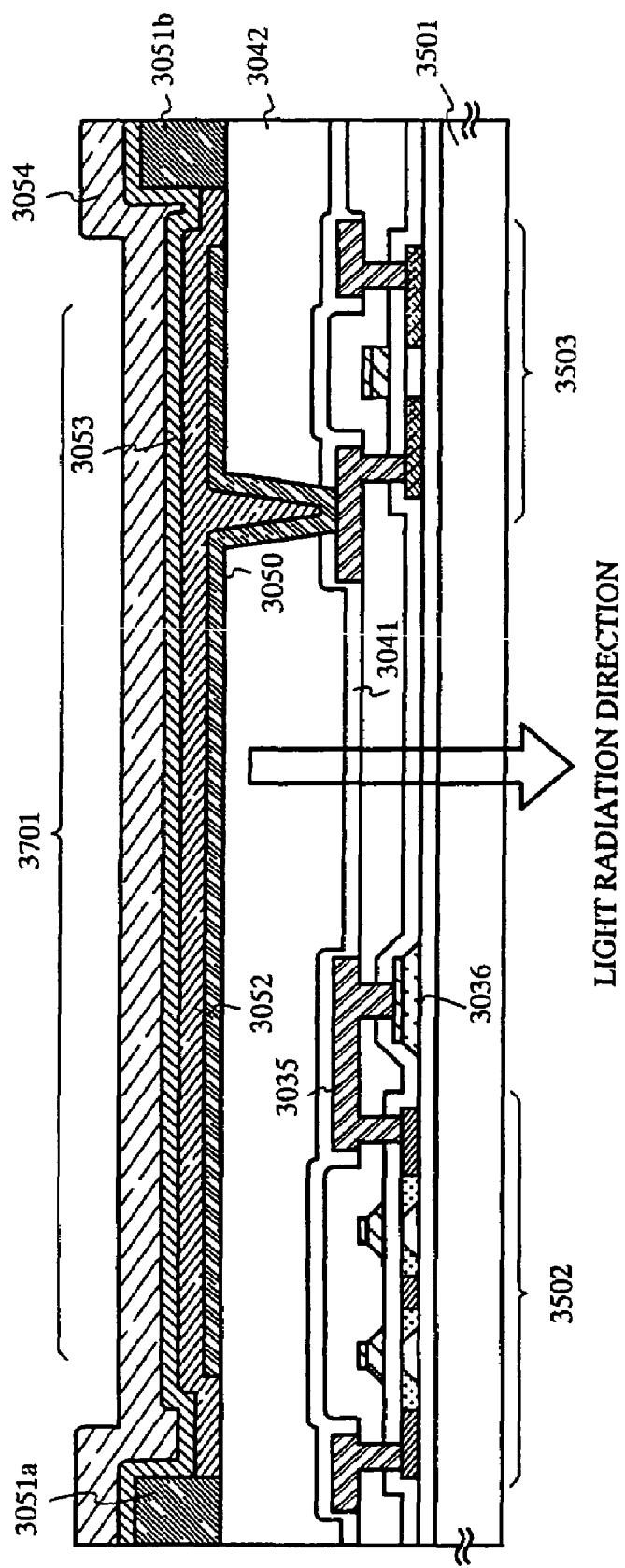
FIG. 39 is a view showing a structure of a pixel portion in an active matrix type EL display panel (example 19)

In FIG. 39, the current-control TFT 3701 may be PTFT of the invention. For the process of forming it, referred to is that of Example 1 to 13.

In this Example, the pixel electrode (anode) 3050 is of a transparent conductive film. Concretely, used is an conductive film of a compound of indium oxide and zinc oxide. Needless-to-say, also usable is an conductive film of a compound of indium oxide and tin oxide.

After the banks 3051a and 3051b of an insulating film have been formed, a light-emitting layer 3052 of polyvinylcarbazole is formed between them in a solution coating method. On the light-emitting layer 3052, formed are an electron injection layer 3053 of acetylacetonatopotassium, and a cathode 3054 of an aluminum alloy. In this case, the cathode 3054 serves also as a passivation film. Thus is fabricated the EL device 3701.

In this Example, the light having been emitted by the light-emitting layer 3053 radiates in the direction toward the substrate with TFT formed thereon, as in the direction of the arrow illustrated.

The constitution of this Example can be combined with any constitution of Examples 1 to 13 in any desired manner. Incorporating the EL display panel of this Example into the electronic equipments of Example 15 as its display portion is advantageous.

Example 20

This Example is to demonstrate modifications of the pixel with the circuit structure of FIG. 38B. The modifications are as in FIGS. 40A-40C. In this Example illustrated in those FIG. 40A to FIG. 40C, 3801 indicates the source wiring for the switching TFT 3802; 3803 indicates the gate wiring for the switching TFT 3802; 3804 indicates a current-control TFT; 3805 indicates a capacitor; 3806 and 3808 indicate current supply lines; and 3807 indicates an EL device.

Figure 40A:
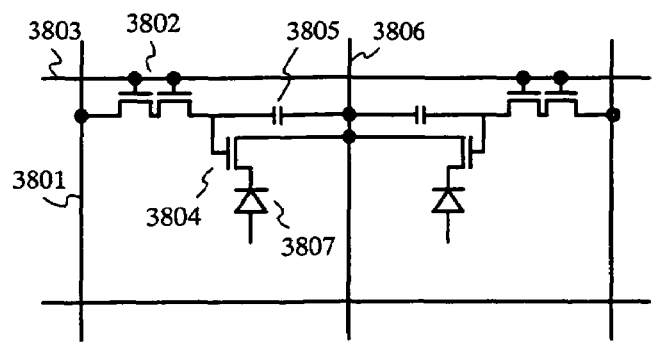
FIGS. 40A-40C are views showing circuit structures for pixel portions in active matrix type EL display panels (example 20).

In the example of FIG. 40A, the current supply line 3806 is common to the two pixels. Specifically, this example is characterized in that two pixels are lineal-symmetrically formed with the current supply line 3806 being the center between them. Since the number of current supply lines can be reduced therein, this example is advantageous in that the pixel portion can be much finer and thinner.

Figure 40B:
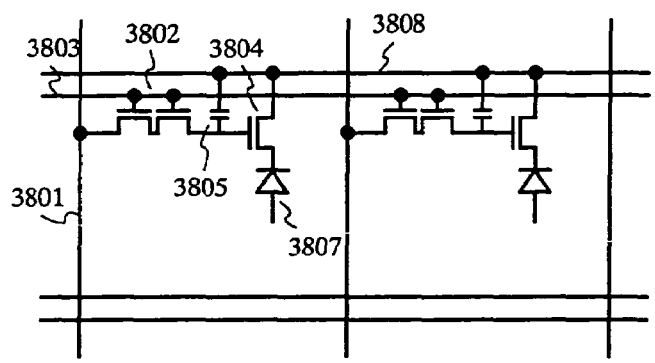

In the example of FIG. 40B, the current supply line 3808 is formed in parallel to the gate wiring 3803. Specifically, in this, the current supply line 3808 is so constructed that it does not overlap with the gate wiring 3803, but is not limitative. Being different from the illustrated case, the two may overlap with each other via an insulating film therebetween so far as they are of different layers. Since the current supply line 3808 and the gate wiring 3803 may enjoy the common exclusive area therein, this example is advantageous in that the pixel pattern can be much finer and thinner.

Figure 40C:
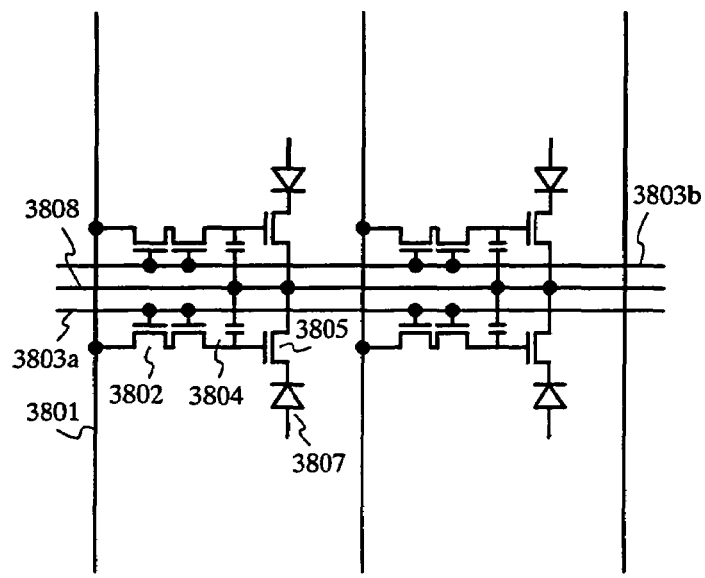

The structure of the example of FIG. 40C is characterized in that the current supply line 3808 is formed in parallel to the gate wirings 3803, like in FIG. 40B, and that two pixels are lineal-symmetrically formed with the current supply line 3808 being the center between them. In this, it is also effective to provide the current supply line 3808 in such a manner that it overlaps with any one of the gate wirings 3803. Since the number of current supply lines can be reduced therein, this example is advantageous in that the pixel pattern can be much finer and thinner.

The constitution of this Example can be combined with any constitution of Example 1 to 13, 16 and 17 in any desired manner. Incorporating the EL display panel having the pixel structure of this Example into the electronic equipments of Example 15 as its display portion is advantageous.

Example 21

The example of Example 18 illustrated in FIG. 38A and FIG. 38B is provided with the capacitor 3504 which acts to retain the voltage applied to the gate in the current-control TFT 3503. In the example, however, the capacitor 3504 may be omitted.

In the example of Example 18, the current-control TFT 3503 is NTFT of the invention, as shown in Examples 1 to 13. Therefore, in the example 18, the LDD region is so formed that it overlaps with the gate electrode via the gate insulating film therebetween. In the overlapped region, formed is a parasitic capacitance generally referred to as a gate capacitance. The example of this Example is characterized in that the parasitic capacitance is positively utilized in place of the capacitor 3504.

The parasitic capacitance in question varies, depending on the area in which the gate electrode overlaps with the LDD region, and is therefore determined according to the length of the LDD region in the overlapped area.

Also in the examples of Example 20 illustrated in FIG. 40A, FIG. 40B and FIG. 40C, the capacitor 3805 can be omitted.

The constitution of this Example can be combined with any constitution of Example 1 to 13, 16 to 20 in any desired manner. Incorporating the EL display panel having the pixel structure of this Example into the electronic equipments of Example 15 as its display portion is advantageous.

Further, needless-to-say, the NTFT and the PTFT in Examples 16-21 are same as an n-channel TFT and a p-channel TFT of the present invention, respectively.

By carrying out the present invention, the reliability of a TFT can be increased, and especially the reliability of an n-channel TFT can be increased. Thus, it becomes possible to secure the reliability of a channel-type TFT which has high electric characteristics (especially high mobility) and which is required to have severe reliability. At the same time, by forming a CMOS circuit through combination of an n-channel TFT and a p-channel TFT superior in characteristic balance, a semiconductor circuit having high reliability and superior electric characteristics can be formed.

Moreover, in the present invention, since a catalytic element used for crystallization of a semiconductor can be reduced, a semiconductor device with few unstable factors can be realized. Further, since a step of reducing the catalytic element is carried out at the same time as formation and activation of a source region and a drain region, a throughput is not lowered.

Moreover, by increasing the reliability of a circuit assembled by the TFTs as described above, it becomes possible to secure the reliability of an electro-optical device, a semiconductor circuit, and further, any semiconductor devices including electronic equipments.

What is claimed is:

1. An electronic equipment having a display device comprising:
    a substrate;
    a pixel TFT only in a pixel portion which can display a picture over the substrate;
    a driving circuit over the substrate;
    an interlayer insulating film; and
    a pixel electrode,
    wherein the driving circuit is located outside the pixel portion,
    wherein the pixel TFT comprises:
        a first semiconductor island including at least a first channel formation region, a second channel formation region, lightly doped regions and source and drain regions;
        a first gate insulating film formed over the first semiconductor island;
        a first gate electrode formed over the first channel formation region with the first gate insulating film interposed therebetween; and
        a second gate electrode formed over the second channel formation region with the first gate insulating film interposed therebetween,
    wherein the driving circuit comprises a thin film transistor, said thin film transistor comprising:
        a second semiconductor island including at least a third channel formation region;
        a second gate insulating film formed over the second semiconductor island; and
        a third gate electrode formed over the third channel formation region with the second gate insulating film interposed therebetween,
    wherein the interlayer insulating film covers the first, second and third gate electrodes and said first and second semiconductor islands,
    wherein the pixel electrode is formed over the interlayer insulating film and electrically connected to one of the source and drain regions of the first semiconductor island, and
    wherein each of the first, second and third gate electrodes has tapered edges with a taper angle in a range of 3° to 60°.

2. The electronic equipment according to claim 1, wherein each of said pixel TFT and thin film transistor in the driving circuit is an N-channel thin film transistor.

3. The electronic equipment according to claim 1, wherein each of said first, second and third gate electrodes comprises a metal selected from the group consisting of chromium, tantalum, titanium, tungsten, and molybdenum.

4. The electronic equipment according to claim 1, wherein said pixel electrode comprises zinc oxide.

5. The electronic equipment according to claim 1, wherein said taper angle is in a range of 5° to 45°.

6. The electronic equipment according to claim 1, wherein said taper angle is in a range of 7° to 20°.

7. The electronic equipment according to claim 1, wherein said electronic equipment includes one of a video camera, a digital camera, a projector, a head mount display, a navigation system for a vehicle, a personal computer, and a portable information terminal.

8. An electronic equipment according to claim 1, having a display device wherein each of said lightly doped regions is partly overlapped by tapered portions of the first or second gate electrode and extends beyond a side edge of the first or second gate electrode.

9. The electronic equipment according to claim 1, wherein the first gate insulating film and the second gate insulating film are a same insulating film.

10. An electronic equipment having a display device comprising:
    a substrate;
    a pixel portion only in a region which can display a picture over the substrate;
    a driving circuit over the substrate;
    a capacitor electrode;
    an interlayer insulating film; and
    a pixel electrode,
    wherein the driving circuit is located outside the pixel portion,
    wherein the pixel portion comprises:
        a first semiconductor island including at least a first channel formation region, a second channel formation region, lightly doped regions, and a capacitor forming region;
        a first gate insulating film formed over the first semiconductor island;
        a first gate electrode formed over the first channel formation region with the first gate insulating film interposed therebetween; and
        a second gate electrode formed over the second channel formation region with the first gate insulating film interposed therebetween,
    wherein the driving circuit comprises:
        a second semiconductor island including at least a third channel formation region; and a third gate electrode formed over the third channel formation region with a second gate insulating film interposed therebetween, wherein the capacitor electrode is formed over the capacitor forming region of the first semiconductor island with the first gate insulating film interposed therebetween, wherein the interlayer insulating film covers the first, second and third gate electrodes and said first and second semiconductor islands, wherein the pixel electrode is formed over the interlayer insulating film and electrically connected to an impurity region of the first semiconductor island, wherein each of the first, second and third gate electrodes and said capacitor electrode has tapered edges with a taper angle in a range of 3° to 60°, wherein the first channel formation region, the second channel formation region, the lightly doped regions, the impurity region, at least a part of the first gate insulating film, the first gate electrode and the second gate electrode constitute at least a part of a pixel TFT, and wherein the second semiconductor island, the third gate electrode and at least a part of the second gate insulating film constitute at least a part of a thin film transistor in the driving circuit.

11. The electronic equipment according to claim 10, wherein each of said pixel TFT and thin film transistor in the driving circuit is an N-channel thin film transistor.

12. The electronic equipment according to claim 10, wherein each of said first, second and third gate electrodes comprises a metal selected from the group consisting of chromium, tantalum, titanium, tungsten, and molybdenum.

13. The electronic equipment according to claim 10, wherein said pixel electrode comprises zinc oxide.

14. The electronic equipment according to claim 10, wherein said taper angle is in a range of 5° to 45°.

15. The electronic equipment according to claim 10, wherein said taper angle is in a range of 7° to 20°.

16. The electronic equipment according to claim 10, wherein said electronic equipment includes one of a video camera, a digital camera, a projector, a head mount display, a navigation system for a vehicle, a personal computer, and a portable information terminal.

17. The electronic equipment according to claim 10, wherein the first gate insulating film and the second gate insulating film are a same insulating film.

18. An electronic equipment having a display device comprising:
a substrate;
a pixel TFT only in a pixel portion which can display a picture over the substrate; and
a driving circuit over the substrate,
wherein the driving circuit is located outside the pixel portion,
wherein the pixel TFT comprises:
a first semiconductor island including at least a first channel formation region, a second channel formation region, lightly doped regions and source and drain regions;
a first gate insulating film formed over the first semiconductor island;
a first gate electrode formed over the first channel formation region with the first gate insulating film interposed therebetween; and
a second gate electrode formed over the second channel formation region with the first gate insulating film interposed therebetween, wherein the driving circuit comprises a thin film transistor, said thin film transistor comprising:
a second semiconductor island including at least a third channel formation region;
a second gate insulating film formed over the second semiconductor island; and
a third gate electrode formed over the third channel formation region with the second gate insulating film interposed therebetween,
wherein the interlayer insulating film covers the first, second and third gate electrodes and said first and second semiconductor islands;
wherein the pixel electrode is formed over the interlayer insulating film and electrically connected to one of the source and drain regions of the first semiconductor island,
wherein each of the first, second and third gate electrodes includes a lower conductive layer and an upper conductive layer formed on the lower conductive layer, and
wherein said lower conductive layer extends beyond side edges of the upper conductive layer and extending portions of the lower conductive layer are tapered with a taper angle of 3° to 60°.

19. The electronic equipment according to claim 18, wherein each of said pixel TFT and thin film transistor in the driving circuit is an N-channel thin film transistor.

20. The electronic equipment according to claim 18, wherein said lower conductive layer comprises a metal selected from the group consisting of chromium, tantalum, titanium, tungsten, and molybdenum.

21. The electronic equipment according to claim 18, wherein said upper conductive layer comprises a metal selected from the group consisting of aluminum, tantalum, titanium, tungsten and molybdenum.

22. The electronic equipment according to claim 18, wherein said pixel electrode comprises zinc oxide.

23. The electronic equipment according to claim 18, wherein said taper angle is in a range of 5° to 45°.

24. The electronic equipment according to claim 18, wherein said taper angle is in a range of 7° to 20°.

25. The electronic equipment according to claim 18, wherein said electronic equipment includes one of a video camera, a digital camera, a projector, a head mount display, a navigation system for a vehicle, a personal computer, and a portable information terminal.

26. An electronic equipment according to claim 18, wherein each of said lightly doped regions is partly overlapped by the extending portion of the lower conductive layer of the first or second gate electrode and extends beyond a side edge of the lower conductive layer of the first or second gate electrode.

27. The electronic equipment according to claim 18, wherein the first gate insulating film and the second gate insulating film are a same insulating film.

28. An electronic equipment having a display device comprising:
a substrate;
a pixel portion only in a region which can display a picture over the substrate;
a driving circuit over the substrate;
a capacitor electrode;
an interlayer insulating film; and
a pixel electrode,
wherein the driving circuit is located outside the pixel portion,
wherein the pixel portion comprises:

a first semiconductor island including at least a first channel formation region, a second channel formation region, lightly doped regions, and a capacitor forming region;

a first gate insulating film formed over the first semiconductor island;

a first gate electrode formed over the first channel formation region with the first gate insulating film interposed therebetween; and a second gate electrode formed over the second channel formation region with the first gate insulating film interposed therebetween, wherein the driving circuit comprises:

a second semiconductor island including at least a third channel formation region; and a third gate electrode formed over the third channel formation region with a second gate insulating film interposed therebetween, wherein the capacitor electrode is formed over the capacitor forming region of the first semiconductor island with the first gate insulating film interposed therebetween, wherein the interlayer insulating film covers the first, second and third gate electrodes and said first and second semiconductor islands;

wherein the pixel electrode is formed over the interlayer insulating film and electrically connected to an impurity region of the first semiconductor island, wherein each of the first, second and third gate electrodes includes a lower conductive layer and an upper conductive layer formed on the lower conductive layer, wherein said lower conductive layer extends beyond side edges of the upper conductive layer and extending portions of the lower conductive layer are tapered with a taper angle of 3° to 60°, wherein the first channel formation region, the second channel formation region, the lightly doped regions, the impurity region, at least a part of the first gate insulating film, the first gate electrode and the second gate electrode constitute at least a part of a pixel TFT, and wherein the second semiconductor island, the third gate electrode and at least a part of the second gate insulating film constitute at least a part of a thin film transistor in the driving circuit.

29. The electronic equipment according to claim 28, wherein said lower conductive layer comprises a metal selected from the group consisting of chromium, tantalum, titanium, tungsten, and molybdenum.

30. The electronic equipment according to claim 28, wherein said upper conductive layer comprises a metal selected from the group consisting of aluminum, tantalum, titanium, tungsten and molybdenum.

31. The electronic equipment according to claim 28, wherein said pixel electrode comprises zinc oxide.

32. The electronic equipment according to claim 28, wherein said taper angle is in a range of 5° to 45°.

33. The electronic equipment according to claim 28, wherein said taper angle is in a range of 7° to 20°.

34. The electronic equipment according to claim 28, wherein said electronic equipment includes one of a video camera, a digital camera, a projector, a head mount display, a navigation system for a vehicle, a personal computer, and a portable information terminal.

35. The electronic equipment according to claim 28, wherein each of said pixel TFT and thin film transistor in the driving circuit is an N-channel thin film transistor.

36. The electronic equipment according to claim 28, wherein the first gate insulating film and the second gate insulating film are a same insulating film.

* * * * *